United States Patent
Yonekura et al.

(10) Patent No.: US 8,455,348 B2
(45) Date of Patent: Jun. 4, 2013

(54) MANUFACTURING METHOD OF SEMICONDUCTOR DEVICE

(75) Inventors: Kazumasa Yonekura, Kanagawa (JP); Kazuo Tomita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 253 days.

(21) Appl. No.: 13/074,899

(22) Filed: Mar. 29, 2011

(65) Prior Publication Data

US 2011/0237070 A1    Sep. 29, 2011

(30) Foreign Application Priority Data

Mar. 29, 2010    (JP) .................... 2010-075428

(51) Int. Cl.
*H01L 21/00*    (2006.01)
(52) U.S. Cl.
USPC ................ 438/626; 438/627; 438/638
(58) Field of Classification Search
USPC .............. 438/637–640, 653, 624, 626, 627
See application file for complete search history.

(56) References Cited

U.S. PATENT DOCUMENTS

| | | |
|---|---|---|
| 2006/0019485 A1 | 1/2006 | Komai et al. |
| 2007/0287298 A1 | 12/2007 | Ishibashi et al. |
| 2008/0318412 A1 | 12/2008 | Iba |
| 2011/0266679 A1 * | 11/2011 | Hotta et al. .......... 257/758 |

FOREIGN PATENT DOCUMENTS

| | | |
|---|---|---|
| JP | 2005-038967 | 2/2005 |
| JP | 2006-032864 | 2/2006 |
| JP | 2007-335450 | 12/2007 |
| JP | 2008-218959 | 9/2008 |
| JP | 2009-004408 | 1/2009 |

* cited by examiner

*Primary Examiner* — Richard Booth
(74) *Attorney, Agent, or Firm* — McDermott Will & Emery LLP

(57) ABSTRACT

A manufacturing method of a semiconductor device is provided which can precisely control the depth of a wiring trench pattern, and which can suppress the damage on the wiring trench pattern. A second low dielectric constant film, a third low dielectric constant film, and a film for serving as a mask layer are laminated over a diffusion preventing film in that order. The film for serving as the mask layer is etched, and a wiring trench pattern is formed which has its bottom made of a surface of the third low dielectric constant film, so that a mask layer is formed. A first resist mask is removed by asking. A wiring trench is formed using the wiring trench pattern of the mask layer such that a bottom of the trench is comprised of the second low dielectric constant film. A layer from a top surface of the copper metal to the third low dielectric constant film is removed by a CMP method. Each low dielectric constant film has a dielectric constant lower than that of FSG, and the second low dielectric constant film has the dielectric constant lower than that of the third low dielectric constant film.

18 Claims, 40 Drawing Sheets

MANUFACTURING METHOD OF SEMICONDUCTOR DEVICE

CROSS-REFERENCE TO RELATED APPLICATIONS

The disclosure of Japanese Patent Application No. 2010-75428 filed on Mar. 29, 2010 including the specification, drawings and abstract is incorporated herein by reference in its entirety.

BACKGROUND OF THE INVENTION

The present invention relates to manufacturing methods of semiconductor devices, and more particularly, to a manufacturing method of a semiconductor device with a multi-layered wiring structure.

Semiconductor devices have been increasingly microfabricated. For example, wirings of the semiconductor device have been downsized to the minimum width of about 100 nm or less. In multi-layered wiring technology, the influences on the device characteristics due to RC (resistance-capacitance) delay have been a more serious problem. A Cu (copper)/low dielectric constant film (Low-k film) wiring technology has been developed as measures against the RC delay. Low-k materials with a value of k of not less than 2.5 nor more than 3.1, such as SiOCH (carbon-doped SiO2), have been put into practical use. The Low-k materials are required to have a lower dielectric constant for the next generation, and the next generation. For this reason, porous Low-k materials or the like having holes in a low dielectric constant film are developed.

Such Low-k materials, however, have low resistance to process using chemicals or plasma, for example, etching or ashing. When the Low-k material is subjected to etching or ashing, the Low-k material tends to become deteriorated. That is, the Low-k material possibly has its dielectric constant increased, or possibly degrades the film.

The Low-k film has the low resistance to the process using the chemicals or plasma, which makes it difficult to control a pattern of the wiring formed by etching the Low-k film. For example, in order to control the depth (thickness) of the wiring, it is difficult to etch the Low-k film only in a desired depth with high accuracy. As a result, variations in thickness of the formed wiring disadvantageously tend to occur, which leads to variations in electrical resistance of the wiring, and thus in amount of current flowing through the wiring. Such a phenomenon reduces the reliability of the semiconductor device.

Further, when performing the process (asking) for removing a resist used for forming the wiring trench pattern, the inside of the wiring trench pattern may be damaged to increase the RC delay of the wiring together with an increase in dielectric constant, and to degrade a withstand voltage between the wirings due to occurrence of leak current. Thus, the reliability of the semiconductor device is possibly degraded.

The following manufacturing methods are conventionally disclosed as technique for forming a multi-layered wiring using the above low dielectric constant film.

For example, Japanese Unexamined Patent Publication No. 2009-4408 (Patent Document 1) discloses a method for forming both a wiring trench pattern in a low dielectric constant film, and a via pattern (via hole pattern) for electrically coupling the trench pattern to a wiring as a lower layer. When forming the wiring trench pattern by etching after previously forming the via hole pattern, a film generated by the etching and a damaged layer which are formed over an inner wall of the pattern are removed by plasma using a predetermined gas. In this way, the reliability of the wiring formed in the pattern is improved.

For example, Japanese Unexamined Patent Publication No. 2007-335450 (Patent Document 2) discloses a method for forming a dual damascene structure using a multi-layered resist. Japanese Unexamined Patent Publication No. 2006-32864 (Patent Document 3) discloses a method for forming a dual damascene structure using a multi-layered mask. Japanese Unexamined Patent Publication No. 2008-218959 (Patent Document 4) discloses an etching method which can perform etching into a good shape of process without damaging a carbon film with fluorine added thereto as an interlayer insulating film having a low dielectric constant. Japanese Unexamined Patent Publication No. 2005-38967 (Patent Document 5) discloses a method for forming a contact layer using a SiC film or a $SiO_2$ cap film.

RELATED ART DOCUMENTS

Patent Documents

[Patent Document 1]
  Japanese Unexamined Patent Publication No. 2009-4408
[Patent Document 2]
  Japanese Unexamined Patent Publication No. 2007-335450
[Patent Document 3]
  Japanese Unexamined Patent Publication No. 2006-32864
[Patent Document 4]
  Japanese Unexamined Patent Publication No. 2008-218959
[Patent Document 5]
  Japanese Unexamined Patent Publication No. 2005-38967

SUMMARY OF THE INVENTION

As mentioned above, a manufacturing method of a multi-layered wiring structure disclosed in, for example, Japanese Unexamined Patent Publication No. 2009-4408, employs a plasma process with an appropriate gas to remove a thin film that may reduce the reliability of wiring, for example, an etching formed film or damaged layer formed over the inner wall of the wiring or pattern for a via.

In the technique disclosed in Japanese Unexamined Patent Publication No. 2009-4408, two-stepped processes are performed which involves first forming a $SiO_2$ film as a hard mask (mask layer) for forming the wiring trench pattern, and then dry-etching a NCS film using the hard mask. When forming the hard mask of the $SiO_2$ film, however, a part of a SiCOH film directly under the $SiO_2$ film is etched, which possibly degrades the accuracy of shape or thickness in the depth direction of the wiring trench pattern finally formed.

Variations in shape or thickness in the depth direction of the formed wiring trench pattern possibly degrade the electrical characteristics of the wiring formed of the wiring trench pattern as mentioned above. Thus, it is preferable to enhance the accuracy of shape or thickness in the depth direction of the wiring trench pattern. Japanese Unexamined Patent Publication No. 2009-4408, however, does not disclose any process from this viewpoint.

The formation method of a wiring trench pattern as disclosed in Japanese Unexamined Patent Publication No. 2007-335450 includes the step of removing a resist (asking) after forming a wiring trench. Thus, a damage layer can be formed over the inner wall of the wiring trench at the time of removing the resist. Further, it is difficult to precisely control the thickness of the wiring trench in the depth direction.

A manufacturing method of a multi-layered wiring structure as disclosed in Japanese Unexamined Patent Publication No. 2006-32864 includes the step of forming a protective film over an inner surface of a wiring trench so as to suppress the change in lateral width of a wiring trench pattern in cleaning of the wiring trench pattern formed. Since the protective film has a high dielectric constant, the formed multi-layered wiring structure can have a high effective dielectric constant.

An etching method disclosed in Japanese Unexamined Patent Publication No. 2008-218959, like the technique disclosed in, for example, Japanese Unexamined Patent Publication No. 2009-4408, is adapted to suppress the damage on a wiring trench pattern by the two-stepped process. The two-stepped process involves ashing a resist used for forming the wiring trench pattern after forming the wiring trench pattern in a midstream depth, and then forming the wiring trench pattern again in a desired depth. This document, however, fails to disclose any means for applying the above method to a method for forming a pattern including both the wiring trench pattern and the via hole pattern.

A manufacturing method of a metal wiring as disclosed in Japanese Unexamined Patent Publication No. 2005-38967 (Patent Document No. 5) includes the steps of forming a hard mask, removing the mask by ashing, and forming a wiring trench pattern using the hard mask. Thus, in the above steps, the inner wall of the wiring trench pattern can be hardly damaged. This document, however, does not disclose any means for avoiding damage due to ashing in a post-process for forming a wiring (contact layer) to be formed later. Thus, in the post-process, the wiring trench is possibly damaged, which leads to degradation of accuracy of shape of the wiring trench.

Therefore, the present invention has been made in view of the foregoing problems. It is an object of the present invention to provide a manufacturing method of a semiconductor device which can precisely control the depth of a wiring trench pattern for forming a wiring in a multi-layered wiring structure, and which can suppress the damage on the wiring trench pattern.

A manufacturing method of a semiconductor device according to one embodiment of the invention includes the following steps. A diffusion preventing film is formed over a semiconductor substrate so as to cover a first low dielectric constant film with a copper wiring formed therein. A second low dielectric constant film, a third low dielectric constant film, and a film for serving as a mask layer is laminated over the diffusion preventing film in that order. The film for serving as the mask layer is etched using a first resist mask formed over the film for serving as the mask layer so as to expose the third low dielectric constant film. A wiring trench pattern whose bottom is comprised of a surface of the third low dielectric constant film is formed in the film for serving as the mask layer to thereby form the mask layer. The first resist mask is removed by ashing. A wiring trench is formed in the second low dielectric constant film and the third low dielectric constant film using the wiring trench pattern of the mask layer such that a bottom of the wiring trench pattern of the mask layer is comprised of the second low dielectric constant film. A copper metal is charged into the wiring trench and a via hole formed to expose a part of the copper wiring in a position where the copper metal is superimposed over the wiring trench as viewed in a planar manner. At least a layer from a top surface of the copper metal to the third low dielectric constant film is removed by a CMP method. Each of the first, second, and third low dielectric constant films is an insulating film having a dielectric constant lower than that of a FSG. The second low dielectric constant film is a film having the dielectric constant lower than that of the third low dielectric constant.

A manufacturing method of a semiconductor device according to another embodiment of the invention includes the following steps. A diffusion preventing film is formed over a semiconductor substrate so as to cover a first low dielectric constant film with a copper wiring formed therein. A second low dielectric constant film, a third low dielectric constant film, and a film for serving as a mask layer are laminated over the diffusion preventing film in that order. The film for serving as the mask layer is etched using a first resist mask formed over the film for serving as the mask layer so as to expose the third low dielectric constant film. Then, a wiring trench pattern whose bottom is comprised of a surface of the third low dielectric constant film is formed in the film for serving as the mask layer to thereby form the mask layer. The first resist mask is removed by asking. A wiring trench is formed in the second low dielectric constant film and the third low dielectric constant film using the wiring trench pattern of the mask layer such that a bottom of the trench is comprised of the second low dielectric constant film. A copper metal is charged into a wiring trench and a via hole formed to expose a part of the copper wiring in a position where the copper metal is superimposed over the wiring trench as viewed in a planar manner.

The first resist mask is a multi-layered resist including a lower layer resist, an intermediate layer resist, and an upper layer resist which are laminated in that order. The step of forming the mask layer includes the following steps. The multi-layered resist is formed which includes the lower layer resist, the intermediate layer resist, and the upper layer resist laminated in that order over a film for serving as a mask layer. The upper layer resist is patterned in the shape of the wiring trench pattern as viewed in a planar manner. The intermediate layer resist is patterned using the upper layer resist patterned in the shape of the wiring trench pattern as a mask. The lower layer resist is patterned using the intermediate layer resist patterned in the shape of the wiring trench pattern as a mask, while the upper layer resist is removed to expose the intermediate layer resist at an uppermost surface. The film for serving as the mask layer is patterned using the lower layer resist patterned in the shape of the wiring trench pattern as a mask, while the intermediate layer resist is removed to expose the third low dielectric constant film.

The step of exposing the third low dielectric constant film includes a first step of removing the intermediate layer resist using a first gas to expose the lower layer resist at an uppermost surface, and a second step of removing a part of the film for serving as the mask layer using a second gas different from the first gas to expose the third low dielectric constant film. Each of the first, second, and third low dielectric constant films is an insulating film having a dielectric constant lower than that of a FSG. The second low dielectric constant film is a film having the dielectric constant lower than that of the third low dielectric constant.

A manufacturing method of a semiconductor device according to a further embodiment of the invention includes the following steps. A diffusion preventing film is formed over a semiconductor substrate so as to cover a first low dielectric constant film with a copper wiring formed therein. A second low dielectric constant film, a third low dielectric constant film, and a metal film for serving as a mask layer are laminated over the diffusion preventing film in that order. The metal film for serving as a mask layer is etched using a first resist mask formed over the metal film for serving as a mask layer so as to expose the third low dielectric constant film. A wiring trench pattern whose bottom is comprised of the surface of the third low dielectric constant film is formed in the metal film for serving as the mask layer to thereby form the mask layer. The first resist mask is removed by the asking. A wiring trench is formed in the second low dielectric constant film and the third low dielectric constant film using the wiring trench pattern of the mask layer such that a bottom of the trench is comprised of the second low dielectric constant film. A copper metal is charged into the wiring trench and a via hole formed to expose a part of the copper wiring in a position where the copper metal is superimposed over the wiring trench as viewed in a planar manner. The first resist mask includes a resist layer comprised of resist material which exhibits photosensitivity by being subjected to exposure and development processes. Each of the first, second, and third low dielectric constant films is an insulating film having a dielectric constant lower than that of a FSG, and the second low dielectric constant film is a film having the dielectric constant lower than that of the third low dielectric constant.

A manufacturing method of a semiconductor device according to a still further embodiment of the invention includes the following steps. A diffusion preventing film is formed over a semiconductor substrate so as to cover a first low dielectric constant film with a copper wiring formed therein. A second low dielectric constant film, a third low dielectric constant film, and a metal film for serving as a mask layer are laminated over the diffusion preventing film in that order. The metal film for serving as a mask layer is etched using a first resist mask formed over the metal film for serving as a mask layer. A wiring trench pattern whose bottom is comprised of the surface of the third low dielectric constant film is formed in the metal film for serving as the mask layer to thereby form the mask layer. A wiring trench is formed in the second low dielectric constant film and the third low dielectric constant film using the wiring trench pattern of the mask layer such that a bottom of the trench is comprised of the second low dielectric constant film. A copper metal is charged into the wiring trench and a via hole formed to expose a part of the copper wiring in a position where the copper metal is superimposed over the wiring trench as viewed in a planar manner. The first resist mask includes a resist layer comprised of resist material which exhibits photosensitivity by being subjected to exposure and development processes. The manufacturing method further includes the step of forming a via hole pattern in a position where the via hole pattern is superimposed over the copper wiring as viewed in a planar manner.

The second resist mask used in the step of forming the via hole pattern is a multi-layered resist including a lower layer resist, an intermediate layer resist, and an upper layer resist which are laminated in that order. The process of forming the via hole pattern includes the following steps. The multi-layer resist is formed which includes the lower layer resist, the intermediate layer resist, and the upper layer resist laminated over the metal film for serving as the mask layer in that order. The upper layer resist is patterned in the shape of via hole as viewed in a planar manner. The intermediate layer resist is patterned using the upper layer resist patterned in the shape of the via hole as a mask. The lower layer resist is patterned using as a mask, the intermediate layer resist patterned in the shape of the via hole, and the upper layer resist is removed to expose the intermediate layer resist at the uppermost surface. The via hole pattern through the second and third low dielectric constant film is formed using the lower layer resist patterned in the shape of the via hole as a mask so as to reach the diffusion preventing film. Each of the first, second, and third low dielectric constant films is an insulating film having a dielectric constant lower than that of a FSG. The second low dielectric constant film is a film having the dielectric constant lower than that of the third low dielectric constant film.

In the manufacturing method of a multi-layered wiring according to the invention, after forming the mask layer for forming the wiring trench pattern, in forming the wiring trench, the resist mask used for forming the mask layer is removed, and then the wiring trench pattern is etched into the wiring trench in the desired depth. When forming the wiring trench pattern, etching is stopped at the low dielectric constant film under the mask layer. Thus, the depth of the formed wiring trench can be precisely controlled, which can suppress variations in depth of the wiring trench.

DETAILED DESCRIPTION OF THE PREFERRED EMBODIMENTS

Preferred embodiments of the invention will be described below with reference to the accompanying drawings.

(First Embodiment)

First, a multi-layered wiring structure of a semiconductor device formed in the present invention will be described below.

Figure 1:
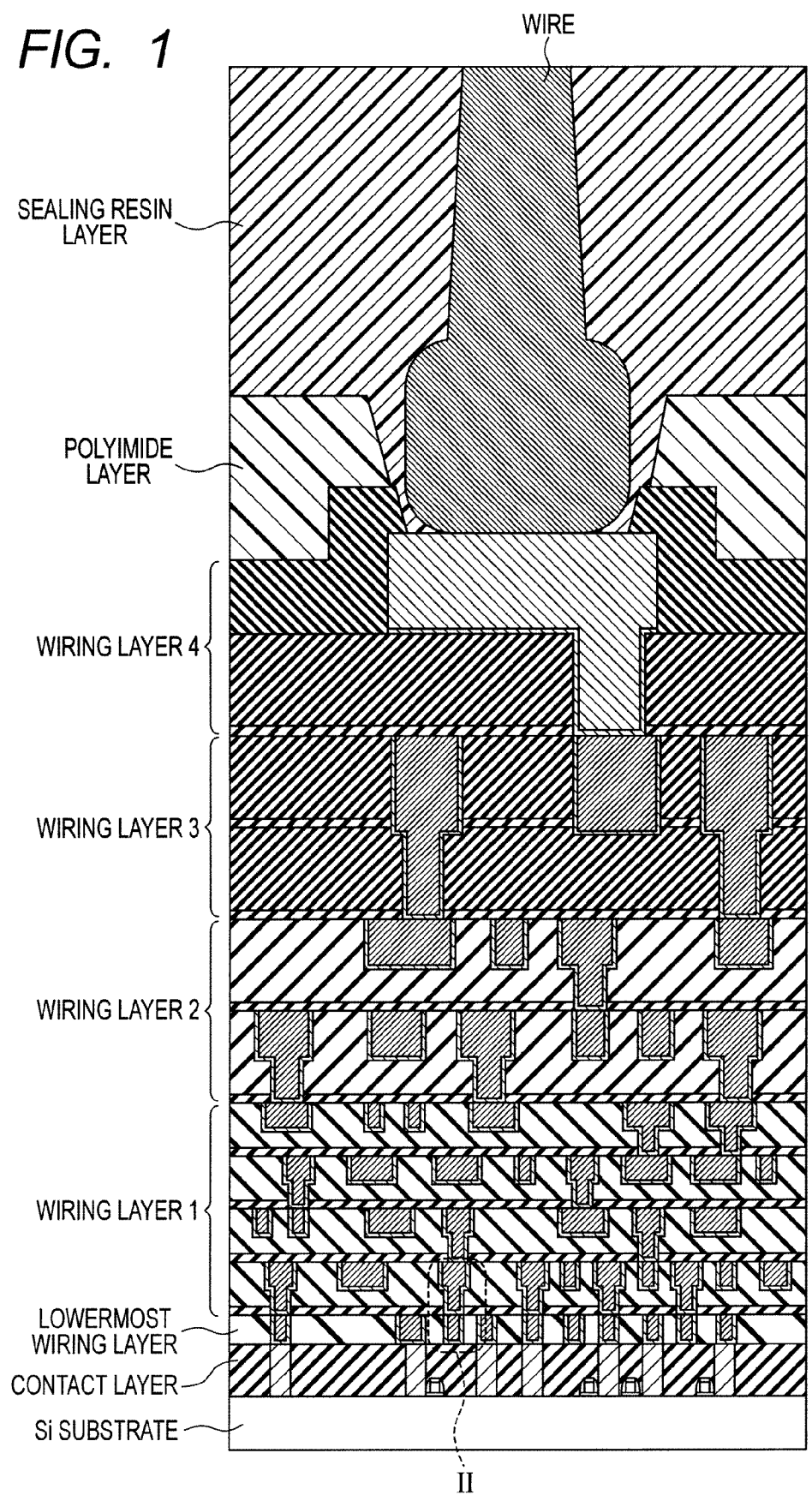
FIG. 1 is a schematic cross-sectional view of a multi-layered wiring structure of a semiconductor device according to the present invention.

Referring to the cross-sectional view of FIG. 1, a multi-layered wiring structure of the invention includes a contact layer, a lowermost wiring layer, a wiring layer 1, a wiring layer 2, a wiring layer 3, a wiring layer 4, a polyimide layer, and a sealing resin layer which are laminated in that order over a Si substrate with a transistor formed therein.

The contact layer has an insulating film with a high Young's modulus. The lowermost wiring layer has an insulating film with an intermediate Young's modulus lower than that of the contact layer. The wiring layer 1 has an insulating film with a low Young's modulus lower than that of the lowermost wiring layer. The wiring layer 2 has an insulating film with an intermediate Young's modulus. The wiring layer 3 has an insulating film with a high Young's modulus. The wiring layer 4 has an insulating film with a high Young's modulus, and further includes an Al pad.

The minimum pitch between the wirings at the lowermost wiring layer is small as compared to that of each of other wiring layers 1 to 4. The thickness of the wiring of the lowermost wiring layer is thin as compared to that of each of the wiring layers 1 to 4. The minimum pitch between the wirings at the wiring layer 2 is slightly larger than that at the lowermost wiring layer, but smaller than that at the wiring layer 3. The thickness of the wiring of the wiring layer 2 is slightly larger than that of the lowermost wiring layer, and thinner than that of the wiring layer 3. The minimum pitch between the wirings at the wiring layer 3 is slightly larger than that at the wiring layer 2, but smaller than that at the wiring layer 4. The thickness of the wiring of the wiring layer 3 is slightly thicker than that of the wiring layer 2, and thinner than that of the wiring of the wiring layer 4. These lowermost wiring layer and wiring layers 1 to 4 include an insulating film, a wiring trench formed in the insulating film, a barrier layer formed at the sides and bottom of the wiring trench, a copper wiring formed over the barrier layer and comprised of copper metal filling the wiring trench, and a diffusion preventing film formed over the upper surface of the copper wiring and the upper surface of the insulating film for preventing diffusion of copper metal. The wiring layers 1 to 4 include vias for coupling the copper wirings of the upper and lower layers.

As shown in FIG. 1, each wiring layer is comprised of a single layer or a plurality of layers. The respective wiring layers are electrically coupled together by a wiring made of metal, for example, copper.

Figure 2:
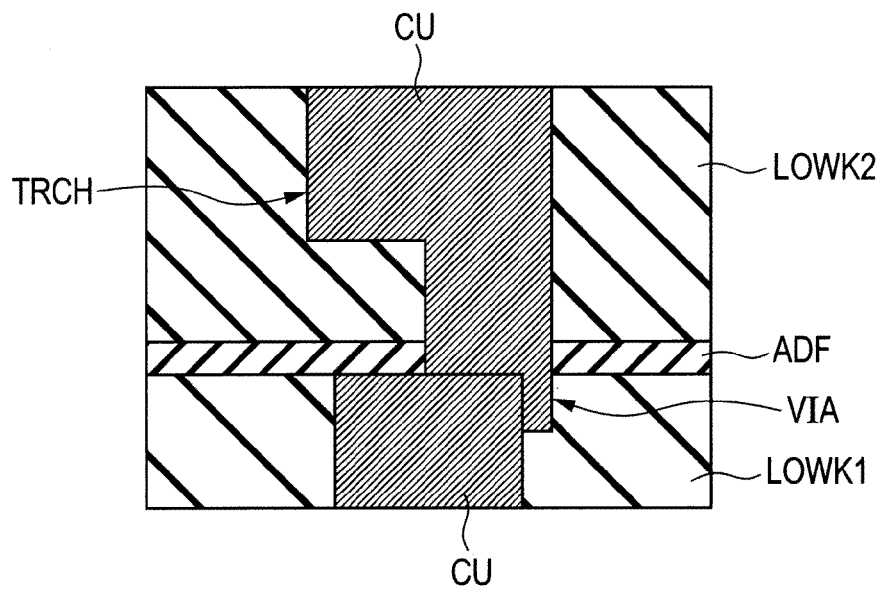
FIG. 2 is a schematic enlarged view of an area enclosed by a circle indicated by a dotted line "II" of FIG. 1.

FIG. 2 is a cross-sectional view showing the form of an area enclosed by a circle indicated by a dotted line of FIG. 1. In this case, the lowermost wiring layer shown in FIG. 1 corresponds to a first low dielectric constant film LOWK1 shown in FIG. 2. A lowermost wiring layer (located most close to the Si substrate) among the wiring layer 1 shown in FIG. 1 corresponds to a second low dielectric constant film LOWK2 shown in FIG. 2. A diffusion preventing film ADFa is sandwiched between the first low dielectric constant film LOWK1 and the second low dielectric constant film LOWK2.

A copper wiring CU (inside a wiring trench TRCH) of the second low dielectric constant film LOWK2 has a part in a region extending to reach another copper wiring CU of the first low dielectric constant film LOWK1. Both copper wirings CUs are formed to be electrically coupled to each other. A region of the copper wiring for coupling both copper wirings CUs is hereinafter referred to as a "via wiring" (note that a trench for forming the via wiring is hereinafter referred to as a "via hole VIA").

Unlike FIG. 1, FIG. 2 illustrates the via hole VIA in a position on the right side with respect to the copper wiring for simple description of the following manufacturing step. Even when a via hole VIA is formed in the center of the copper wiring CU in the same manner as FIG. 1, FIG. 2 will be equivalent to FIG. 1.

FIG. 2 shows a region where two-layered insulating films for forming the wiring layer 1 shown in FIG. 1 are laminated. In this case, the first low dielectric constant film LOWK1 and the second low dielectric constant film LOWK2 are formed of the same material.

The following will describe a manufacturing method of the region shown in FIG. 2 among the above multi-layered wiring structure shown in FIG. 1 according to this embodiment.

Figure 3:
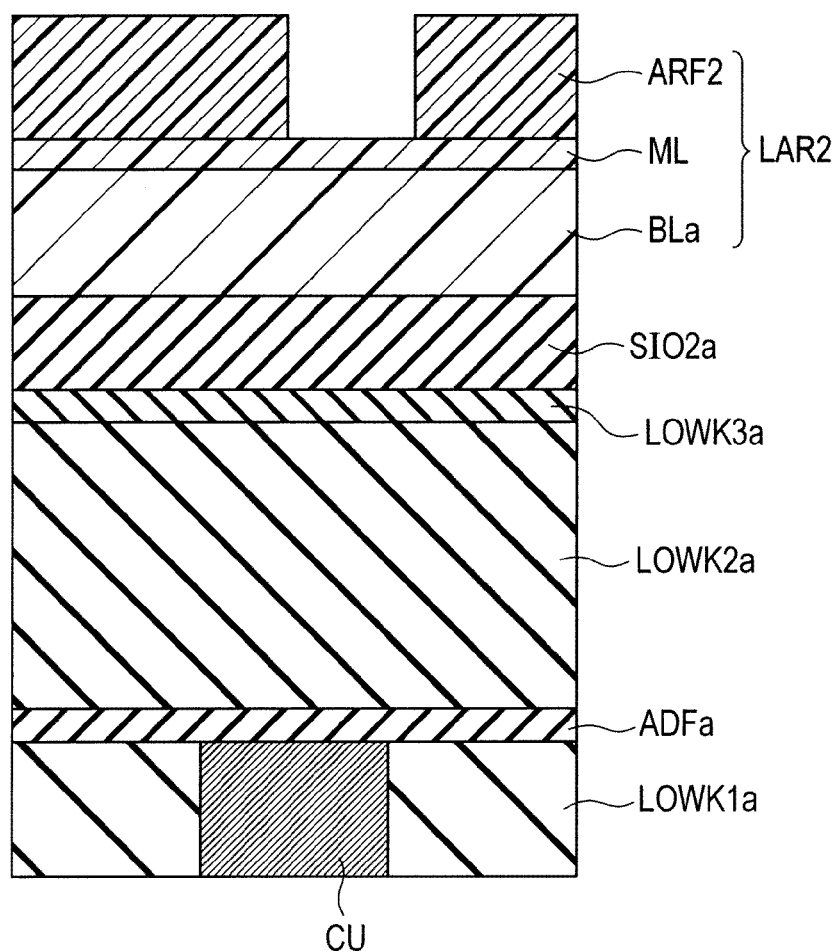
FIG. 3 is a schematic cross-sectional view showing a first step in a manufacturing method of the multi-layered wiring structure in the first embodiment of the invention.

Referring to FIG. 3, a first low dielectric constant film LOWK1a is formed, and a copper wiring CU is formed in a region of a part of the film LOWK1a. The first low dielectric constant film LOWK1a corresponds to a lowermost wiring layer formed over the semiconductor substrate (Si substrate) shown in FIG. 1, for example.

Then, a diffusion preventing film ADFa is formed to cover the first low dielectric constant film LOWK1. The diffusion preventing film ADFa is a thin film for preventing diffusion of copper material of the copper wiring CU inside the first low dielectric constant film LOW1a. The diffusion preventing film ADFa preferably contains at least one kind of element selected from the group consisting of SiN, SiCN, SiC, and SiCO.

Then, a second low dielectric constant film LOWK2a, a third low dielectric constant film LOWK3a, and a mask film SIO2a for serving as a mask layer are laminated over the diffusion prevention layer ADFa in that order.

The first low dielectric constant film LOWK1a, the second low dielectric constant film LOWK2a, and the third low dielectric constant film LOWK3a are formed as the interlayer insulating film of the multi-layered wiring structure formed.

Each of these low dielectric constant films is preferably an insulating film having a dielectric constant lower than that of an oxide film, which is referred to as a "fluorinated silicate glass (FSG)". The first low dielectric constant film LOWK1a, the second low dielectric constant film LOWK2a, and the third low dielectric constant film. LOWK3a are preferably thin films made of, for example, SiOCH (containing porous SiOCH) as one example. Alternatively, the low dielectric constant film used may be a thin film comprised of, for example, methylsilsesquioxane (MSQ), in addition to SiOCH. Such a film or the film SIO2a for a mask may be preferably deposited, for example, by a chemical vapor deposition (CVD) method.

The second low dielectric constant film LOWK2a preferably has a dielectric constant lower than that of the third low dielectric constant film LOWK3a. Conversely, the third low dielectric constant film LOWK3a preferably has a dielectric constant higher than that of the second low dielectric constant film LOWK2a.

With this arrangement, the third low dielectric constant film LOW3a serves to prevent the damage on the second low dielectric constant film LOWK2a, which has a lower dielectric constant than that of the third dielectric constant film, in the process, such as etching or asking.

The first low dielectric constant film. LOWK1a preferably has a dielectric constant lower than that of FSG, as mentioned above, but may have any arbitrary dielectric constant regardless of whether it is large or small as compared to the dielectric constants of the second and third low dielectric constant films.

In using SiOCH for the first, second, and third low dielectric constant films, the respective dielectric constants of these films can be adjusted by changing the density and composition of the respective films.

The film SIO2a for the mask is preferably a thin film (insulating layer) comprised of, for example, $SiO_2$. The thickness of each film described above (in the vertical direction shown in FIG. 3) will be described below. The first low dielectric constant film LOWK1a preferably has a thickness of not less than 30 nm nor more than 150 nm. The diffusion preventing film ADFa preferably has a thickness of not less than 10 nm nor more than 60 nm in total as a single layer or a laminated structure. The second low dielectric constant film LOWK2a preferably has a thickness of not less than 10 nm nor more than 50 nm. The third low dielectric constant film LOWK3a preferably has a thickness of not less than 100 nm nor more than 250 nm. The film SIO2a for a mask preferably has a thickness of 41 nm nor more than 100 nm.

Then, a second resist mask is applied over the film SIO2a for the mask. When forming the multi-layered wiring structure microfabricated, especially, a multi-layered resist technique is preferably used. A fine via hole pattern is more preferably formed using a multi-layered resist that can form the finer pattern. Thus, for example, a three-layered resist is used as the second resist mask as shown in FIG. 3.

The second resist mask (three-layered resist) for forming the via hole pattern is applied so as to form a multi-layered resist LAR2 including a lower layer resist BLa, an intermediate layer resist ML, and an upper layer resist ARF2 which are laminated in that order.

The upper layer resist ARF2 is a commonly known resist which has a photosensitive property in photoengraving technology using an exposure, and which is made of organic material (first organic film) for patterning according to the shape of a mask. On the other hand, the lower layer resist BLa is preferably comprised of a second organic film having a photosensitive property lower than that of the first organic film of the upper layer resist ARF2.

Thus, the lower layer resist BLa has more functions other than the photosensitive property than those of the upper layer resist ARF2 by making the photosensitive property of the lower layer resist BLa lower than that of the upper layer resist ARF2. For example, the etching resistance of the lower layer resist BLa can be made higher than that of the upper layer resist ARF2. That is, the lower layer resist BLa is difficult to etch, and thus is prevented from being damaged by etching. By forming the lower layer resist BLa, the etching selectivity between the respective layers of the whole multi-layered resist LAR2 is enhanced. Thus, the etching resistance of the lower layer resist BLa can be made higher than that of the upper layer resist ARF2. Further, the lower layer resist BLa can be more inexpensive than the upper layer resist ARF2.

Specifically, the lower layer resist BLa is preferably formed using organic material, such as novolak resin, polyhydroxystyrene (PHS), or resin containing a naphthalene skeleton. Suitable materials for the lower layer resist BLa are not limited to such coating materials. The lower layer resist BLa may be formed using an organic film, which is formed by depositing amorphous carbon or diamond-like carbon by the CVD method.

Then, the intermediate layer resist ML is formed using, for example, a $SiO_2$-based film, unlike the organic material of the upper layer resist ARF2 or lower layer resist BLa. In order to improve matching between the layers inside the multi-layered resist LAR2, the film of the intermediate layer resist ML preferably contains more carbon and hydrogen by adjustment of the etching selectivity between the upper layer resist ARF2 and the lower layer resist BLa.

Specifically, the intermediate layer resist ML is formed using coating materials containing Si, for example, polysiloxane (including a Si—O—Si bond) containing an alkyl group or a phenyl group, or polysilazane (including a Si—NH—Si bond). Suitable materials for the intermediate layer resist ML are not limited to such coating materials. The intermediate layer resist ML may be a film formed by depositing $SiO_2$, SiO, SiN, SION, SiC, SiCN, or SiCO by the CVD method.

Figure 4:
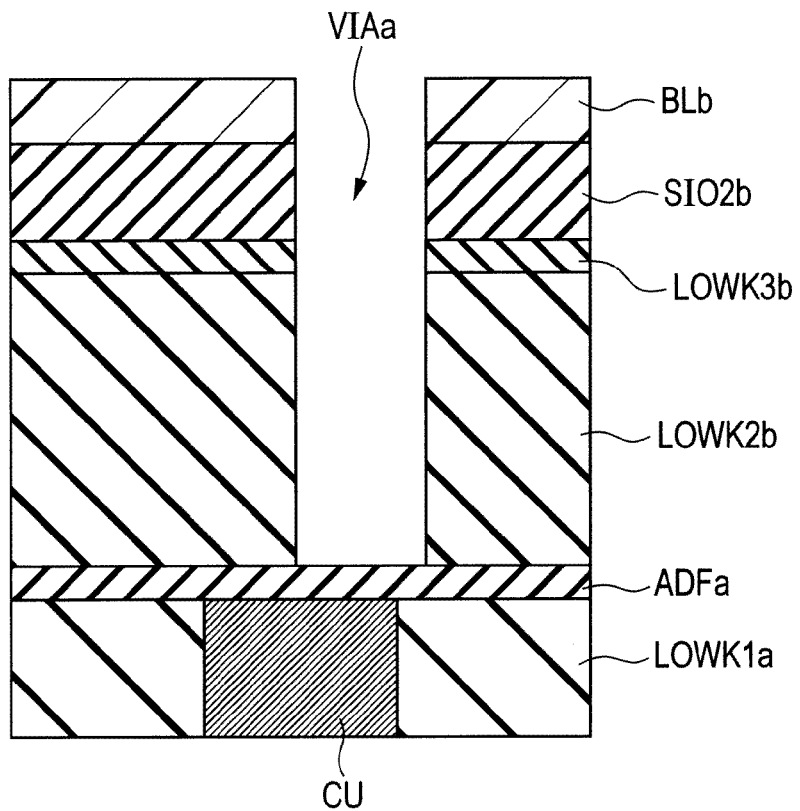
FIG. 4 is a schematic cross-sectional view showing a second step in the manufacturing method of the multi-layered wiring structure in the first embodiment.

After forming the multi-layered resist LAR2 as mentioned above, a via hole pattern which is a pattern for forming the via hole VIA shown in FIG. 2 is formed. Thus, first, as shown in FIG. 3, a part of only the upper layer resist ARF2, which is located in the same region as the via hole pattern viewed in the planar manner, is patterned by exposure and development as the photoengraving technology. Thereafter, as shown in FIG. 4, a via hole pattern VIAa is formed using the pattern formed only in the upper layer resist ARF2 as a mask as shown in FIG. 3 to extend from the multi-layered resist LAR2 and the film SIO2a for the mask in the downward direction shown to reach the diffusion preventing film ADFa.

The via hole pattern VIAa is preferably formed in a position where the pattern is superimposed on the copper wiring CU inside the first low dielectric constant film. LOWK1a as viewed in a planar manner.

Etching for forming the above via hole pattern VIAa is preferably performed using a mixed gas of, for example, $C_4F_8/N_2/Ar$ or the like.

As mentioned later in detail, the upper layer resist ARF2 and the intermediate layer resist ML of the multi-layered resist LAR2 used for formation of the via hole pattern VIAa are removed in the above etching process. The lower layer resist BLa, the film SIO2a for the mask, the third low dielectric constant film LOWK3a, and the second low dielectric constant film LOWK2a have parts thereof removed so as to form the via hole pattern VIAa, and as a result become a lower layer resist BLb, a film SIO2b for the mask, a third low dielectric constant film LOWK3b, and a second low dielectric constant film LOWK2b, respectively.

Figure 5:
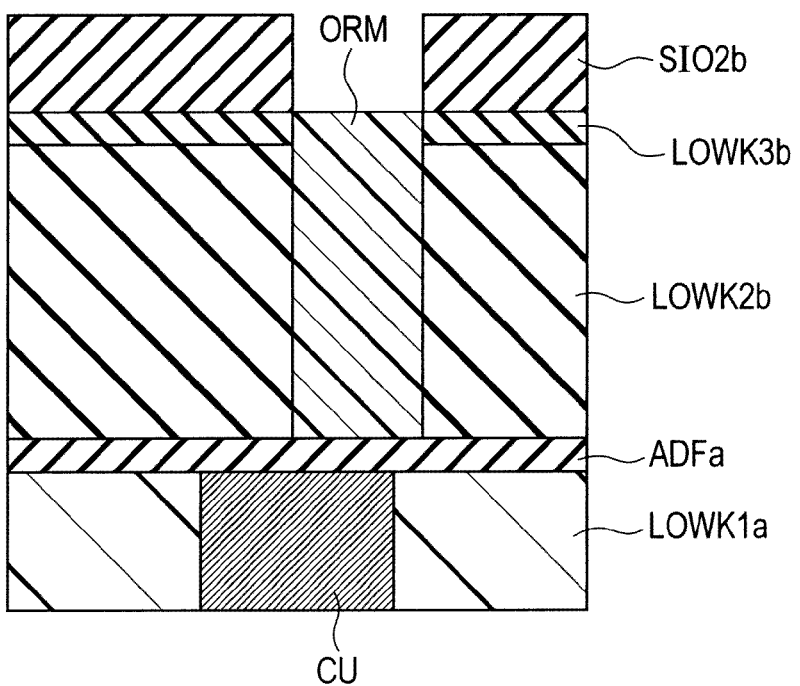
FIG. 5 is a schematic cross-sectional view showing a third step in the manufacturing method of the multi-layered wiring structure in the first embodiment.

Referring to FIG. 5, after removing the lower layer resist BLb (second resist mask) by asking, a filler material is applied over the inside of the via hole pattern VIAa. The filler material is to be charged into the via hole pattern VIAa so as to suppress the abnormal shape of the vicinity of the via hole pattern VIAa (etching residue), which is referred to as a fence. When the multi-layered resist for forming a wiring trench TRCH to be described later is patterned, the above filler material is to suppress the etching damage on the diffusion preventing film ADFa exposed in the via hole pattern VIAa.

The above filler material used is preferably an organic material. A part of the organic material formed on the surface of the film SIO2b for the mask is removed by etching back, which results in the form of an organic material ORM shown in FIG. 5.

Figure 6:
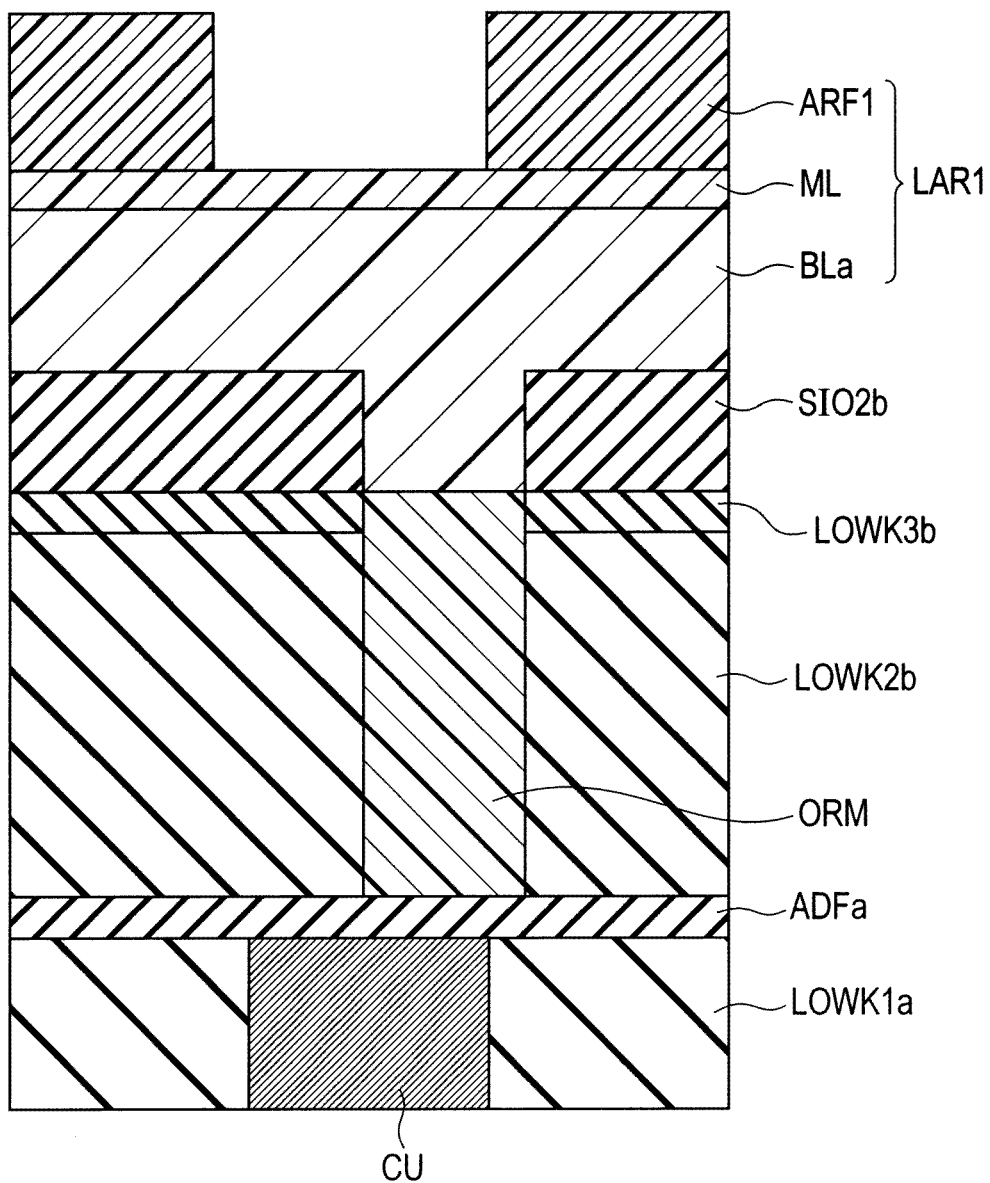
FIG. 6 is a schematic cross-sectional view showing a fourth step in the manufacturing method of the multi-layered wiring structure in the first embodiment.

Referring to FIG. 6, a multi-layered resist LAR1 is formed over the film SIO2b for the mask as a first resist mask. Like the second resist mask, the first resist mask is also formed using, for example, three-layered resist. The upper layer resist ARF1, the intermediate layer resist ML, and the lower layer resist BLa shown in FIG. 6 are the same as the upper layer resist ARF2, the intermediate layer resist ML, and the lower layer resist BLa shown in FIG. 3, respectively. That is, the multi-layered resist LAR1 shown in FIG. 6 is the same as the multi-layered resist LAR2 shown in FIG. 3.

Figure 7:
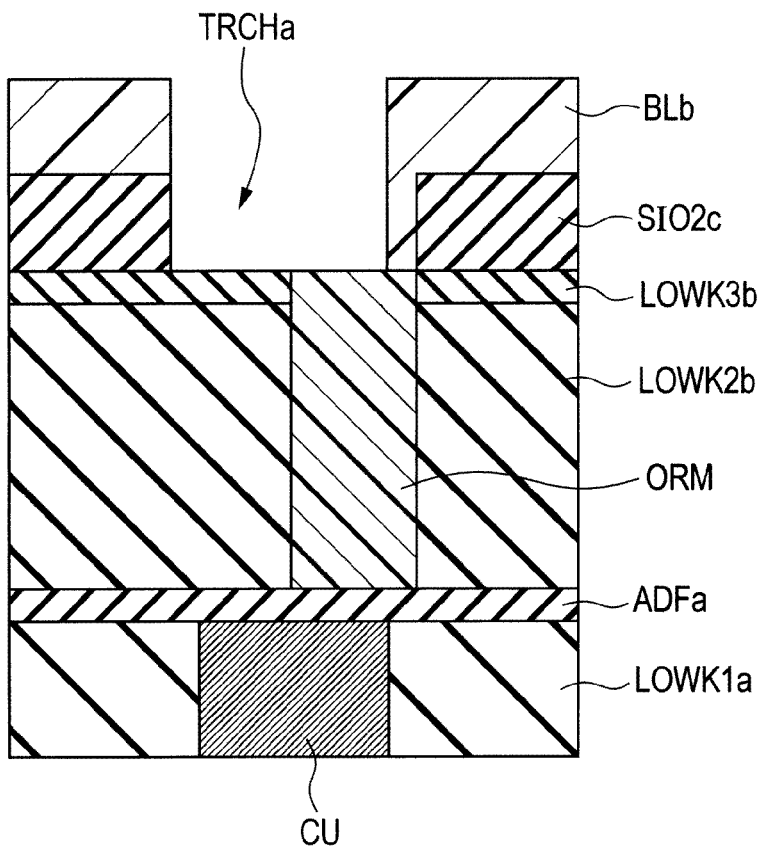
FIG. 7 is a schematic cross-sectional view showing a fifth step in the manufacturing method of the multi-layered wiring structure in the first embodiment.

After forming the multi-layered resist LAR1, the wiring trench pattern, which is a pattern for forming the wiring trench TRCH shown in FIG. 2, is formed. Thus, first, as shown in FIG. 6, a part of only the upper layer resist ARF1, which is located in the same region as the wiring trench pattern viewed in the planar manner, is patterned by exposure and development as the photoengraving technology. Thereafter, as shown in FIG. 7, the multi-layered resist LAR1 and the film SIO2b for the mask are etched using the pattern formed only in the upper layer resist ARF1 as a mask shown in FIG. 6. In this way, the wiring groove pattern TRCHa shown in FIG. 7 is formed.

That is, the first resist mask (multi-layered resist LAR1) is a resist mask for forming the wiring trench pattern TRCHa.

At this time, preferably, the multi-layered resist LAR1 is etched so as to expose the third low dielectric constant film LOWK3b, and the film SIO2b for the mask has the wiring trench pattern TRCHa whose bottom is located over the surface of the third low dielectric constant film LOWK3b.

The wiring trench pattern TRCHa is preferably formed to be superimposed on the via hole pattern VIAa and the copper wiring Cu inside the first low dielectric constant film LOWK1a, as viewed in the planar manner.

That is, when forming the wiring trench pattern TRCHa, only the multi-layered resist LAR1 and the film SIO2b for the mask are etched without etching the third low dielectric constant film LOWK3b under them. By this process, the film SIO2b for the mask becomes a film SIO2c for the mask.

Figure 8:
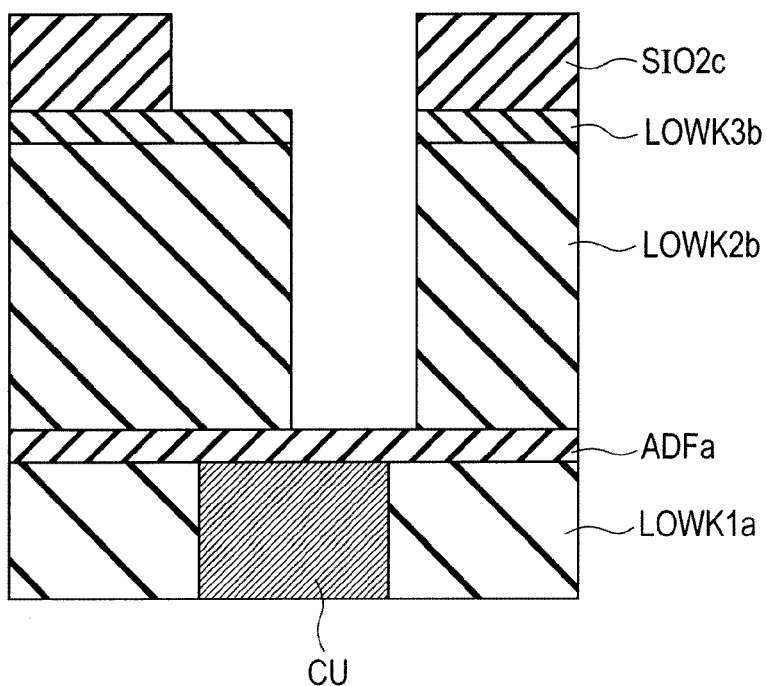
FIG. 8 is a schematic cross-sectional view showing a sixth step in the manufacturing method of the multi-layered wiring structure in the first embodiment.

Then, referring to FIG. 8, the first resist mask (lower layer resist BLb) is removed by ashing. The ashing is preferably performed using gas containing oxygen atoms, such as oxygen or carbon dioxide, or reduction gas, such as hydrogen or ammonia.

As shown in FIG. 8, the organic material ORM is also simultaneously removed in the above ashing. As mentioned later, a part of the organic material ORM is removed also in the step of forming the wiring trench pattern TRCHa shown in FIG. 7. However, a part of the organic material ORM not removed in the step of FIG. 7 is removed in the ashing. Since the lower layer resist BLb is comprised of organic material, the organic material ORM having a low etching selectivity respective to the lower layer resist BLb is simultaneously etched easily.

Figure 9:
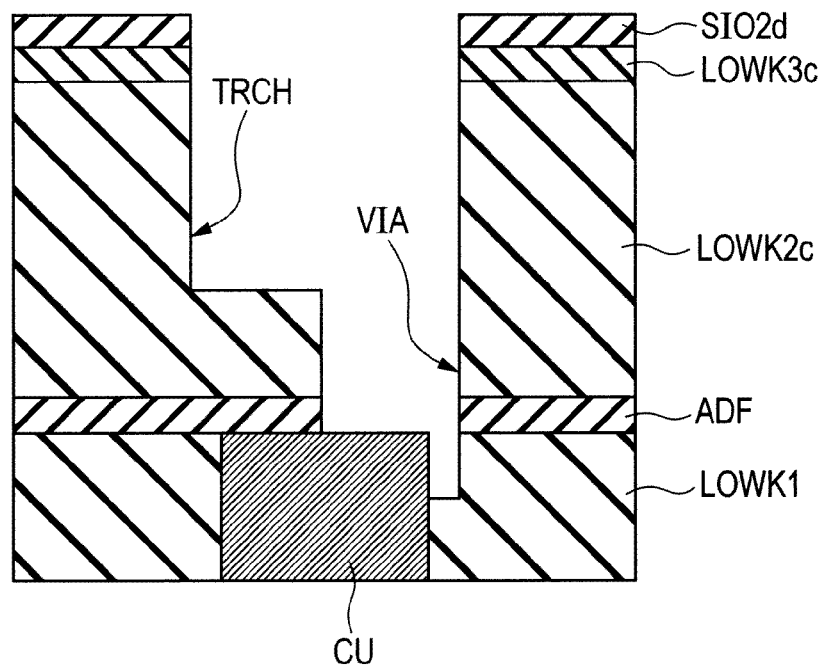
FIG. 9 is a schematic cross-sectional view showing a seventh step in the manufacturing method of the multi-layered wiring structure in the first embodiment.

Then, referring to FIG. 9, the wiring trench pattern TRCHa and the via hole pattern VIAa have the bottoms etched using a pattern formed over the mask layer SIO2c and having the same shape of the wiring trench pattern TRCHa as a mask when viewed in the planar manner.

The etching is performed using gas containing, for example, $CF_4$ or $CHF_3$ (for example, a mixed gas of $CF_4$/$CHF_3$/$N_2$/Ar) as an etchant gas.

This process etches parts of the third low dielectric constant film LOWK3b and the second low dielectric constant film LOWK2b on the lower side of the wiring trench pattern TRCH1, of the diffusion preventing film ADFa positioned at the bottom of the via hole pattern VIAa, and of the first low dielectric constant film LOWK1a. These films become a third low dielectric constant film LOWK3c, a second low dielectric constant film LOWK2c, a diffusion preventing film ADF, and a first low dielectric constant film LOWK1, respectively. Then, the wiring trench pattern TRCHa becomes a wiring trench TRCH, and the via hole pattern VIAa becomes a via hole VIA.

The mask layer SIO2c having low etching selectivity with respect to the low dielectric constant film (made of SiOCH) is slightly etched to become a thin mask layer SIO2d at the same time when the second and third low dielectric constant films are etched.

The thus-formed wiring trench TRCH preferably has a bottom formed of the second low dielectric constant film. The thus-formed via hole VIA is formed in a position where the hole VIA is superimposed on the wiring trench TRCH as viewed in the planar manner so as to expose a part of the copper wiring CU of the first low dielectric constant film LOWK1 (at the bottom of the via hole VIA). As a result, the via hole VIA is formed to electrically couple the wiring trench TRCH to the copper wiring CU of the first low dielectric constant film LOWK1. This is because the via hole pattern VIAa and the wiring trench pattern TRCHa are formed to be superimposed on each other as viewed in the planar manner as mentioned above.

Figure 10:
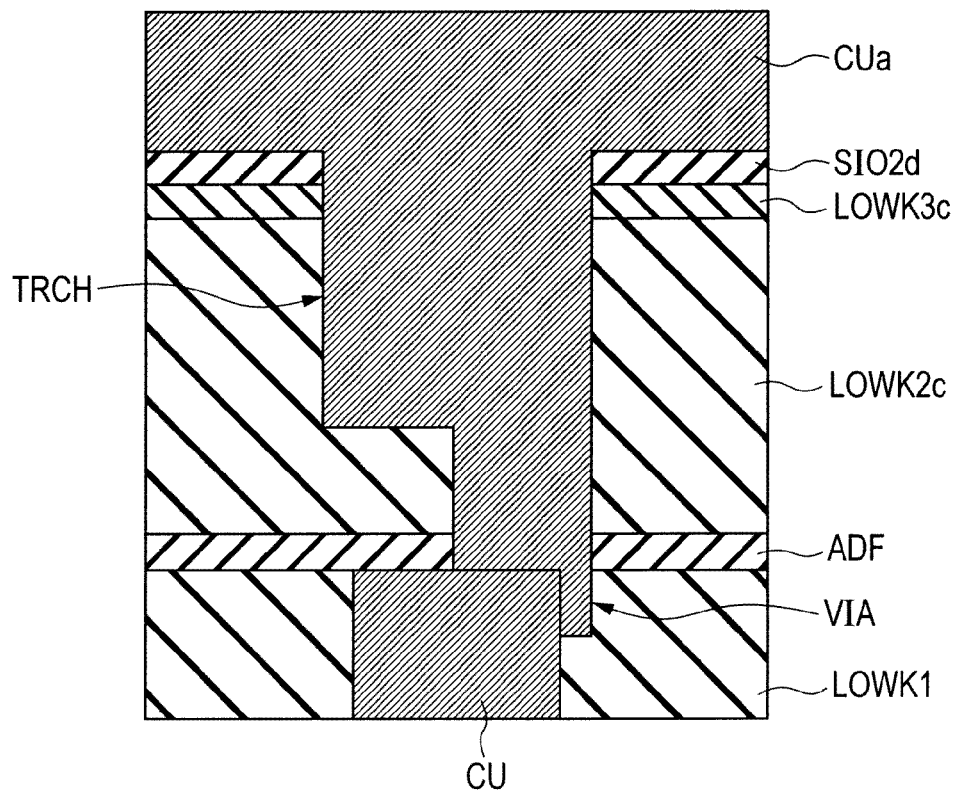
FIG. 10 is a schematic cross-sectional view showing an eighth step in the manufacturing method of the multi-layered wiring structure in the first embodiment.

Then, referring to FIG. 10, a copper metal CUa is charged into the via hole VIA and the wiring trench TRCH. The copper metal CUa is preferably the same as the copper material of the copper wiring CU of the first low dielectric constant film LOWK1.

A barrier layer is preferably formed over the inner surface of the wiring trench TRCH and the inner surface of the via hole VIA. The barrier layer is preferably a thin film comprised of at least one kind of elements selected from the group consisting of, for example, Ta, TaN, Ti, TiN, W, WN, and Ru.

Next, as shown in FIG. 10, the layer from at least a top surface of the copper metal CUa (that is, the uppermost surface of the copper metal CUa shown in FIG. 10) to the third low dielectric constant film LOWK3c is grounded and removed by chemical mechanical polishing (CMP). As mentioned above, the copper wiring and the via wiring shown in FIG. 2 are formed.

Then, the respective steps shown in FIGS. 6 and 7 in the above manufacturing method will be described in more detail below.

FIGS. 6 and 7 show the steps of forming the wiring trench pattern TRCHa using a three-layered resist (multi-layered resist LAR1). These steps can be described with reference to the following FIGS. 11 to 15.

Figure 11:
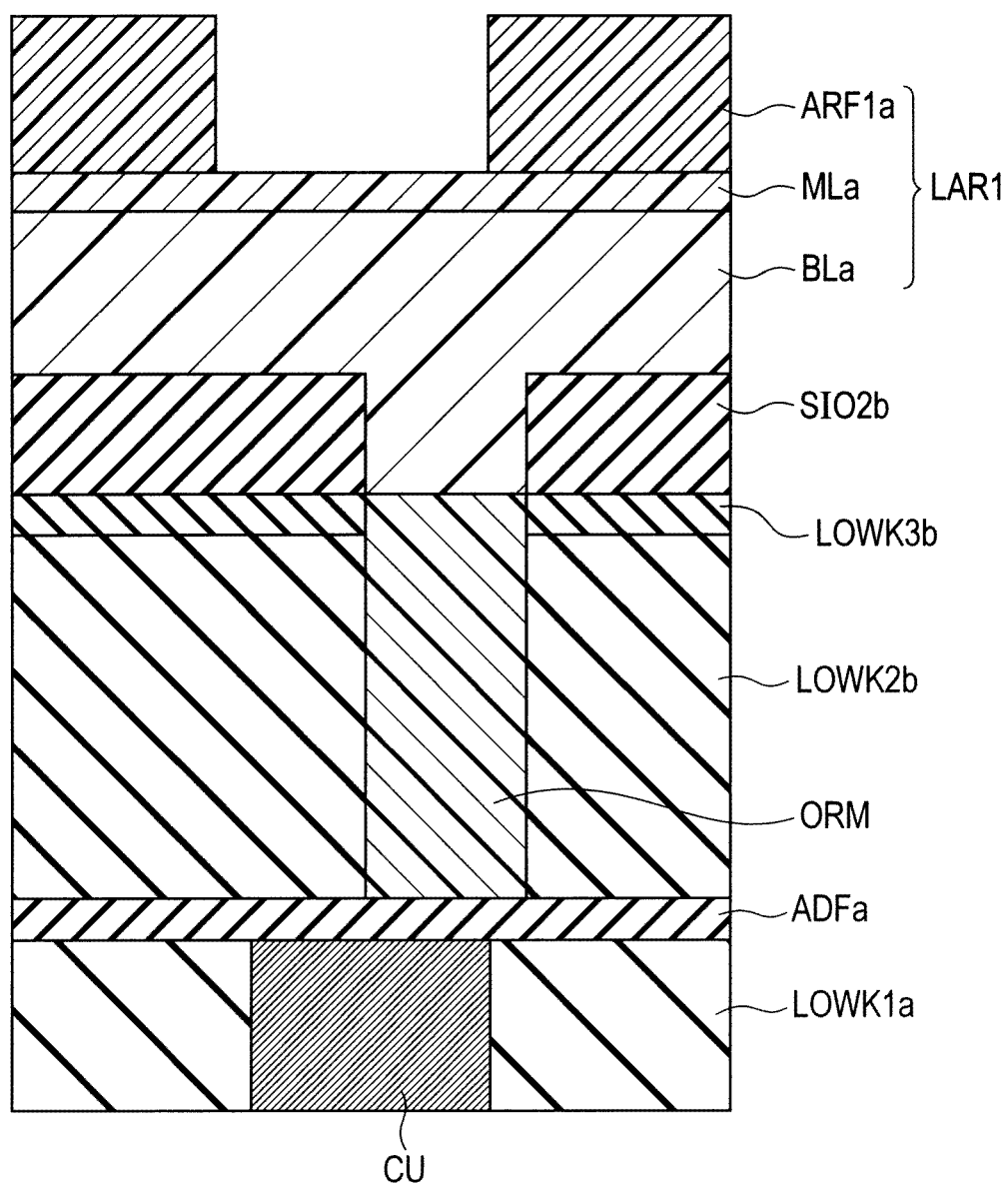
FIG. 11 is a schematic cross-sectional view showing in detail a first step of forming a mask layer by forming a wiring trench pattern in the first embodiment.

FIG. 11 shows the same step as that shown in FIG. 6, but indicates some components by reference characters different from those in FIG. 6 for the following description.

As shown in FIG. 11, a multi-layered resist comprised of the upper layer resist ARF1a, the intermediate layer resist MLa, and the lower layer resist BLa is formed so as to be patterned in the same shape as that of the wiring trench pattern TRCHa as viewed in the planar manner.

Figure 12:
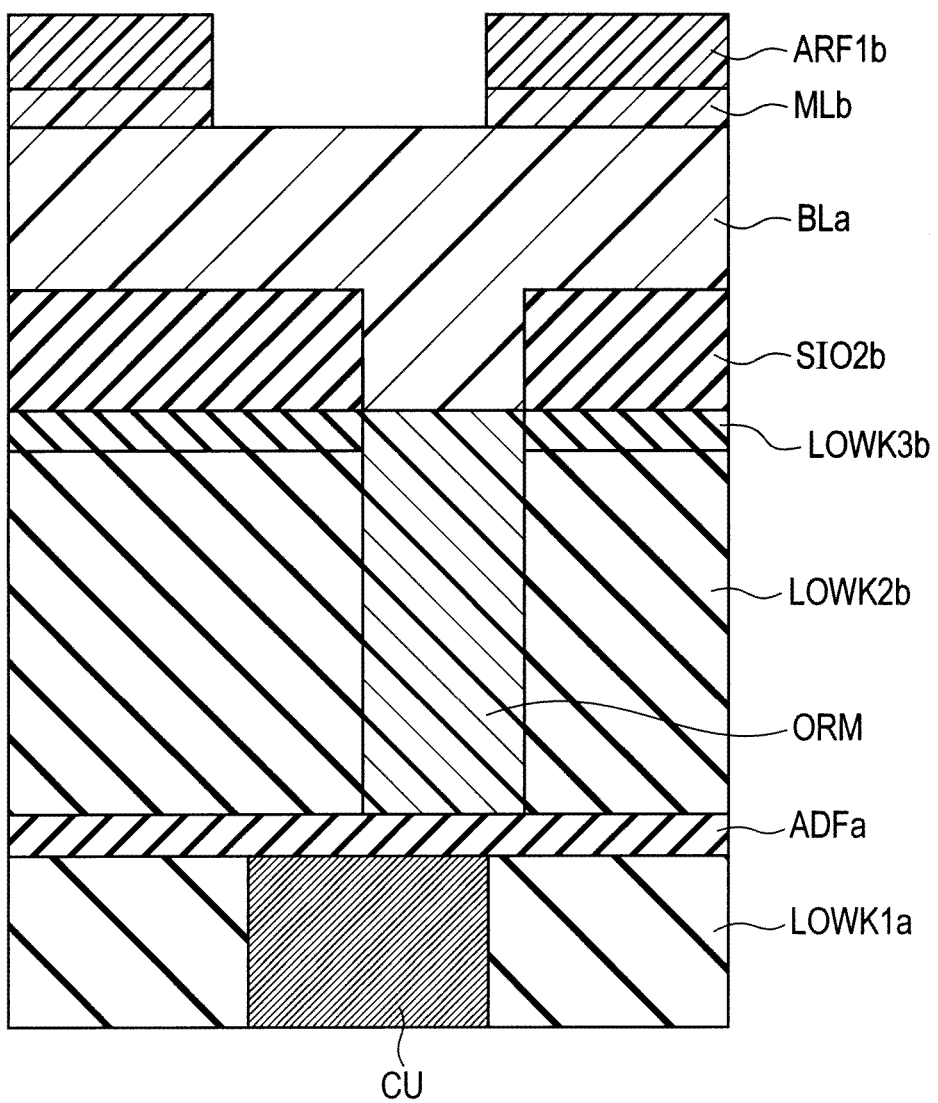
FIG. 12 is a schematic cross-sectional view showing in detail a second step of forming a mask layer by forming a wiring trench pattern in the first embodiment.

Then, referring to FIG. 12, the intermediate layer resist MLa is patterned using the upper layer resist ARF1a (patterned into the shape of the wiring trench pattern TRCHa) as a mask to thereby become an intermediate layer resist MLb. In the process, the upper layer resist ARF1a is also slightly etched to become a thin upper layer resist ARF1b.

Figure 13:
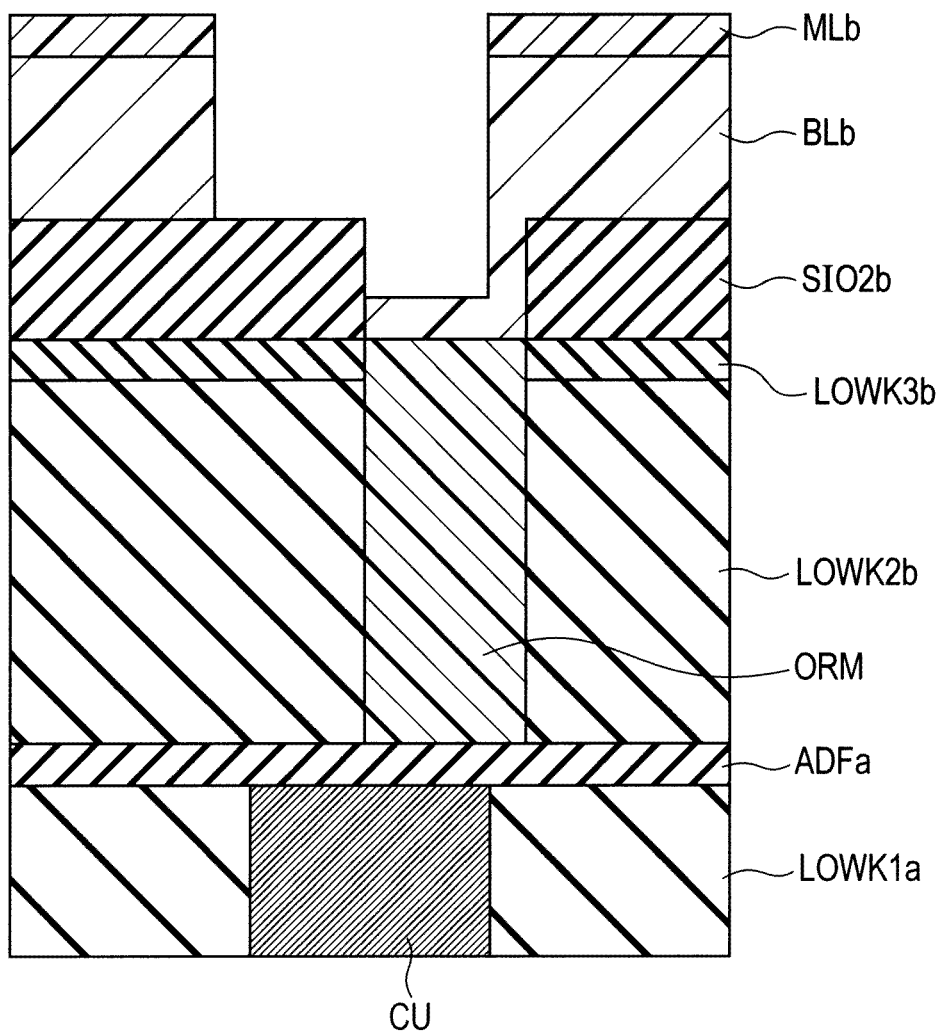
FIG. 13 is a schematic cross-sectional view showing in detail a third step of forming a mask layer by forming a wiring trench pattern in the first embodiment.

Then, referring to FIG. 13, the lower layer resist BLa is patterned using the intermediate layer resist MLb (patterned into the shape of the wiring trench pattern TRCHa) as a mask to thereby become a lower layer resist BLb.

At this time, the upper layer resist ARF1b is etched and removed together with the etching of the lower layer resist BLa. This is because both the upper layer resist ARF1b and the lower layer resist BLa are made of organic material with low etching selectivity between both resists. Thus, the uppermost surface of the intermediate layer resist MLb is exposed to this process.

Figure 14:
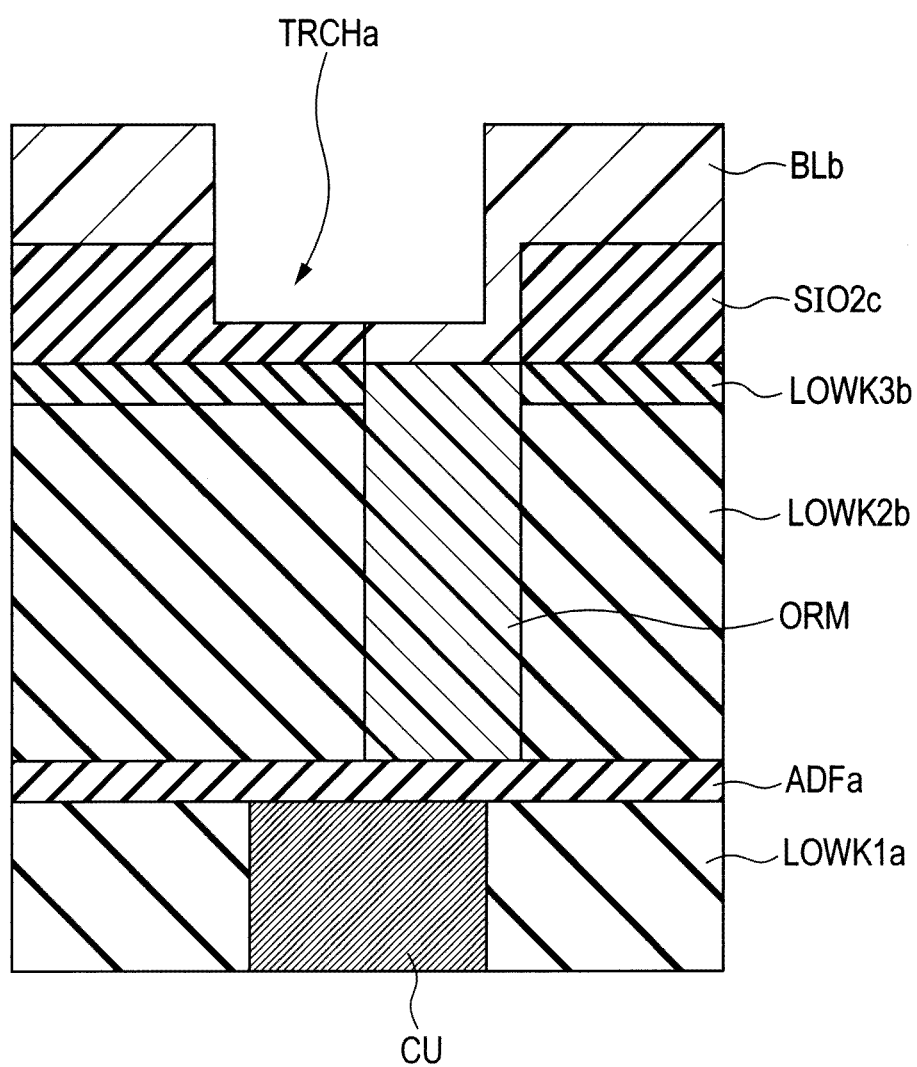
FIG. 14 is a schematic cross-sectional view showing in detail a fourth step of forming a mask layer by forming a wiring trench pattern in the first embodiment.

Then, referring to FIG. 14, the film SIO2b for the mask is patterned using the lower layer resist BLb (patterned into the shape of the wiring trench pattern TRCHa) as a mask to thereby become a film SIO2c for the mask.

At this time, the intermediate layer resist MLb is etched and removed together with the etching of the film SIO2b for the mask. This is because both the intermediate layer resist MLb and the film SIO2b for the mask are made of organic material with low etching selectivity between both resists.

When the above via hole pattern VIAa shown in FIG. 4 is formed in the same way as the wiring trench pattern TRCHa, the upper layer resist ARF2 and the intermediate layer resist ML of the multi-layered resist LAR2 are removed by the formation of the via hole pattern VIAa as shown in FIG. 4.

Figure 15:
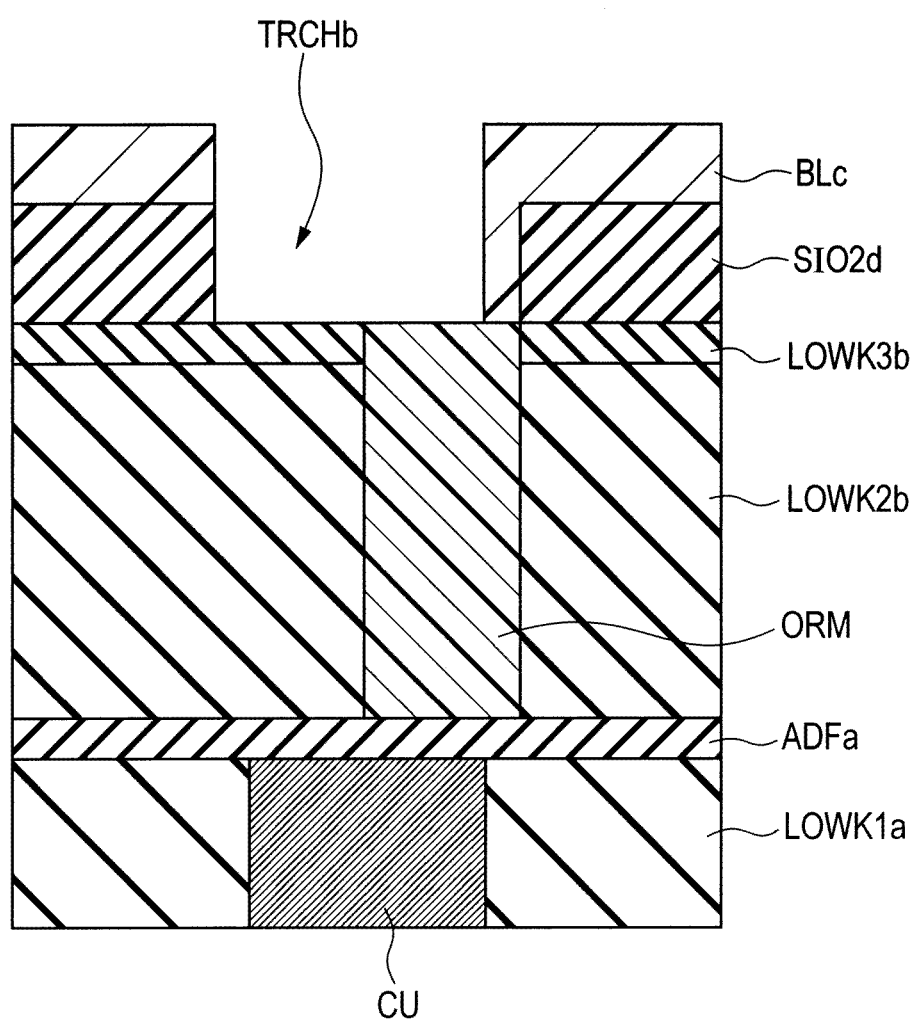
FIG. 15 is a schematic cross-sectional view showing in detail a fifth step of forming a mask layer by forming a wiring trench pattern in the first embodiment.

In the step of patterning the film SIO2b for the mask, finally, the film SIO2b for the mask becomes a mask layer SIO2d shown in FIG. 15 through the film SIO2b for the mask and the film SIO2c for the mask shown in FIG. 14. That is, as shown in FIG. 15, the formation of the mask layer SIO2d exposes the third low dielectric constant film LOWK3b at the bottom of the wiring trench pattern TRCHb.

Thus, the step of exposing the third low dielectric constant film LOWK3b by etching the films SIO2b and SIO2c for the mask is divided into two sub-steps. Specifically, the exposing step includes a first step of removing the intermediate layer resist MLb, while etching the film SIO2b for the mask into the film SIO2c for the mask using a first gas to thereby expose the lower layer resist BLb as the uppermost surface, and a second step of removing a part of the film SIO2c for the mask using a second gas different from the first gas to thereby expose the third low dielectric constant film LOWK3b.

That is, FIG. 14 shows the above first step, and FIG. 15 shows the above second step. The first gas used for etching in the first step is preferably an etchant gas containing phlorocarbon gas with a relatively low carbon ratio, for example, $CF_4$, $CHF_3$, or the like. More specifically, the first gas is a mixed gas, for example, of $CF_4/CHF_3/N_2/Ar$.

The use of the etchant gas decreases the etching selectivity between the $SiO_2$ material of the intermediate layer resist MLb or the film SIO2b for the mask, and the low dielectric constant film thereunder. This is because the low dielectric constant film is comprised of SiOCH-based materials, and contains components similar to $SiO_2$.

Thus, in order not to etch the third low dielectric constant film LOWK3b under the film SIO2b for the mask, the etching is preferably finished before the third low dielectric constant film LOWK3b is exposed.

The first gas is preferably used to etch a part of the filler material (organic material ORM) inside the via hole pattern VIAa at the same time as the etching of the $SiO_2$-based material.

In contrast, the second gas used for the etching in the second step is preferably an etchant gas containing phlorocarbon gas with a carbon ratio higher than that of the first gas, for example, $C_4F_8$, $C_4F_6$, $C_5F_8$, or the like.

The use of the etchant gas enhances the etching selectivity between the SiO2 material of the film SIO2b for the mask and the low dielectric constant film thereunder. This is because the film SIO2b for the mask and the low dielectric constant film differ from each other in carbon atom content or in hydrogen atom content. This results in high selectivity between the $SiO_2$ material and the third low dielectric constant film LOWK3b thereunder.

In other words, when the film for the mask is comprised of $SiO_2$ (silicon oxide film), the etching selectivity of the film SIO2b or SIO2c for the mask with respect to the third low dielectric constant film LOWK3b in use of the second gas is preferably higher than that of the film SIO2b or SIO2c for the mask with respect to the third low dielectric constant film LOWK3b in use of the first gas.

An insulating layer used for the film for the mask may be a silicon oxide film made of, for example, SiO, TEOS (tetreethoxysilane), or the above FSG, instead of $SiO_2$.

Even when the whole mask layer SIO2d is etched to provide the wiring trench pattern TRCHb shown in FIG. 15 with the third low dielectric constant film LOWK3b exposed at the bottom of the wiring trench pattern TRCHb, the third low dielectric constant film LOWK3 is not etched yet.

In the above steps, any other gas, such as oxygen, nitrogen, hydrogen, or rare gas, for example, Ar (argon), He (helium), Xe (xenon), or the like, may be added to the first gas or second gas described above.

That is, in this step, the mask layer $SiO_2$ is etched and the etching is stopped until the third low dielectric constant film LOWK3b, which can suppress variations in depth of the wiring trench pattern TRCHb due to variations in etched amount. The bottom of the wiring trench pattern TRCHb is equivalent to the upper surface (more preferably, the uppermost surface) of the third low dielectric constant film LOWK3b, which results in a substantially constant depth of the wiring trench pattern TRCHb.

Thus, variations in depth of the wiring trench TRCH finally formed (see FIG. 9) can be suppressed, which prevents the inconveniences, including variation in electrical resistance, and in amount of current flowing through the wiring, leading to reduction of the reliability of the semiconductor device.

Figure 16:
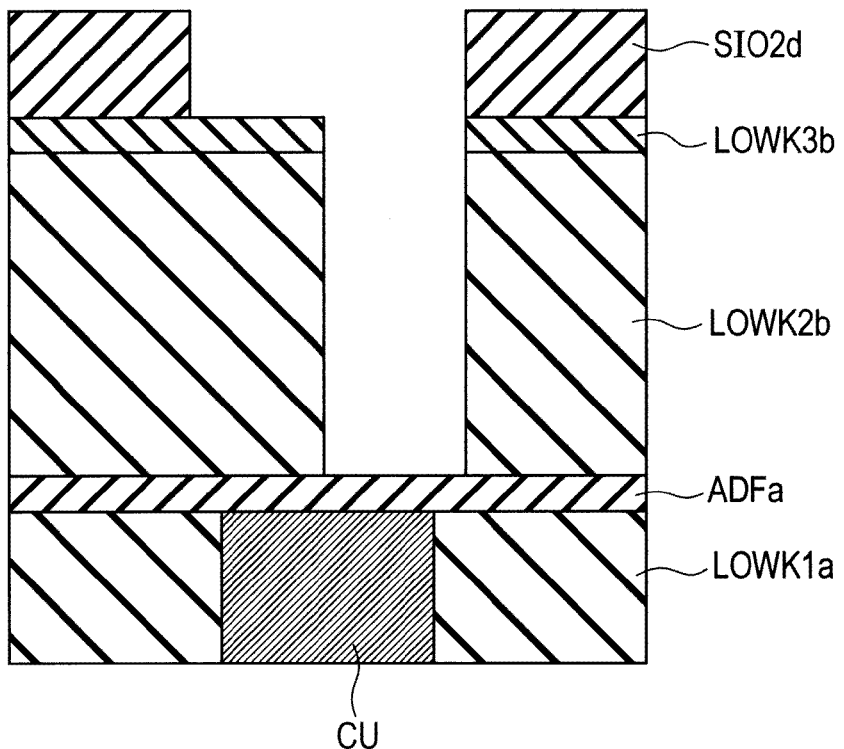
FIG. 16 is a schematic cross-sectional view showing in detail a sixth step of forming a mask layer by forming a wiring trench pattern in the first embodiment.
Figure 17:
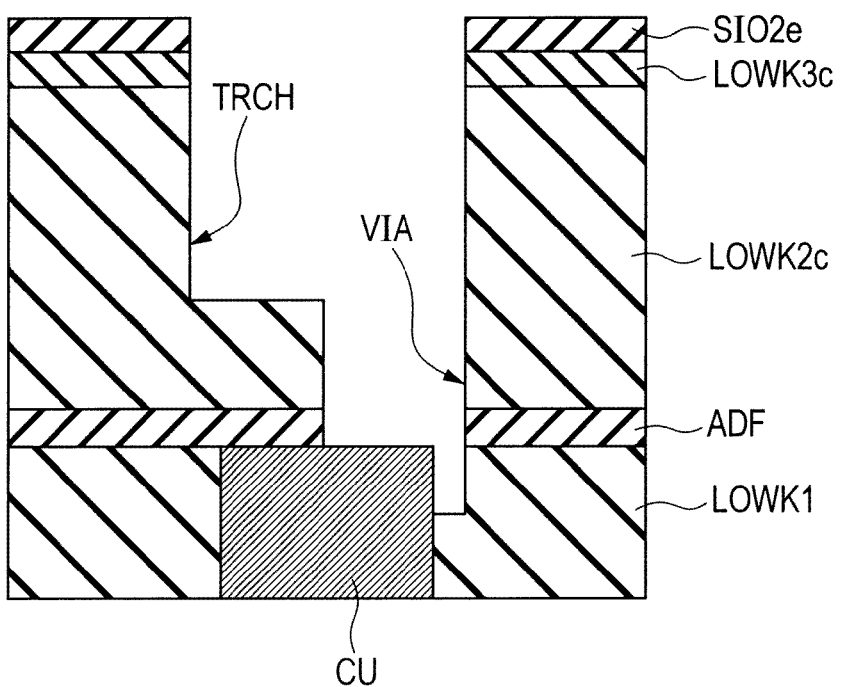
FIG. 17 is a schematic cross-sectional view showing in detail a seventh step of forming a mask layer by forming a wiring trench pattern in the first embodiment.

FIG. 15 shows the same step as FIG. 7, FIG. 16 shows the same step as FIG. 8, and FIG. 17 shows the same step as FIG. 9. However, in the description of FIGS. 11 to 15, FIGS. 15 to 17 indicate some components by reference characters different from those shown in respective FIGS. 7 to 9.

A conventional method of manufacturing a multi-layered wiring structure which is performed in the same way as that shown in FIG. 2 will be described below as a comparative example with respect to the manufacturing method of this embodiment descried above.

Figure 18:
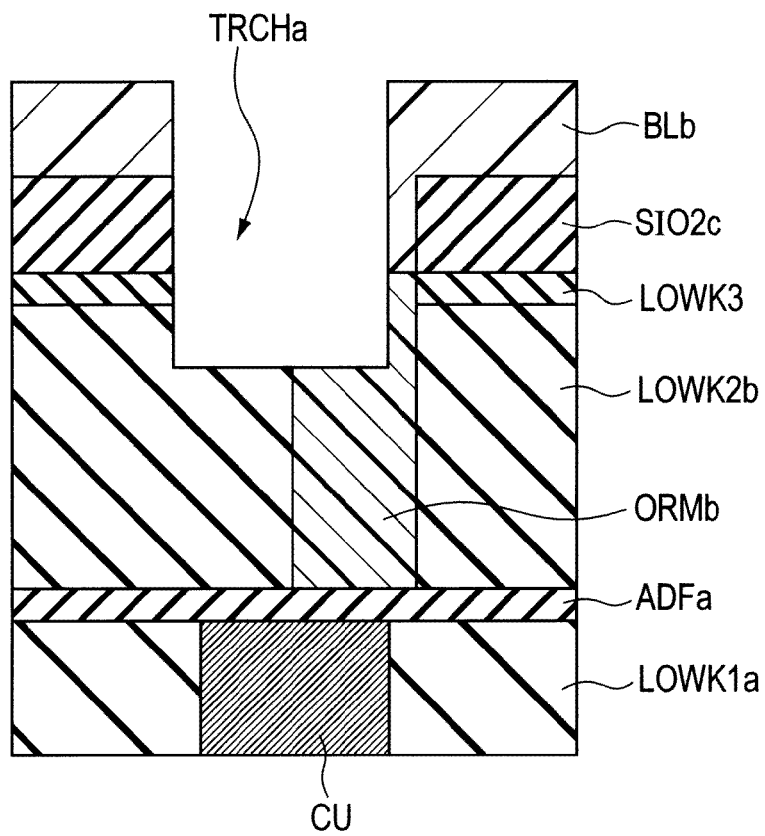
FIG. 18 is a schematic cross-sectional view showing a step corresponding to FIG. 7 in a comparative example of the invention.

In the conventional manufacturing method, as shown in FIG. 11(FIG. 6), a multi-layered resist is formed for forming a wiring trench pattern. As shown in FIG. 13, an upper layer resist is removed, and a lower layer resist BLb is patterned in the shape of the wiring trench pattern. Thereafter, as shown in FIG. 18, a film for the mask, a third low dielectric constant film, and a second low dielectric constant film which are located under the wiring trench pattern are simultaneously etched using the wiring trench pattern of the lower layer resist BLb. In this way, the wiring trench pattern TRCHa is formed, so that these layers become a mask layer SIO2c, a third dielectric constant film LOWK3, and a second low dielectric constant film LOWK2b, respectively. A filler organic material is also partly etched to become an organic material ORMb.

In the etching shown in FIG. 18, gas containing phlorocarbon gas, for example, $CF_4$, $CHF_3$, or the like is used. In this way, the above gas containing $CF_4$, $CHF_3$, or the like etches the mask layer, the third low dielectric constant film, and the second low dielectric constant film at one time because of the low etching selectivity between the $SiO_2$ material of the mask layer SIO2c and the low dielectric constant film thereunder.

In such processes, even when the depth of the etching is controlled such that the bottom of the formed wiring trench pattern TRCHa is aligned with the second low dielectric constant film LOWK2b, the depth (thickness) of the formed wiring trench pattern TRCHa is more varied between the wiring trench patterns TRCHas, between the Si substrates, or between regions on the uppermost surface of the laminated structure.

Figure 19:
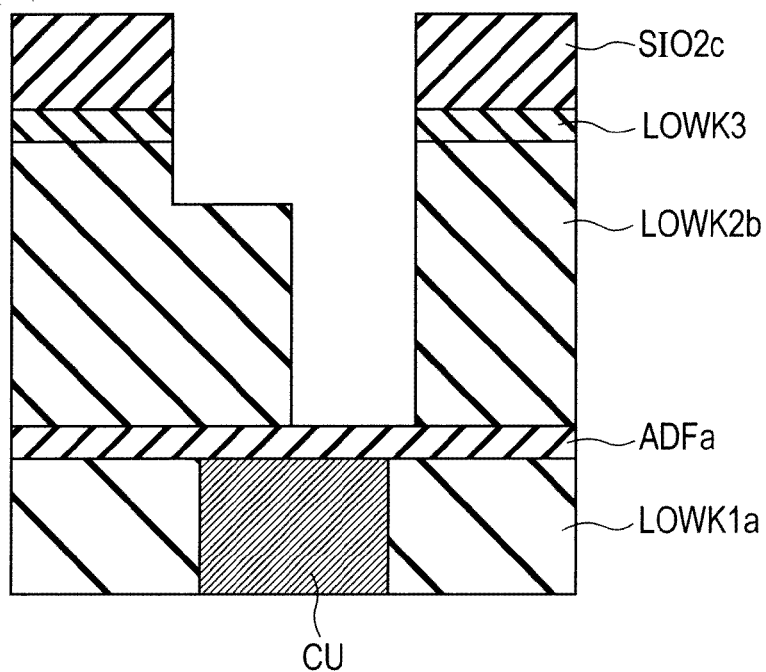
FIG. 19 is a schematic cross-sectional view showing a step corresponding to FIG. 8 in the comparative example.

Then, referring to FIG. 19 (like FIGS. 8 and 16), ashing is performed to remove the lower layer resist BLb. In FIG. 18, the second low dielectric constant film LOWK2b is exposed at the bottom surface and side walls of the wiring trench pattern TRCHa. Since the low dielectric constant film tends to be easily damaged by ashing, the wiring trench pattern TRCHa (second low dielectric constant film LOWK2b) has its bottom and side walls damaged, which can have the inconveniences including an increase in dielectric constant of the low dielectric constant film, and an increase in leak current.

Figure 20:
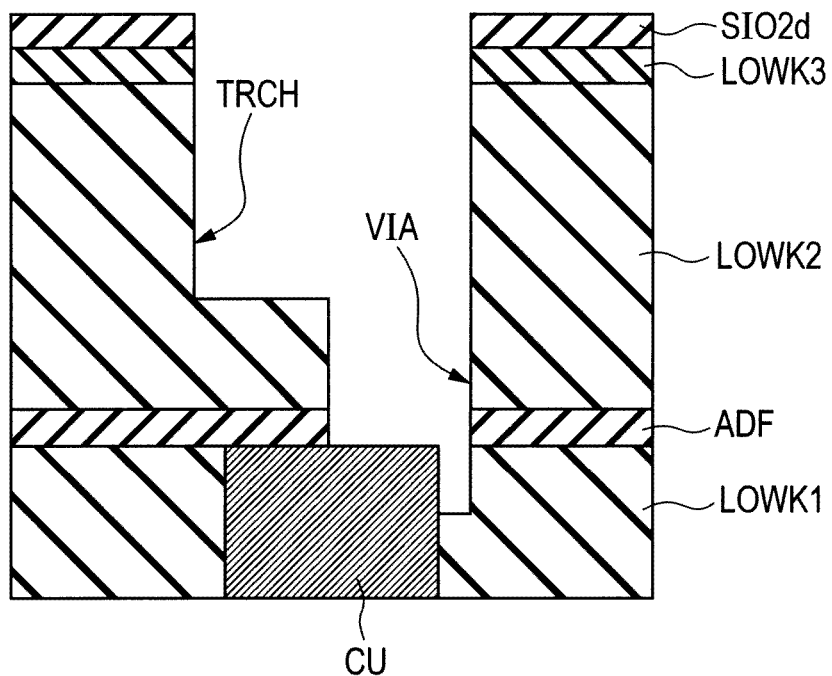
FIG. 20 is a schematic cross-sectional view showing a step of corresponding to FIG. 9 in the comparative example.

Then, referring to FIG. 20, the wiring trench pattern TRCHa is etched using the mask layer SIO2c as a mask to thereby form a wiring trench TRCH and a via hole VIA (in the same way as those shown in FIGS. 9 and 17).

Then, copper is charged into the wiring trench TRCH or via hole VIA in the same way as the manufacturing method of this embodiment.

The operation and effects of this embodiment will be described below by comparing this embodiment with the above-mentioned comparative example.

As mentioned above, the manufacturing method of the comparative example causes variations in depth (thickness) of the formed wiring trench pattern TRCHa in the step shown in FIG. 18. This is because the etching rate of the second low dielectric constant film LOWK2b and the third low dielectric constant film LOWK3 is higher than that of the mask layer SIO2c.

That is, slight variations in etching rate at the stage of forming the mask layer SIO2c leads to remarkable variations in depth of the entire wiring trench pattern TRCHa at the stage of forming the following second low dielectric constant film LOWK2b and the third low dielectric constant film LOWK3.

The variations in depth remarkably appears in the wiring trench TRCH formed in the step shown in FIG. 20. Then, variations in depth of the copper wiring formed of the wiring trench TRCH leads to the high possibility of a decrease the electrical resistance.

In this embodiment, however, variations in depth of the wiring trench pattern TRCHa (TRCHb) formed as shown in FIG. 7 (or FIG. 15) are reduced as mentioned above. This results in small variations in depth of the wiring trench TRCH finally formed as shown in FIG. 9 (or FIG. 17). Accordingly, this embodiment can suppress degradation of the electrical characteristics, including variations in electrical resistance of the wiring, or in current amount.

The effect of decreasing the variations in depth of the above wiring trench TRCH is remarkable especially in the structure without a stopper film for forming a wiring trench in the second low dielectric constant film LOWK2, or in the single-layer structure of the second low dielectric constant film LOWK2 without a lamination of two or more layers, like this embodiment.

Further, in this embodiment, the layer from the top surface of the copper metal Cua up to the third low dielectric constant film LOWK3c as shown in FIG. 10 is ground and removed by the CMP.

Generally, when the copper material in the thickness of the third low dielectric constant film LOWK3c, the mask layer SIO2d, and the copper metal CUa thereabove are ground by the CMP as shown in FIG. 10, there occur large variations in thickness of the formed copper wiring or the like because of a large amount of grinding. The lower the dielectric constant of the low dielectric constant film LOWK3c or the like, the lower the density of the film. The increase in grinding rate of the CMP drastically increases the variations in amount of grinding.

This embodiment, however, can decrease the variations in thickness of the wiring trench TRCH (copper wiring) finally formed after the above CMP process because the variations in depth of the wiring trench TRCH is suppressed.

Thus, the removal of the third low dielectric constant film LOWK3c in the CMP process as described above maintains only the second low dielectric constant film LOWK2 whose dielectric constant is lower than that of the third low dielectric constant film as shown in FIG. 2, which can result in a decrease in effective dielectric constant of the entire multi-layered wiring. That is, the occurrence of RC delay can be suppressed more surely.

In a case where the low dielectric constant film under the wiring trench pattern TRCHa is not etched in forming the pattern TRCHa (mask layer SIO2c (SIO2d)) like this embodiment, if only the above second step is performed, the intermediate layer resist having low etching selectivity with respect to the low dielectric constant film will be difficult to etch, while the etching of the low dielectric constant film can be suppressed.

Thus, when performing etching using the mask layer SIO2c (SIO2d) to thereby form the wiring trench TRCH and the via hole VIA, a part of the intermediate layer resist previously existing above the mask layer can remain as a residue without being etched.

If the post-process is performed with the intermediate layer resist not removed completely, the residue of the intermediate layer resist will serve as a mask, which possibly cause the abnormal shape of the formed pattern. This is because the resist comprised of organic material, for example, the upper layer resist or lower layer resist can be removed by ashing, but the thin film, such as the intermediate layer resist, comprised of $SiO_2$-based material cannot be removed by the ashing. Thus, the intermediate layer resist is preferably removed completely.

Thus, in this embodiment, the step of forming the wiring trench pattern TRCHa (mask layer) is divided into the first step and the second step as mentioned above. Before the second step of forming the wiring trench pattern TRCHa whose depth is precisely controlled using the low dielectric constant film as a stopper film, the intermediate layer resist is completely removed at the same time as the time of etching a part of the film for the mask (mask layer) in the first step.

Since the step of forming the wiring trench pattern TRCHa (mask layer) is divided into the first step and the second step, the wiring trench pattern TRCHa whose depth is precisely controlled can be formed with the intermediate layer resist completely removed.

In this embodiment, unlike the comparative example shown in FIG. 19, the second low dielectric constant film LOWK2b is not exposed as the bottom and inner wall of the wiring trench pattern TRCHa in performing ashing the lower layer resist BLb (BLc) with reference to FIG. 8(FIG. 16). Thus, the damage on the bottom and inner wall of the wiring trench pattern TRCHa due to the plasma in the ashing can be suppressed. This can prevent the inconveniences, including increase in effective dielectric constant and in RC delay around the wiring trench pattern TRCHa, and increase in leak current from a copper wiring formed in the wiring trench pattern TRCHa.

Referring to FIG. 8(FIG. 16), also at the time of the ashing process of this embodiment, the bottom of the wiring trench pattern TRCHa is comprised of the third low dielectric constant film LOWK3b. The third low dielectric constant film has a dielectric constant higher than that of the second low dielectric constant film. For this reason, the third low dielectric constant film, however, is unlikely to be damaged by the plasma as compared to the second low dielectric constant film. Even when the third dielectric constant film is damaged by the plasma, the third low dielectric constant film LOWK3c shown in FIG. 10 is ground and removed by the CMP in this embodiment. This is not problematic from the viewpoint of characteristics.

The inner wall of the wiring trench pattern TRCHa in the ashing process of this embodiment is not covered with the second low dielectric constant film LOWK2b (see FIG. 7). Thus, the second low dielectric constant film LOWK2b of the wiring trench pattern TRCHa of this embodiment can be more effectively prevented from being damaged in ashing than the wiring trench pattern TRCHa of the comparative example.

As mentioned above, according to this embodiment, the electrical characteristics of the formed wiring can be improved and stabilized.

The wiring trench pattern TRCHa is formed using the multi-layered resist LAR1 including the lower layer resist BLa, the intermediate layer resist ML, and the upper layer resist ARF1 which are laminated in that order. Even when the amount of etching (depth of etching) is increased in forming the wiring trench TRCH, variations in etching amount is suppressed, which can perform the etching with high accuracy.

In the manufacturing method of this embodiment, after forming the film SIO2a for the mask, the via hole pattern VIAa is formed. This can enhance the positional accuracy of the mask layers SIO2c and SIO2d comprised of the film SIO2a for the mask as viewed in the planar manner.

Specifically, if a film for a mask were formed after forming a via hole pattern, a mask layer to be formed later would have a region where a part of the film for the mask inside the via hole pattern is not removed by etching (for example, a region extending in the lateral direction from the left end of the upper layer resist ARF1 on the right side shown in FIG. 6 to the right end of the via hole pattern VIAa). That is, there is the possibility that failures in position (shape) as viewed in the planar manner of the mask layer can be caused. The procedure of the manufacturing method according to this embodiment can suppress the occurrence of the failures in position (shape) as mentioned above.

Second Embodiment

This embodiment differs from the first embodiment in region to be removed by the last CMP. A manufacturing method of this embodiment will be described below.

Figure 21:
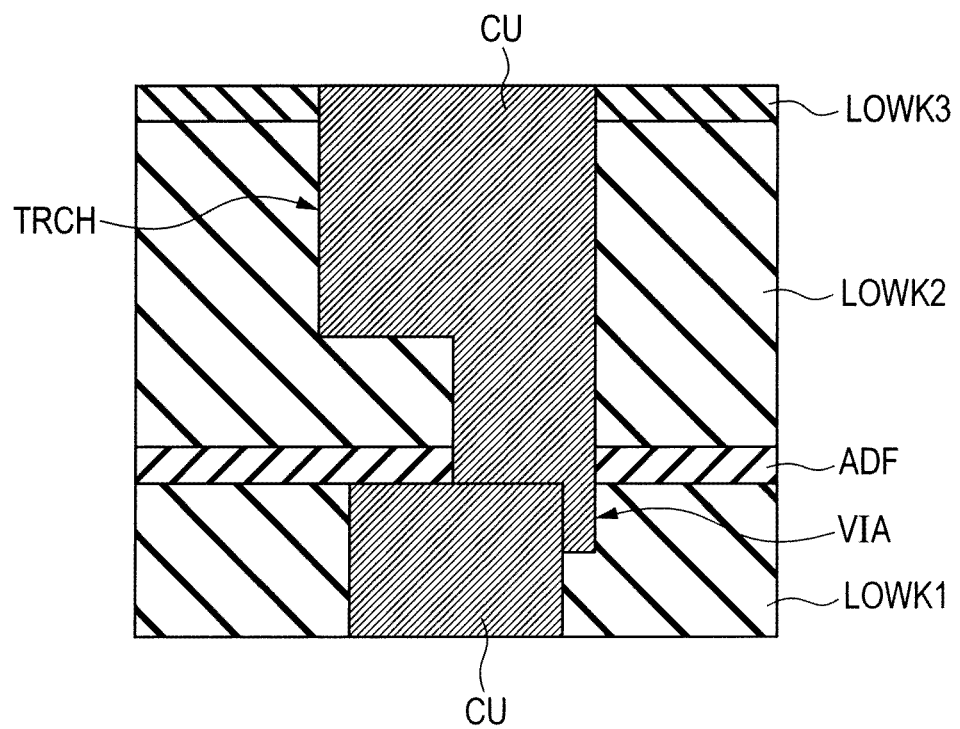
FIG. 21 is a schematic cross-sectional view showing a multi-layered wiring structure corresponding to FIG. 2 in a second embodiment of the invention.

By comparing with FIG. 2, FIG. 21 shows that the third low dielectric constant film LOWK3 shown to be removed (by the CMP) in FIG. 2 is not removed yet. That is, a layer from the top surface of the copper metal CUa (see FIG. 10) to the mask layer SIO2d is removed in the CMP.

The structure of this embodiment is substantially the same as that of the first embodiment except for the above points. Thus, a description thereof will not be repeated.

Next, the operation and effects of this embodiment will be described below. For example, like the first embodiment, the removal of the third low dielectric constant film by the CMP exposes the second low dielectric constant film LOWK2 thereunder as the uppermost surface as shown in FIG. 2. The second low dielectric constant film LOWK2 has a low dielectric constant as compared to the third low dielectric constant film, and thus tends to be damaged by asking or etching.

This embodiment can suppress the damage described above by maintaining the third low dielectric constant film LOWK3.

Since the third low dielectric constant film LOWK3 is not ground, the amount of grinding by the CMP is decreased. Thus, as compared to the case where the third low dielectric constant film LOWK3 is ground, variations in thickness of the wiring finally formed due to variations in amount of grinding (thickness of grinding) can be further decreased. Thus, the electrical characteristics of the formed wiring can be more stabilized.

The second embodiment of the invention differs from the first embodiment only in the above respective points. That is, the structure, conditions, procedure, effects, and the like not mentioned above in the second embodiment are in conformance to those in the first embodiment.

(Third Embodiment)

This embodiment differs from the first embodiment in structure of the mask layer (film for the mask). A manufacturing method of this embodiment will be described below.

Figure 22:
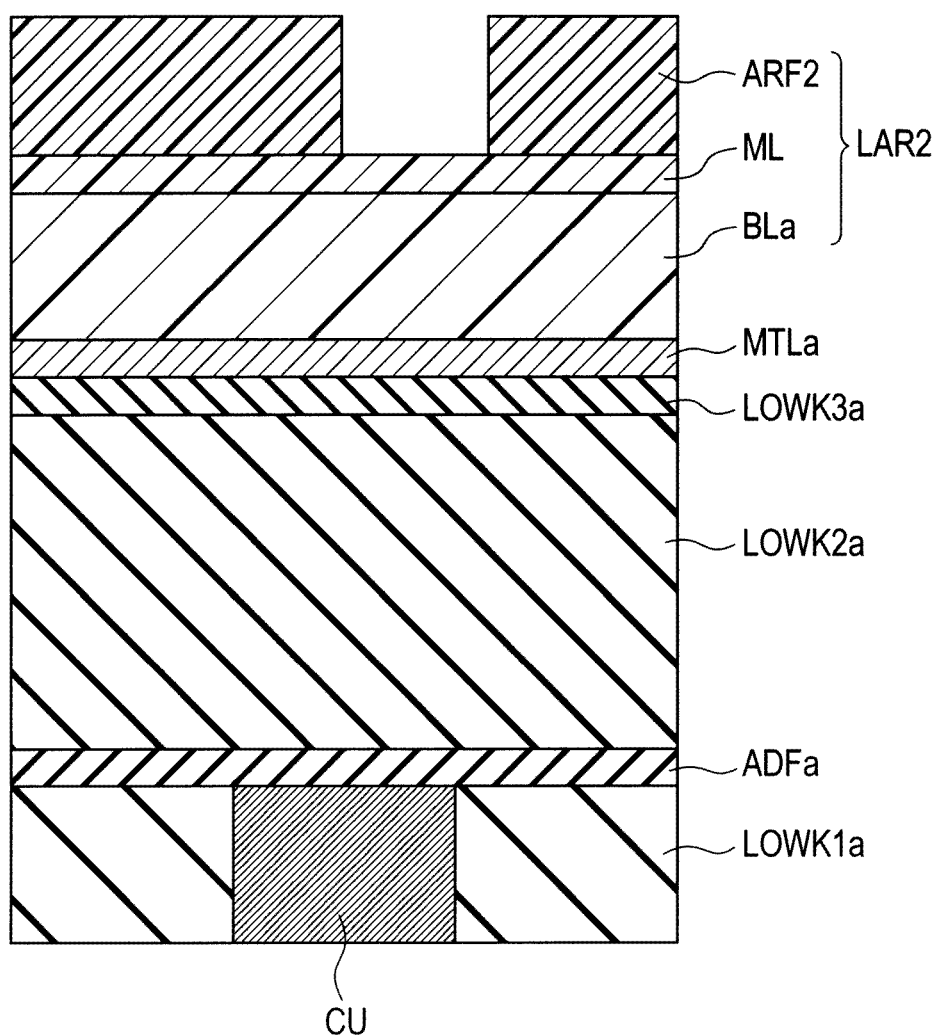
FIG. 22 is a schematic cross-sectional view showing a step corresponding to FIG. 3 in a third embodiment of the invention.

FIG. 22 differs from FIG. 3 of the first embodiment in that the film MTLa for the mask for serving as a mask layer is comprised of a metal film and not a $SiO_2$-based material. Thus, the film for the mask may be formed using a metal film instead of an insulating layer.

The film MTLa for the mask is preferably formed using a metal film comprised of, for example, TiN or TaN. The film MTLa for the mask preferably has a thickness of not less than 15 nm nor more than 40 nm. That is, the film MTLa for the mask is preferably formed more thinly than the film SIO2a for the mask. The film MTLa for the mask is preferably formed, for example, by the CVD method or sputtering method.

Figure 23:
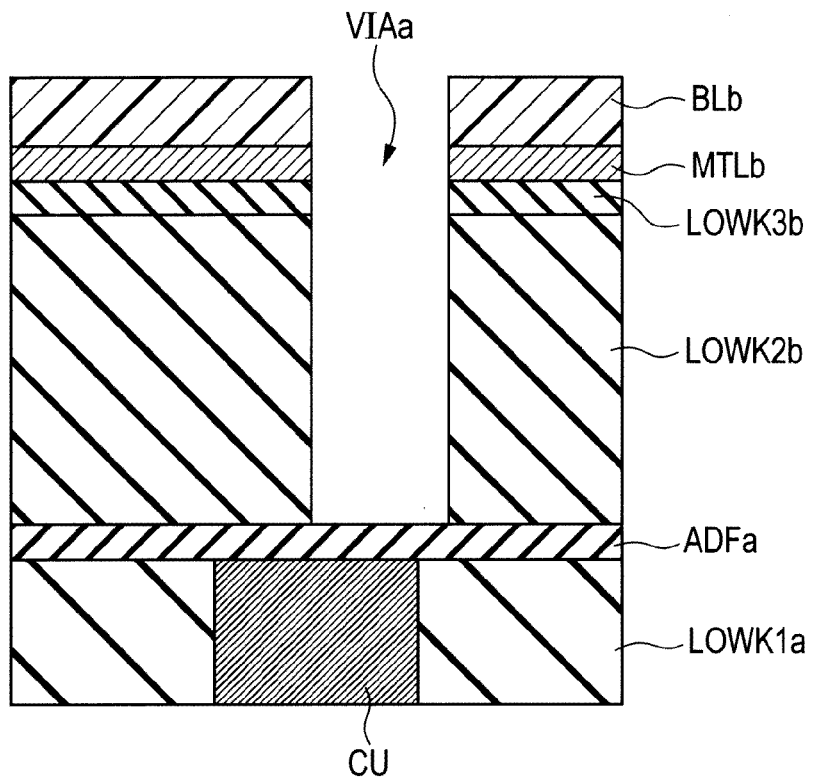
FIG. 23 is a schematic cross-sectional view showing a step corresponding to FIG. 4 in the third embodiment.

As shown in FIG. 23, a via hole pattern VIAa is formed to make a film MTb for the mask in the same way as that shown in FIG. 4. At this time, gas for etching the intermediate layer resist ML and the low dielectric constant film has high etching selectivity between the intermediate layer resist ML and the film MTLa for the mask which is a metal film. Thus, this process is preferably divided into the step of etching the intermediate layer resist ML and the low dielectric constant film and the step of etching the film MTLa for the mask in the same way as the following formation method of a wiring trench pattern.

In particular, in the step of etching the third low dielectric constant film LOWK3a and the second low dielectric constant film LOWK2a in formation of the via hole pattern VIAa, after etching the film MTLa for the mask into the film MTLb for the mask, the low dielectric constant film LOWK2a may be etched using the film MTLb for the mask as a mask.

Figure 24:
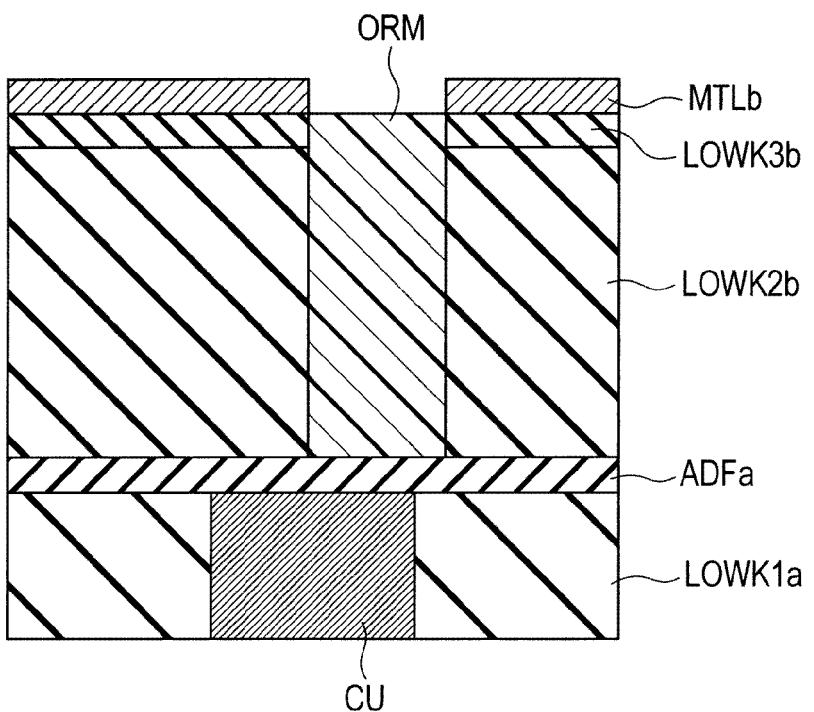
FIG. 24 is a schematic cross-sectional view showing a step corresponding to FIG. 5 in the third embodiment.

Then, the multi-layered resist LAR2 is removed by ashing, and an organic material ORM is charged as shown in FIG. 24. Then, a multi-layered resist LAR1 is formed as a first resist mask for forming the wiring trench pattern as shown in FIG. 25.

Figure 26:
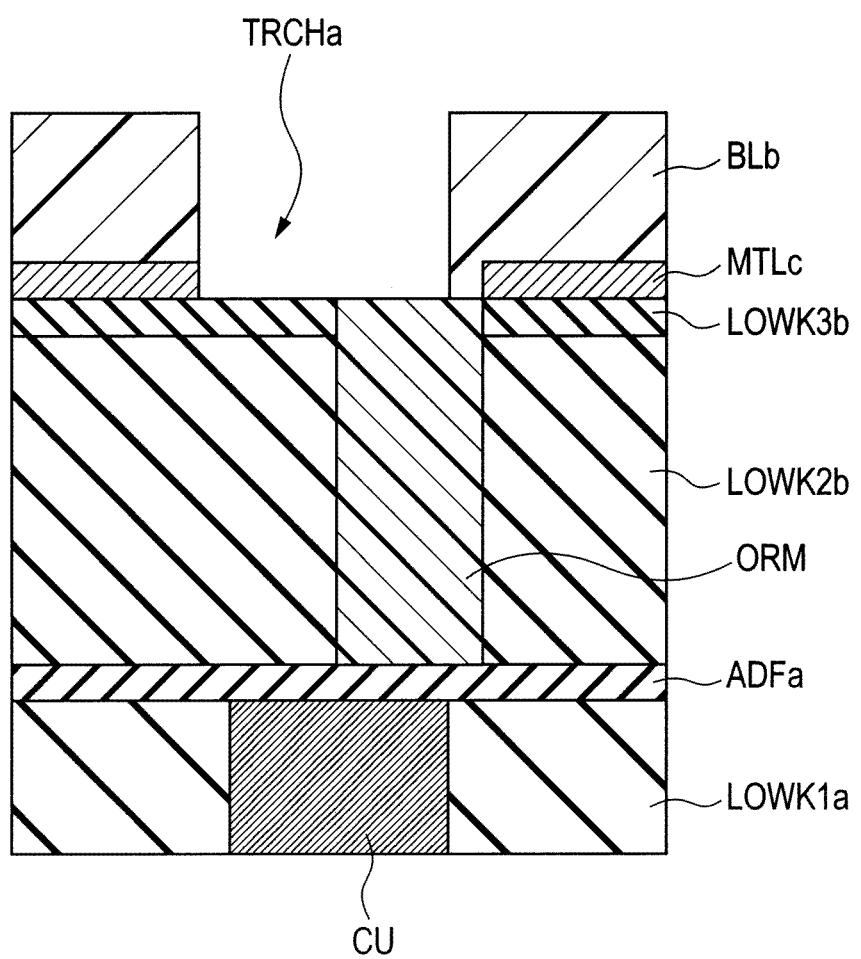
FIG. 26 is a schematic cross-sectional view showing a step corresponding to FIG. 7 in the third embodiment.

Then, as shown in FIG. 26, the multi-layered resist LAR1 is etched so as to expose the third low dielectric constant film LOWK3b, so that the wiring trench pattern TRCHa whose bottom is comprised of the surface of the third low dielectric constant film LOWK3b is formed in the film MTLb for the mask. The film MTLb for the mask becomes the mask layer MTLc.

Figure 27:
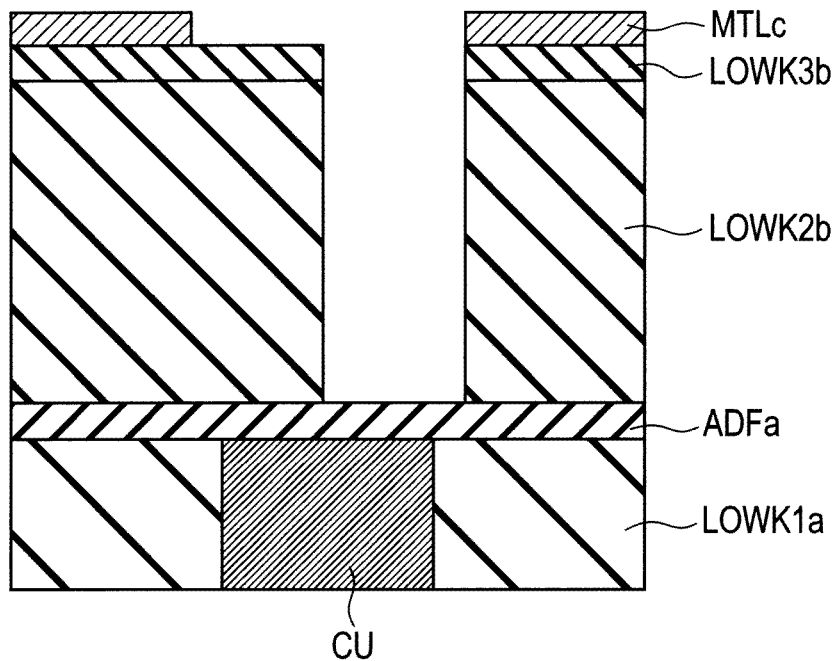
FIG. 27 is a schematic cross-sectional view showing a step corresponding to FIG. 8 in the third embodiment.
Figure 28:
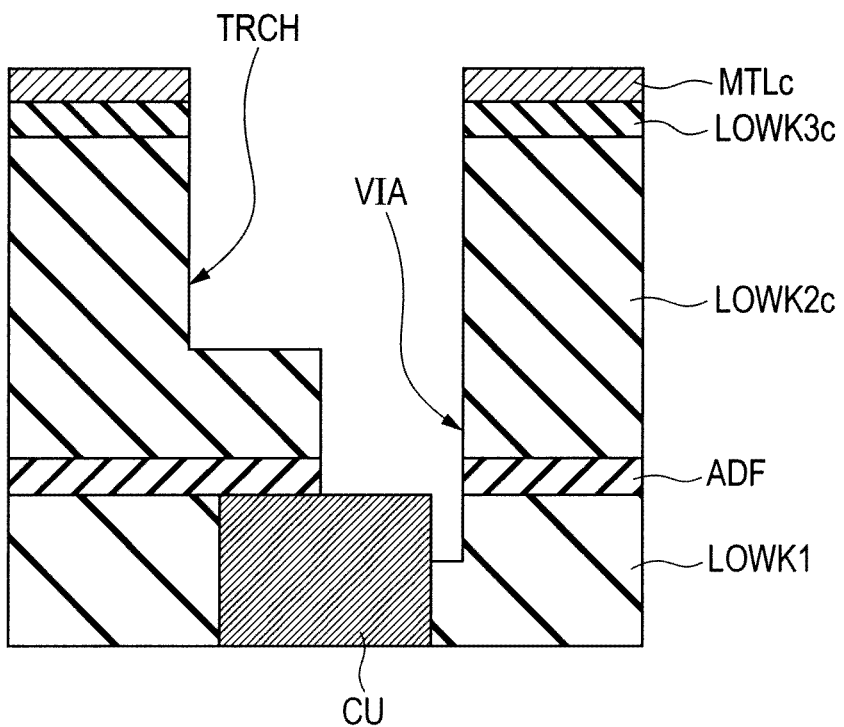
FIG. 28 is a schematic cross-sectional view showing a step corresponding to FIG. 9 in the third embodiment.
Figure 29:
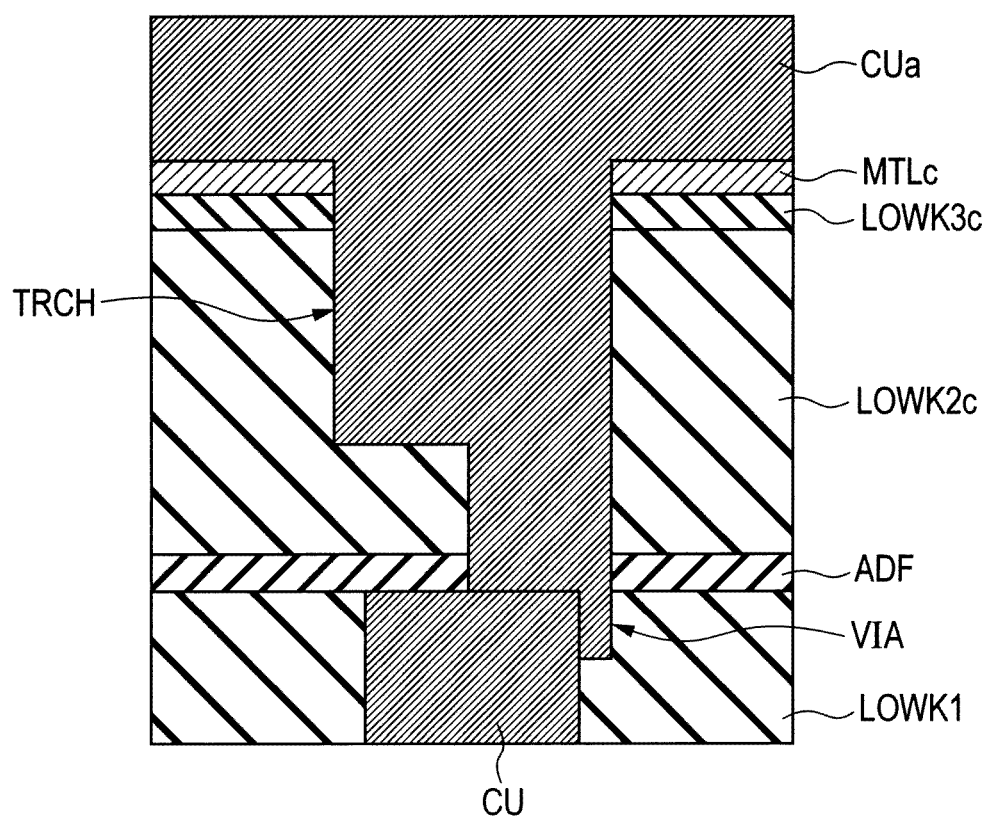
FIG. 29 is a schematic cross-sectional view showing a step corresponding to FIG. 10 in the third embodiment.

After removing the lower layer resist BLb by ashing as shown in FIG. 27, the wiring trench TRCH and the via hole VIA are formed using the mask layer MLTc as a mask as shown in FIG. 28. Then, the charging of copper metal CUa is performed as shown in FIG. 29 in the same way as that shown in FIG. 10.

Figure 25:
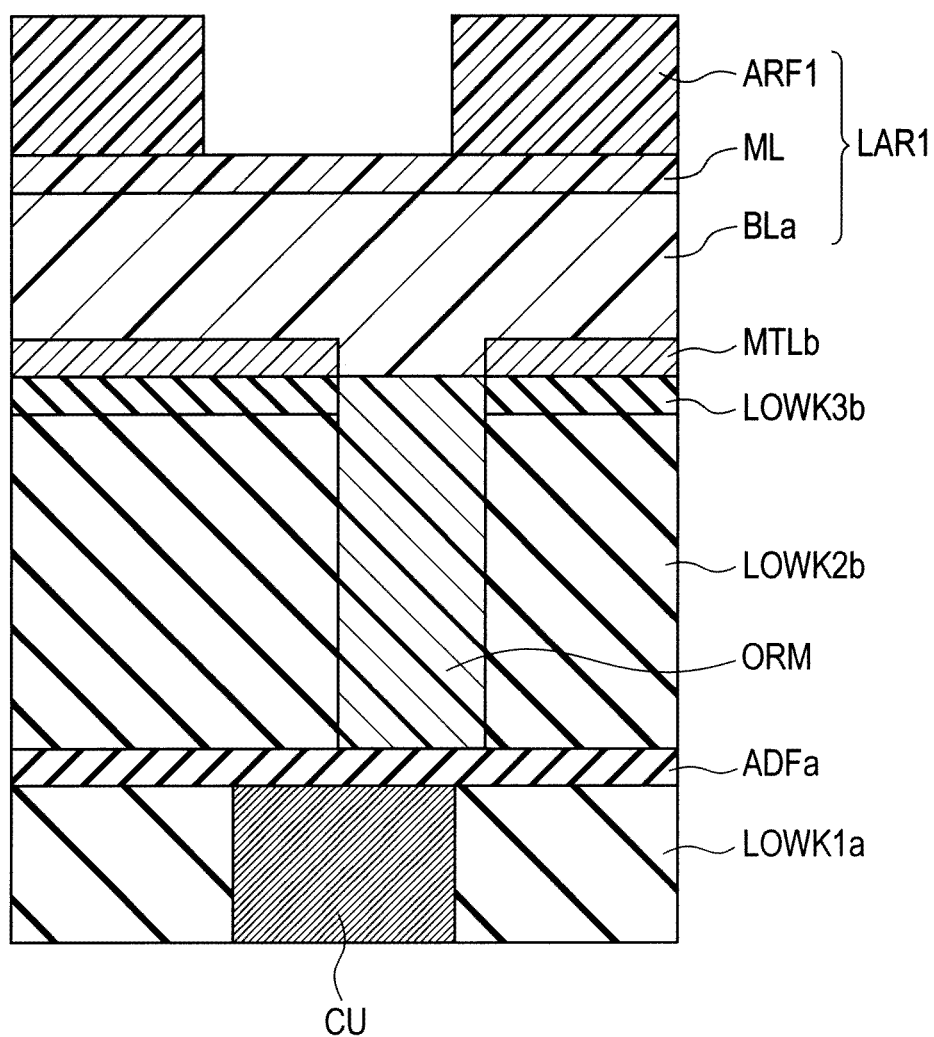
FIG. 25 is a schematic cross-sectional view showing a step corresponding to FIG. 6 in the third embodiment.
Figure 30:
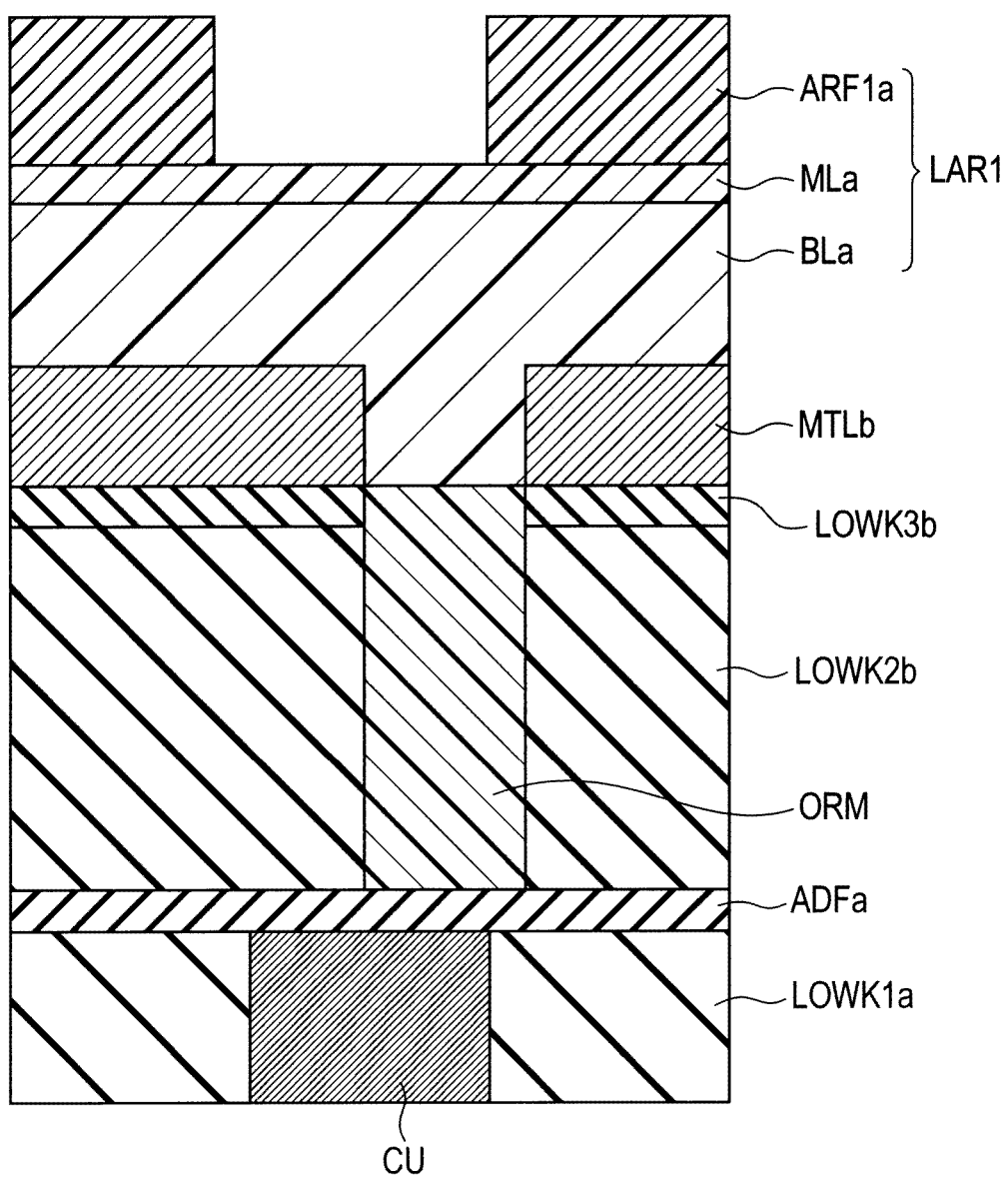
FIG. 30 is a schematic cross-sectional view showing a step corresponding to FIG. 11 in the third embodiment.

FIGS. 30 to 35 illustrate in more detail the respective steps of forming the wiring trench pattern TRCHa using the multi-layered resist LAR1 shown in FIGS. 25 and 26 among the above-mentioned steps of the manufacturing method. For convenience, FIGS. 30 to 35 indicate some of the same components by reference numerals different from those of FIGS. 22 to 29. Further, for easy understanding, FIGS. 30 to 35 show the film for the mask (mask layer) which is thicker than that shown in each of FIGS. 22 to 29. FIG. 30 indicates the same step as that shown in FIG. 25.

Figure 31:
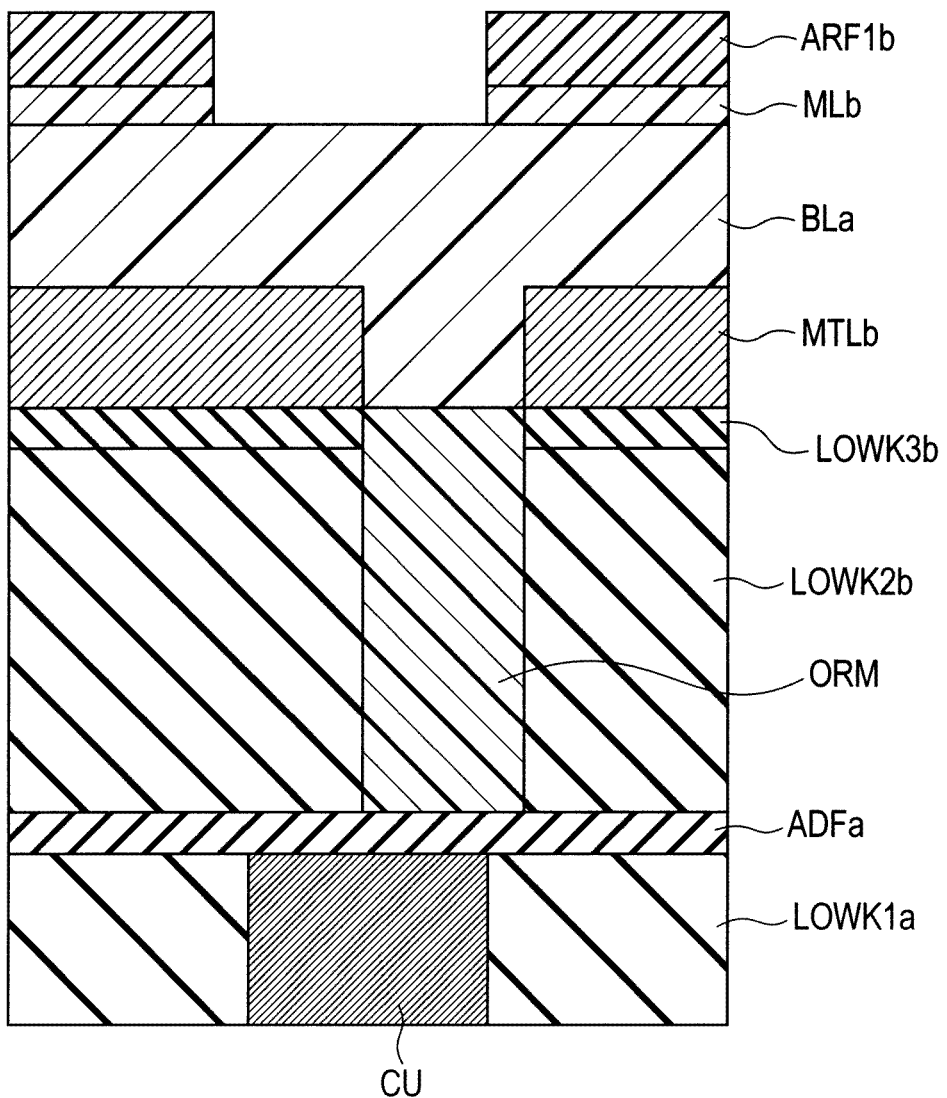
FIG. 31 is a schematic cross-sectional view showing a step corresponding to FIG. 12 in the third embodiment.
Figure 32:
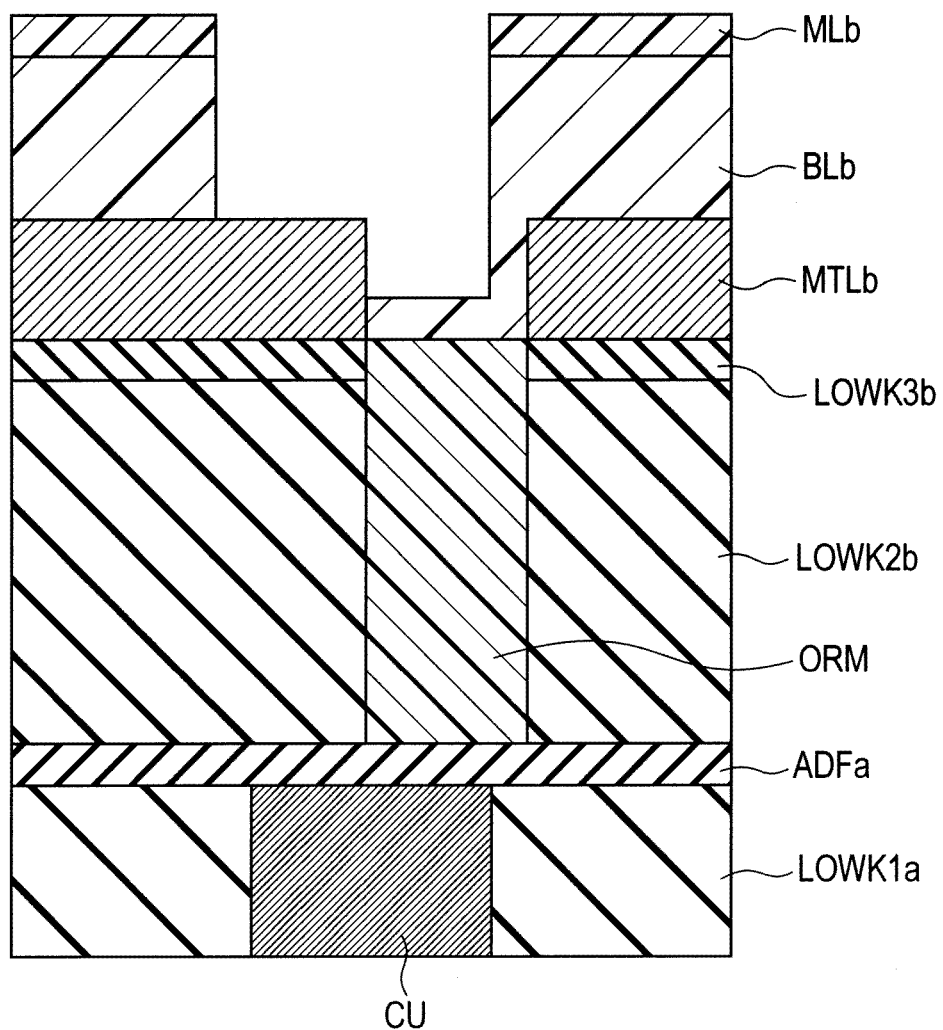
FIG. 32 is a schematic cross-sectional view showing a step corresponding to FIG. 13 in the third embodiment.

As shown in FIG. 31, the intermediate layer resist MLb is formed in the same way as the first embodiment shown in FIG. 12. As shown in FIG. 32, the lower layer resist BLb is formed with the upper layer resist ARF1b removed in the same way as the first embodiment shown in FIG. 13.

Figure 33:
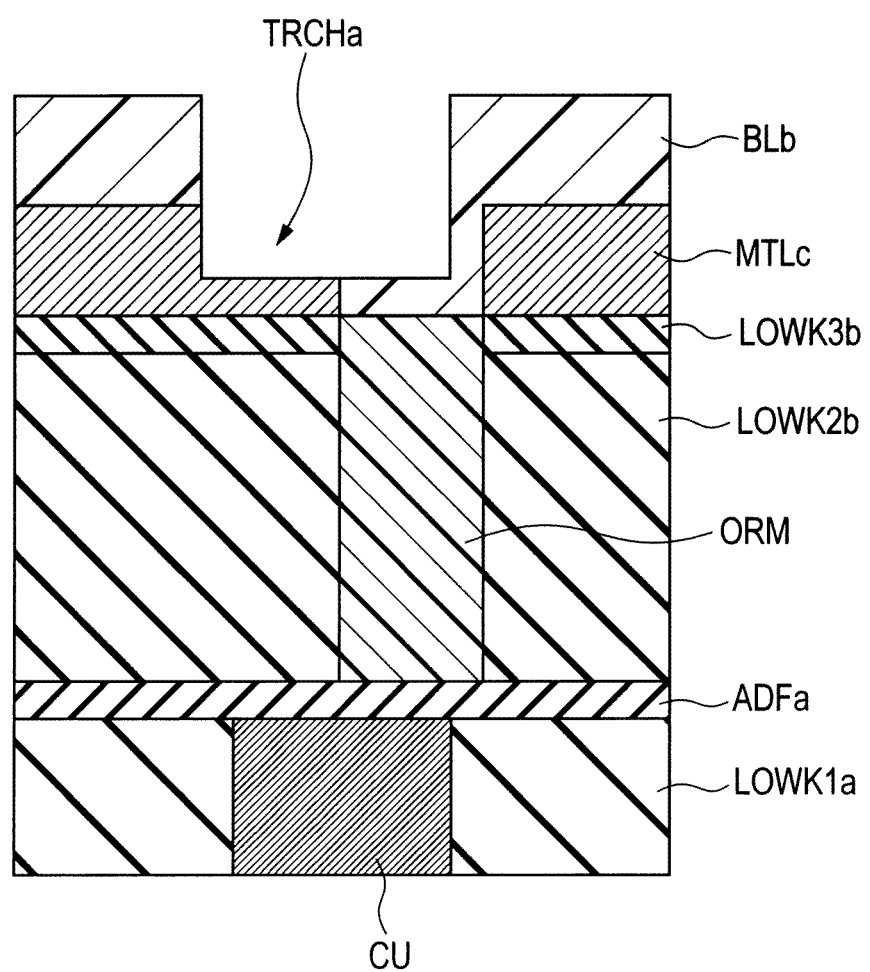
FIG. 33 is a schematic cross-sectional view showing a step corresponding to FIG. 14 in the third embodiment.

Then, referring to FIG. 33, the film MTLb for the mask is patterned using the lower layer resist BLb (patterned in the shape of the wiring trench pattern TRCHa) as a mask to become a film MTLc for the mask.

This step corresponds to the step (first step) of the first embodiment shown in FIG. 14. Since the intermediate layer resist MLb is comprised of $SiO_2$-based material and the film MTLb for the mask is comprised of a metal film, the etching selectivity therebetween is high. Specifically, the etching selectivity between the intermediate layer resist MLb and the film MTLb for the mask is 10 or more.

Thus, the film for the mask is shown to be slightly etched into the film MTLc for the mask in FIG. 33, but is not actually etched at all. This embodiment differs from the first embodiment in this point.

Figure 34:
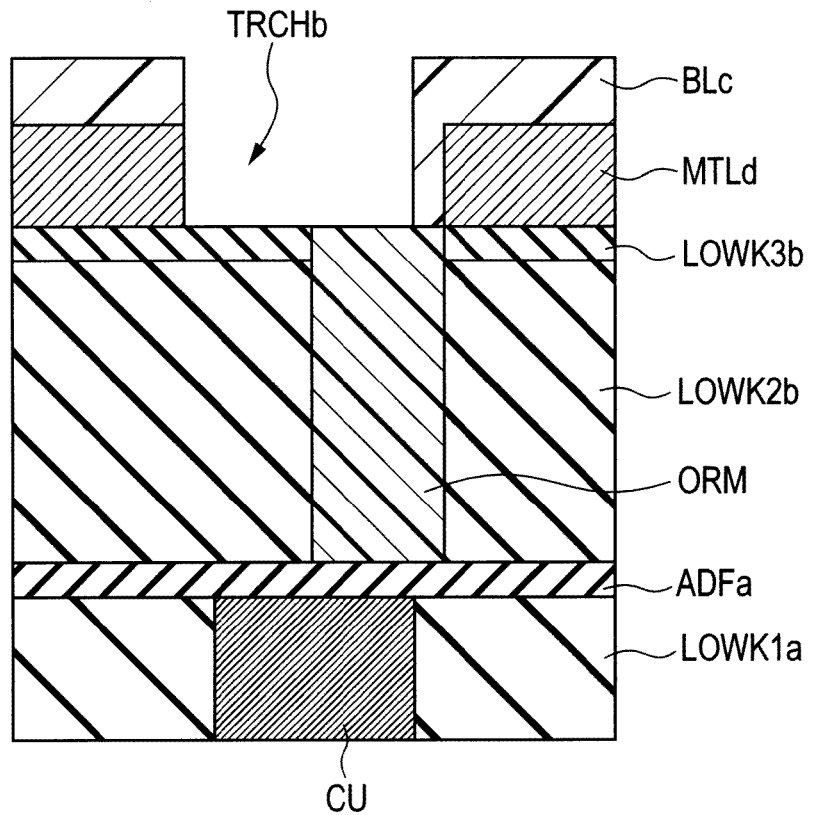
FIG. 34 is a schematic cross-sectional view showing a step corresponding to FIG. 15 in the third embodiment.

Also, in this embodiment, like the first embodiment, in the step of patterning the film MTLb for the mask, the film MTLb for the mask is finally converted into a mask layer MTLd shown in FIG. 34 through the film MTLc for the mask shown in FIG. 33. The third low dielectric constant film LOWK3b is exposed at the bottom of the wiring trench pattern TRCHb.

The process of forming the mask layer MTLd (wiring trench pattern TRCHb) is divided into two steps. Specifically, this process is divided into a first step of etching a part of the film MTLb for the mask using a first gas into the film MTLc for the mask, while removing the intermediate layer resist MLb so as to expose the lower layer resist BLb as the uppermost surface, and a second step of removing a part of the film MTc for the mask using a second gas different from the first gas to thereby expose a third low dielectric constant film LOWK3b.

That is, FIG. 33 indicates the above first step, and FIG. 34 indicates the above second step. The first gas used for etching in the first step is preferably an etchant gas containing phlorocarbon gas with a relatively low carbon ratio, for example, $CF_4$, $CHF_3$, or the like. More specifically, the first gas is a mixed gas of, for example, $CF_4/CHF_3/N_2/Ar$.

In the above step, the intermediate layer resist MLb is preferably removed completely. As mentioned above, the residue of the intermediate layer resist MLb acts as a mask in the post-processing step, which may result in failures of the shape of the pattern formed.

On the other hand, the second gas used for the etching in the above second step is preferably a halogen-based gas containing chlorine or bromine, for example, $Cl_2$, $BCl_3$, HBr, or the like. The use of this etchant gas increases the etching selectivity between the film MTLc for the mask, which is a metal film, and the low dielectric constant film thereunder. This can provide the high selectivity between the metal material and the third low dielectric constant film LOWK3b thereunder.

In the above step, any other gas, such as oxygen, nitrogen, hydrogen, or rare gas, for example, Ar (argon), He (helium), Xe (xenon), or the like, may be added to the first gas or second gas described above.

Figure 35:
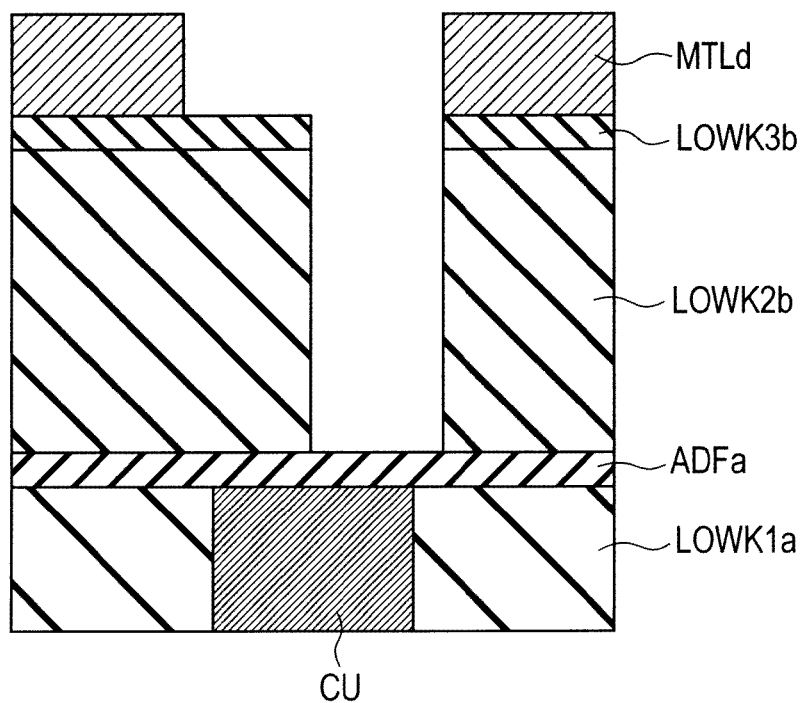
FIG. 35 is a schematic cross-sectional view showing a step corresponding to FIG. 16 in the third embodiment.

FIG. 35 shows the step of removing the lower layer resist BLb by ashing in the same way as that shown in FIG. 27.

The structure of this embodiment is substantially the same as that of the first embodiment except for the above point, and thus a description thereof will not be repeated below. Also, in this embodiment, the third low dielectric constant film may not be removed by the CMP, like the second embodiment.

Now, the operation and effects of this embodiment will be described below. This embodiment has the following effects in addition to stabilization of electrical characteristics, including suppression of variations in depth of the wiring trench, and suppression of damages on the inner surface of the wiring trench by ashing, which are the effects of the first embodiment.

Like this embodiment, the use of the mask layer made of the metal film instead of an insulating layer hardly etches the film MTLb for the mask in the process (first step) of removing the intermediate layer resist MLb. Also, in the step of forming the wiring trench TRCH and the via hole VIA using the mask layer MTLc (see FIG. 28), the selectivity between the mask layer MTLc and the second low dielectric constant film LOWK2c is high, so that the mask layer MTLc is hardly etched, and that the thickness of the mask layer MTLc is hardly changed. This is because the etching selectivity between the second low dielectric constant film LOWK2c and the diffusion preventing film ADFa, and the mask layer MTLc is very high (of about 30 or more).

In contrast, in use of the insulating layer comprised of $SiO_2$ or the like as the mask layer like the first embodiment, not only the low dielectric constant film, but also the mask layer can be simultaneously etched in the step of forming the wiring trench TRCH or via hole VIA using the mask layer as a mask (see FIG. 9). That is, a part of the mask layer falls, which can cause the abnormal failures in the size or shape of the wiring trench TRCH or via hole VIA formed. This is because the etching selectivity between the mask layer and the low dielectric constant film is low.

In other words, the use of the metal film as the mask layer suppresses the deformation of the mask layer in processing the mask layer as a mask in the post-processing step. Thus, the electrical characteristics of the formed wiring trench TRCH, the via hole VIA, and the copper wiring using the same can be further stabilized.

The mask layer comprised of the metal film is hardly etched together with the low dielectric constant film as described above. Thus, the mask layer of the metal film can be thinner than a mask layer comprised of an insulating layer (made of $SiO_2$).

The third embodiment of the invention differs from the first embodiment only in the above respective points. That is, the structure, conditions, procedure, effects, and the like not mentioned above in the third embodiment are in conformance to those in the first embodiment.

(Fourth Embodiment)

This embodiment differs from the first embodiment in order of forming the pattern. A manufacturing method of this embodiment will be described below.

In the first to third embodiments, for example, as shown in FIGS. 3 and 4, first, the via hole pattern VIAa is formed using the second resist mask (multi-layered resist LAR2), and then the wiring trench pattern TRCHa is formed using the first resist mask (multi-layered resist LAR1) as shown in FIGS. 6 to 7.

On the other hand, in the fourth embodiment, first, after forming the wiring trench pattern TRCHa using the first resist mask (multi-layered resist LAR1), the via hole pattern VIAa is formed using the second resist mask (multi-layered resist LAR2). Thus, the order of execution of the steps of forming the multi-layered wiring structure may be changed.

Figure 36:
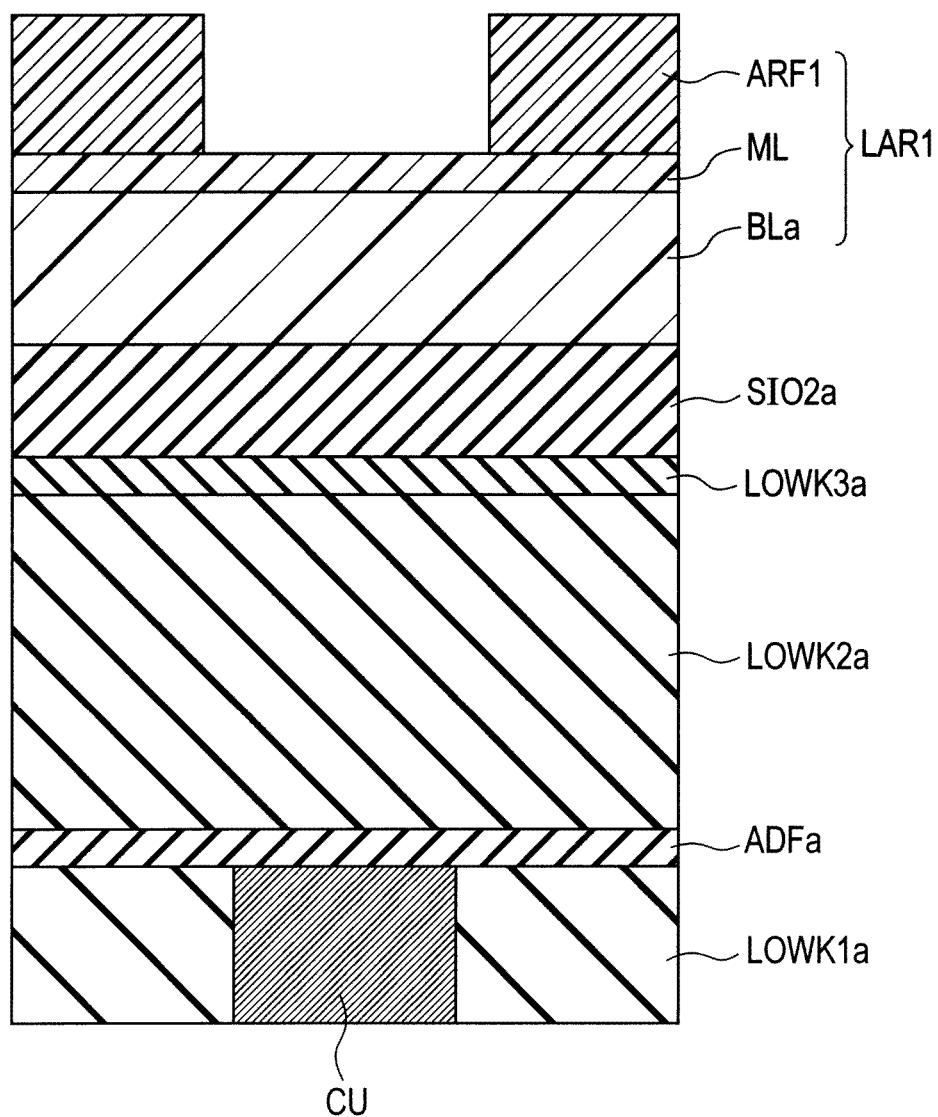
FIG. 36 is a schematic cross-sectional view showing a first step in a manufacturing method of a multi-layered wiring structure according to a fourth embodiment of the invention.

Specifically, as shown in FIG. 36, first, a first resist mask (multi-layered resist LAR1) is applied over the film SIO2a for the mask of the laminated structure comprised of the first low dielectric constant film LOWK1a, the diffusion preventing film ADFa, the second low dielectric constant film LOWK2a, the third low dielectric constant film LOWK3a, and the film SiO2a for the mask like the third embodiment. Then, a part of only the upper layer resist ARF1, which is located in the same region as the wiring trench pattern viewed in the planar manner, is patterned by exposure and development as the photoengraving technology in the same way as FIG. 6.

That is, the step shown in FIG. 36 differs from the step shown in FIG. 3 in that the multi-layered resist LAR1 is formed instead of the multi-layered resist LAR2, and that the part of the upper layer resist ARF1 located in the same region as the wiring trench pattern as viewed in the planar manner is patterned.

Figure 37:
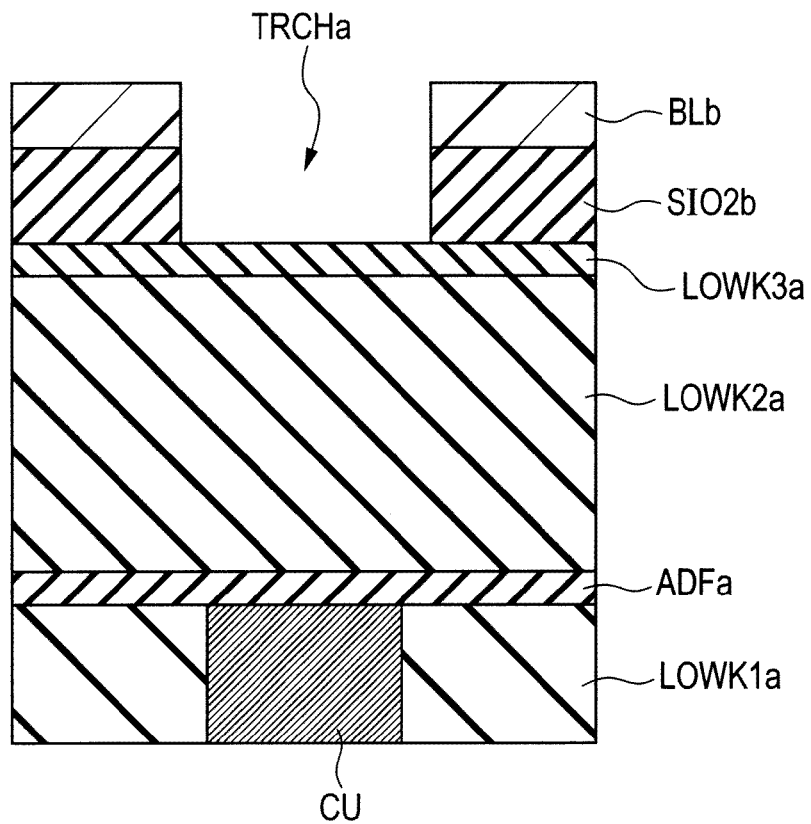
FIG. 37 is a schematic cross-sectional view showing a second step in the manufacturing method of a multi-layered wiring structure in the fourth embodiment.

Then, referring to FIG. 37, the multi-layered resist LAR1 and the film SIO2b for the mask are etched using the pattern formed only in the upper layer resist ARF1 as a mask as shown in FIG. 36. In this way, the wiring trench pattern TRCHa shown in FIG. 37 is formed.

The process shown in FIG. 37 is the same as that shown in FIG. 7. Here, the same procedure as that shown in FIGS. 11 to 15 is preferably performed as mentioned above. In this process, the film SIO2a for the mask is etched to form the mask layer SIO2b. The formation of the wiring trench pattern TRCHa exposes the third low dielectric constant film LOWK3a as the uppermost surface.

Figure 38:
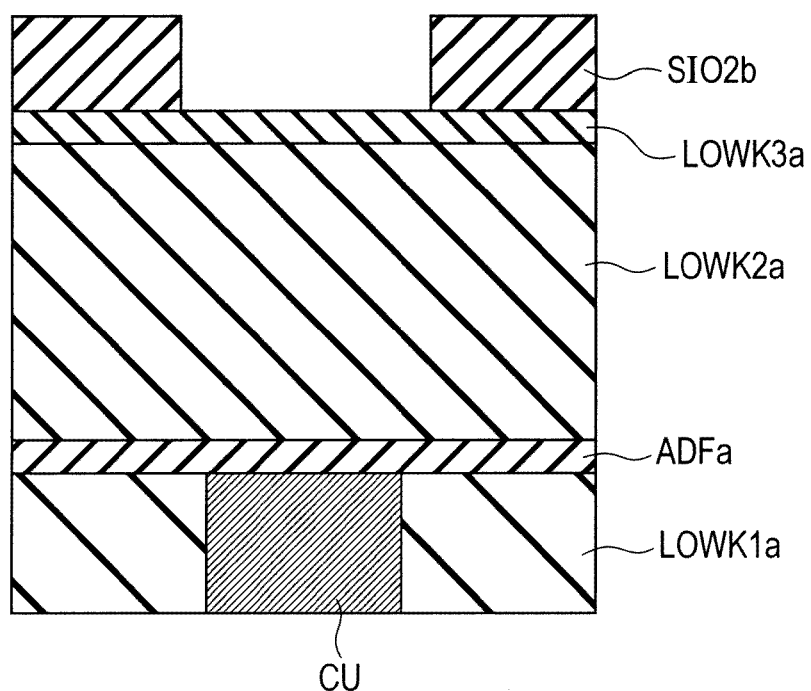
FIG. 38 is a schematic cross-sectional view showing a third step in the manufacturing method of a multi-layered wiring structure in the fourth embodiment.

Then, as shown in FIG. 38, the lower layer resist BLb is removed by ashing in the same way as that shown in FIG. 8.

Figure 39:
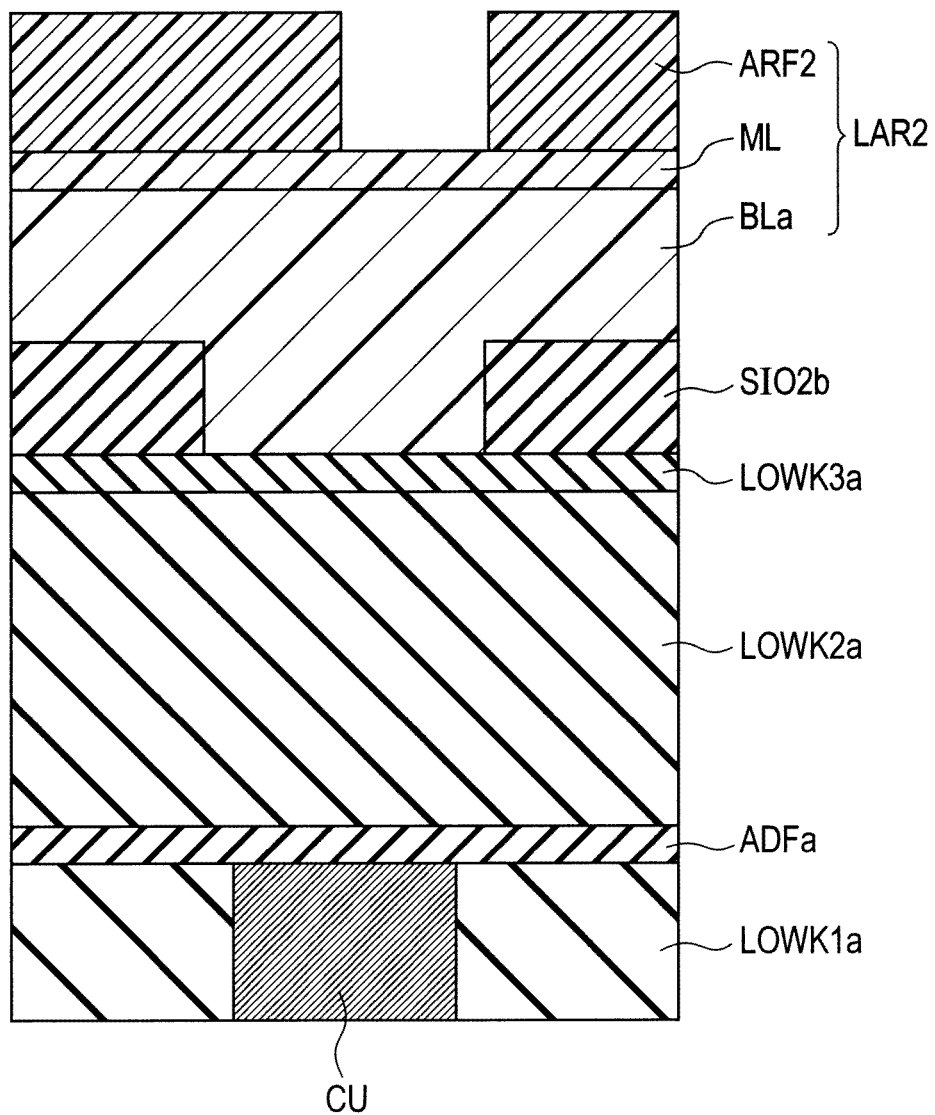
FIG. 39 is a schematic cross-sectional view showing a fourth step in the manufacturing method of a multi-layered wiring structure in the fourth embodiment.
Figure 40:
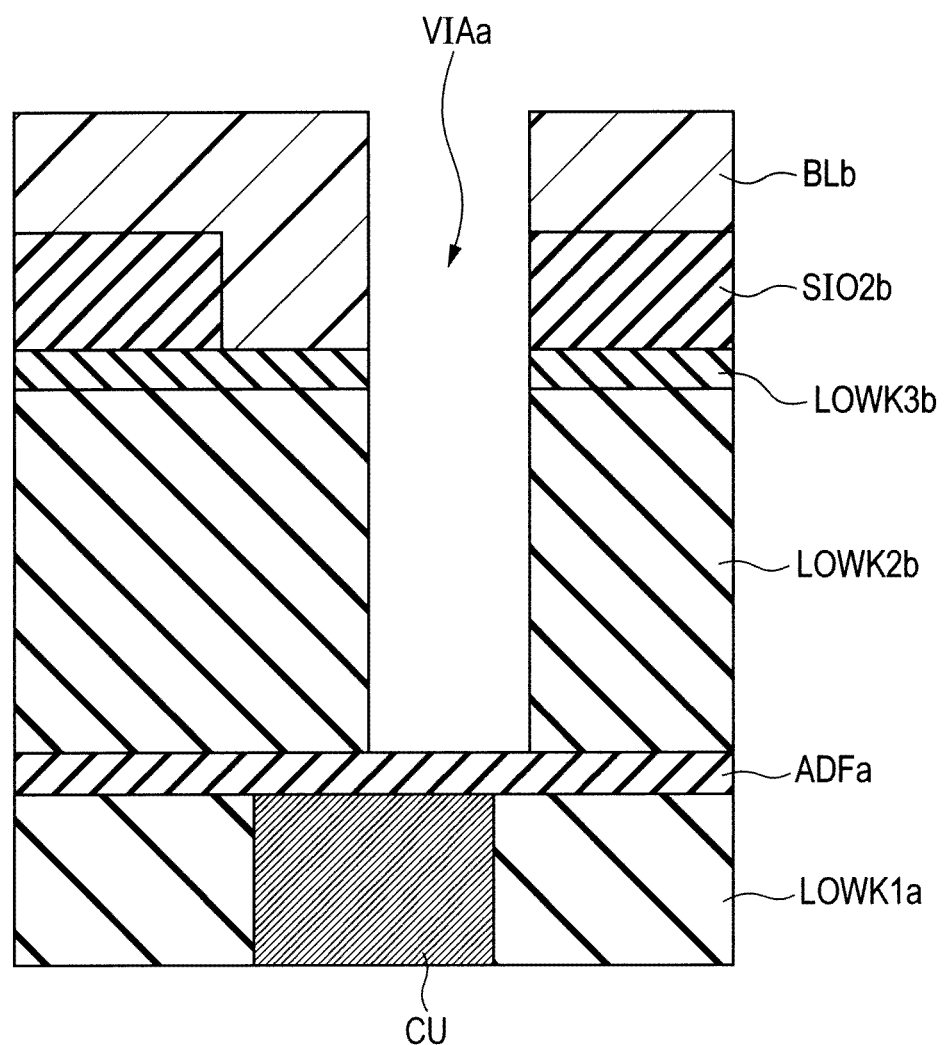
FIG. 40 is a schematic cross-sectional view showing a fifth step in the manufacturing method of a multi-layered wiring structure in the fourth embodiment.

As mentioned above, after removing the multi-layered resist LAR1 (first resist mask), the multi-layered resist LAR2 (second resist mask) is formed as shown in FIG. 39, and the via hole pattern VIAa is formed as shown in FIG. 40.

Specifically, referring to FIGS. 39 and 40, only the part of the upper layer resist ARF2 located in the same region as the via hole pattern as viewed in the planar manner is first patterned in the same way as that shown in FIG. 3. The via hole VIAa is formed using the upper layer resist ARF2 pattern as a mask in such a position as to be superimposed on the copper wiring Cu in the first low dielectric constant film LOWK1a as viewed in the planar manner. The via hole VIAa extends downward from the multi-layered resist LAR2 and the mask layer SIO2b to reach the diffusion preventing film ADFa.

The above etching for forming the via hole pattern VIAa is preferably performed using a mixed gas, for example, $C_4F_8$/$N_2$/Ar.

Figure 41:
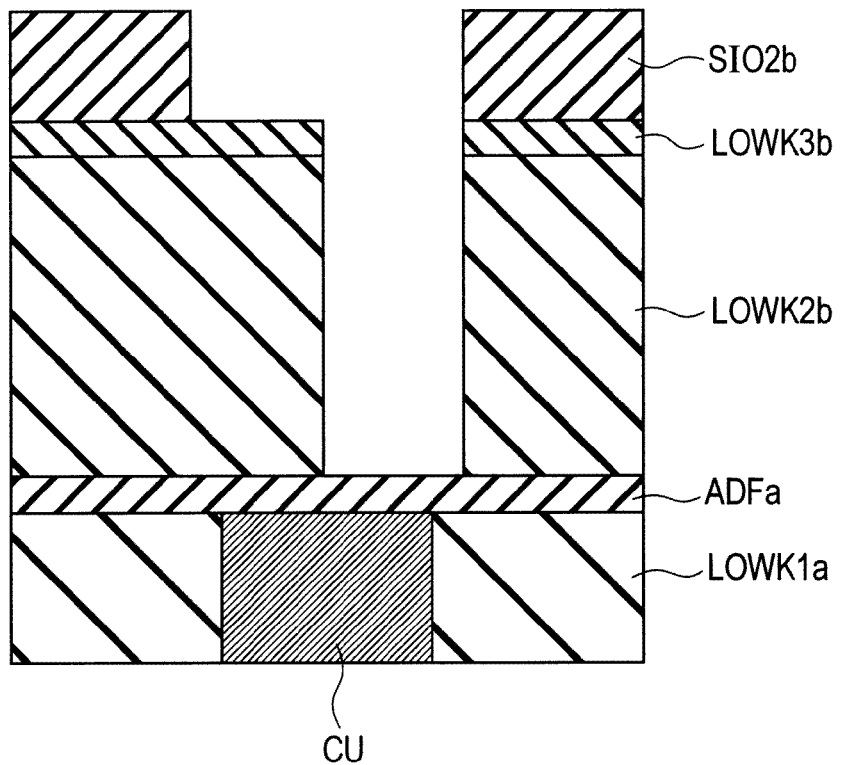
FIG. 41 is a schematic cross-sectional view showing a sixth step in the manufacturing method of a multi-layered wiring structure in the fourth embodiment.

Then, referring to FIG. 41, the second resist (lower layer resist BLb) used for forming the via hole pattern VIAa is removed by ashing. A region except for the via hole pattern VIAa of the wiring trench pattern TRCHa as viewed in the planar manner has the bottom surface comprised of the third low dielectric constant film LOWK3b (where the third low dielectric constant film LOWK3b is exposed).

Figure 42:
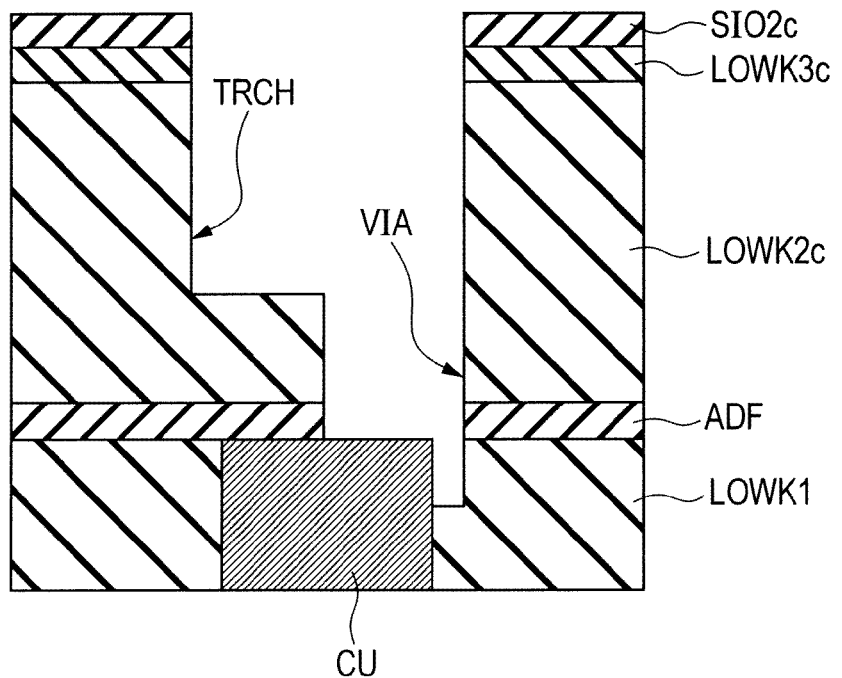
FIG. 42 is a schematic cross-sectional view showing a seventh step in the manufacturing method of a multi-layered wiring structure in the fourth embodiment.

Referring to FIG. 42, the wiring trench TRCH and the via hole VIA are formed using the mask layer SIO2b as a mask by the etching in the same way as that shown in FIG. 9. The mask layer SIO2b is also subjected to the post-processing step in the same way as that shown in FIG. 10 of the first embodiment, so that the same kind of multi-layered wiring structure as that shown in FIG. 2 is finally formed. Also, in this embodiment, the third low dielectric constant film does not need to be removed by the CMP like the second embodiment.

The structure of this embodiment is substantially the same as that of the first embodiment except for the above point, and thus a description thereof will not be repeated below.

The operation and effects of this embodiment will be described below. This embodiment has the following effects in addition to stabilization of the electrical characteristics, including suppression of variations in depth of the wiring trench, and suppression of damages on the inner surface of the wiring trench in asking.

In this embodiment, the wiring trench pattern TRCHa is formed prior to the via hole pattern VIAa. The wiring trench pattern TRCHa has its bottom comprised of the third low dielectric constant film LOWK3a.

Thereafter, the via hole pattern VIAa is formed, and then the via trench pattern TRCHa and the via hole pattern VIAa are etched to form the wiring trench TRCH or the via hole VIA, whereby the second low dielectric constant film LOWK2b is not exposed at the inner wall and bottom of the wiring trench pattern TRCHa. This arrangement can suppress the damage on the bottom and inner wall of the wiring trench pattern TRCHa due to the plasma in asking of the first resist mask and the second resist mask (lower layer resist BLb).

Also, in this embodiment, variations in depth of the wiring trench pattern TRCHa are suppressed, like the first embodiment. This is because the etching for forming the wiring trench pattern TRCHa is stopped by the third low dielectric constant film, which can suppress variations in depth of the wiring trench pattern TRCHa due to the variations in amount of etching.

The fourth embodiment of the invention differs from the first embodiment only in the above respective points. That is, the structure, conditions, procedure, effects, and the like not mentioned above in the fourth embodiment are in conformance to those in the first embodiment.

(Fifth Embodiment)

This embodiment differs from the third embodiment in the first resist mask (resist mask for forming the wiring trench pattern). A manufacturing method of this embodiment will be described below.

In the first to fourth embodiments, for example, the multi-layered resist LAR1 or LAR2 comprised of three layers, namely, the lower layer resist, the intermediate layer resist, and the upper layer resist, is used for all of the first resist mask, and the second resist mask. This is based on the following reason. If one single-layer resist is used to form a mask layer by etching a film for a mask comprised of $SiO_2$ in forming the fine multi-layered wiring structure like the invention, the thick film for the mask can make it difficult to perform a desired process because the resist is removed before the completion of the etching.

The use of a multi-layered resist of a plurality of layers increases the total thickness of the resist to improve the resistance of the resist, thus facilitating etching of the thick multi-layered resist comprised of thin films. As mentioned in the respective embodiments, when the respective layers forming the multi-layered resist are comprised of different materials, the respective layers have different functions to enable precise control of etching of the film for the mask.

The use of the multi-layered resist can easily suppress the reflection of light from below the multi-layered resist in etching using the photoengraving technology.

As mentioned above, the film for the mask comprised of a metal film, however, is thin as compared to a film for a mask comprised of $SiO_2$. The etching selectivity between the resist and the film for the mask comprised of the metal film is higher than that between the resist and the film for the mask comprised of $SiO_2$. Thus, a single-layered resist may be used in etching the film for the mask comprised of the metal film.

Figure 43:
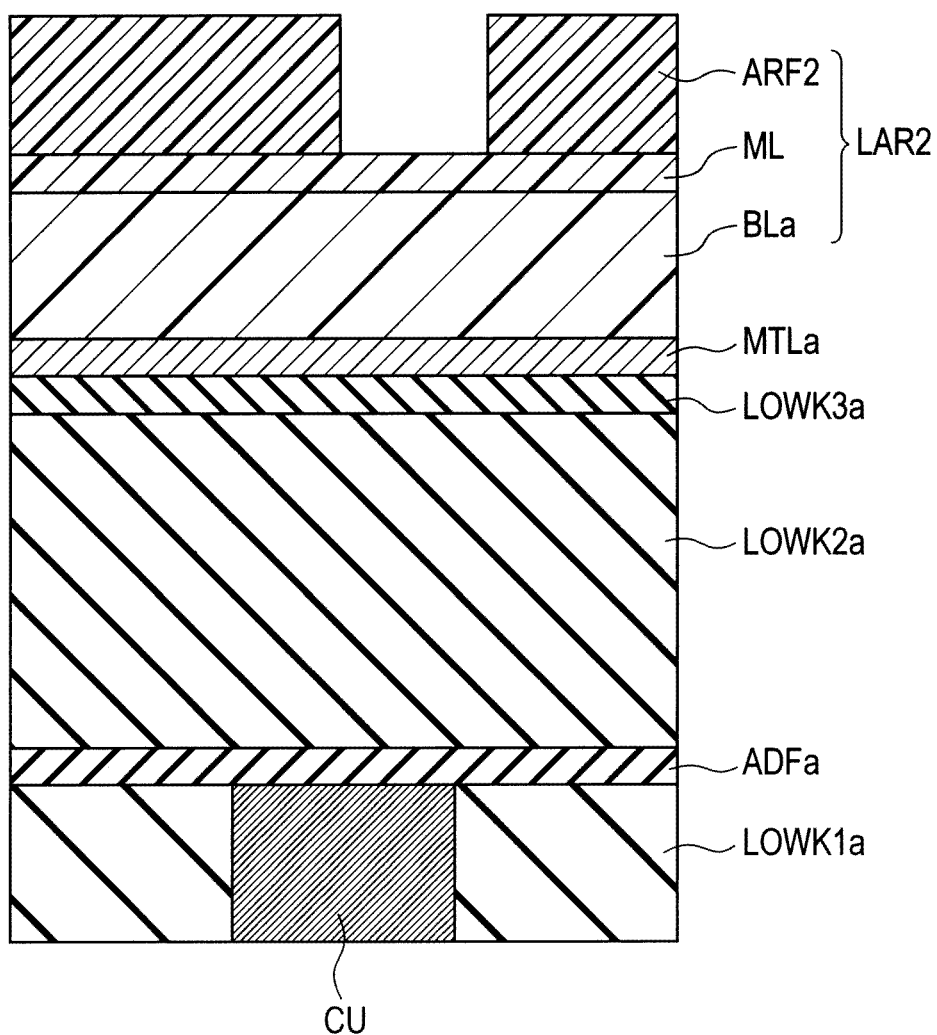
FIG. 43 is a schematic cross-sectional view showing a first step in a manufacturing method of a multi-layered wiring structure in a fifth embodiment of the invention.
Figure 44:
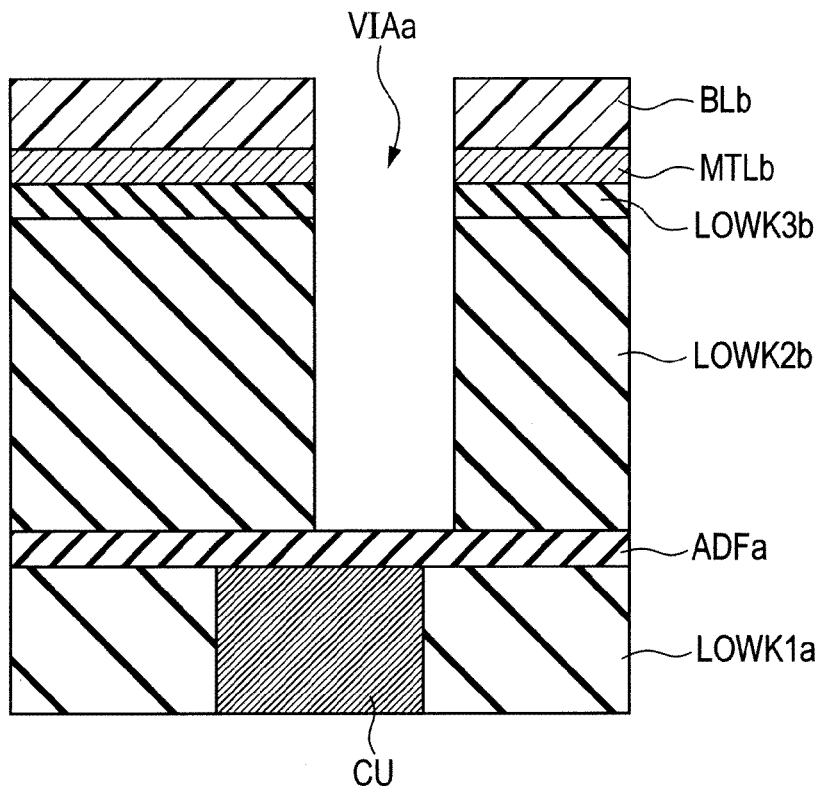
FIG. 44 is a schematic cross-sectional view showing a second step in the manufacturing method of a multi-layered wiring structure in the fifth embodiment.
Figure 45:
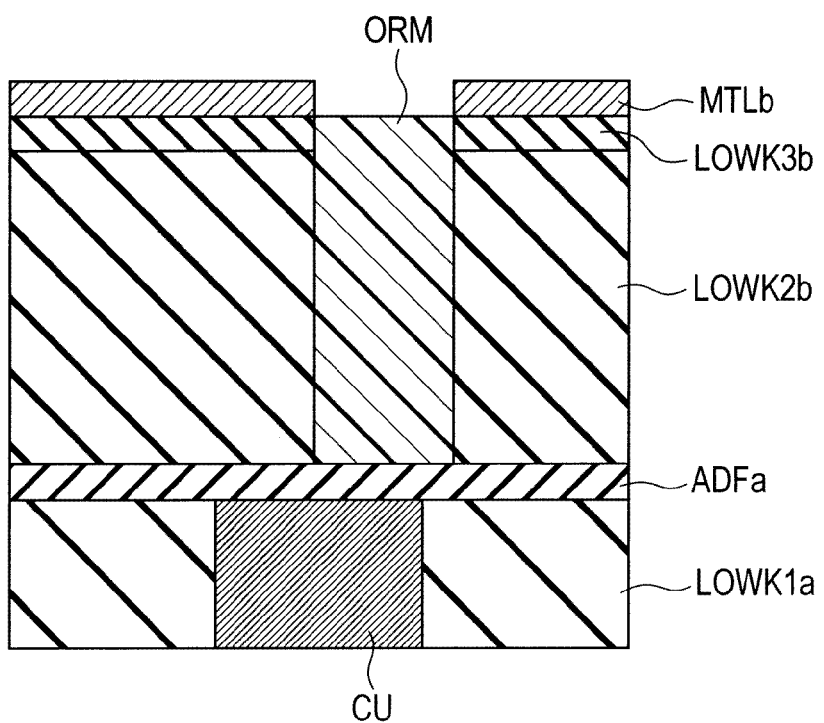
FIG. 45 is a schematic cross-sectional view showing a third step in the manufacturing method of a multi-layered wiring structure in the fifth embodiment.

Specifically, for example, when the via hole pattern VIAa is formed prior to the wiring trench pattern TRCHa in the same way as the third embodiment, the via hole pattern VIAa is first formed with reference to FIGS. 43 to 45. FIGS. 43 to 45 show the same procedure as that shown in FIGS. 22 to 24.

In this case, the multi-layered resist LAR2 is used to form the via hole pattern VIAa. However, the following single-layer resist may be used to form the via hole pattern VIAa.

In particular, when the thickness of the second low dielectric constant film LOWK2a or third low dielectric constant film LOWK3a is large in forming the via hole pattern VIAa using the single-layer resist, the amount of etching such a low dielectric constant film becomes large, which can lead to an insufficient etching resistance of the single-layer resist. That is, before completion of the etching of the low dielectric constant film, the single-layered resist can be degraded or extinguished.

In such a case, failures in shape can be caused. For example, the diameter of the hole in the direction intersecting an extension direction of the formed via hole pattern VIAa is abnormally increased. For this reason, a multi-layered resist is preferably used for formation of the via hole pattern VIAa. Thus, the occurrence of the failures in shape as mentioned above can be suppressed.

The film MTLa for the mask is used as a hard mask for forming both the via hole pattern VIAa and the wiring trench pattern TRCHa in the second low dielectric constant film LOWK2 and the third low dielectric constant film LOWK3. In this case, after the via hole pattern VIAa is formed in the second low dielectric constant film LOWK2 and the third low dielectric constant film LOWK3, the wiring trench pattern TRCHa is formed in the second and third low dielectric constant films LOWK2 and LOWK3. Since the via hole pattern VIAa needs to be formed so as to penetrate the thick second low dielectric constant film LOWK2, there is the possibility that the film MTLa for the mask is etched during the formation of the via hole pattern VIAa, and cannot keep the shape as the film MTLa for the mask, which, as a result, affects the shape of the formed via hole pattern VIAa.

As shown in FIG. 45, the via hole pattern VIAa is formed, and the multi-layered resist LAR2 is removed. Then, a single-layer resist SIR1a is formed as the first resist mask over the film MTLb for the mask with reference to FIG. 46.

The single-layer resist SIR1a has a laminated structure of an upper layer resist ARF1a and a reflection preventing film BARCa made of organic material. The upper layer resist ARF1a serves as a resist layer comprised of resist material which exhibits photosensitivity by being subjected to exposure and development processes.

The reflection preventing film BARCa may be formed by coating, for example, may be deposited by a CVD method. Provision of the reflection preventing film BARCa can effectively suppress the reflection of light from a part under the single-layer resist which easily causes the above reflection as compared to the multi-layered resist.

The single-layer resist SIR1a comprised of only the upper layer resist ARF1a may be provided by an underlayer structure with the single-layer resist SIR1a formed therein without the reflection preventing film BARCa. The upper layer resist ARF1a is the commonly known resist comprised of an organic material (first organic film) which is the same as that of the upper layer resist ARF1 in the third embodiment or the like.

Figure 46:
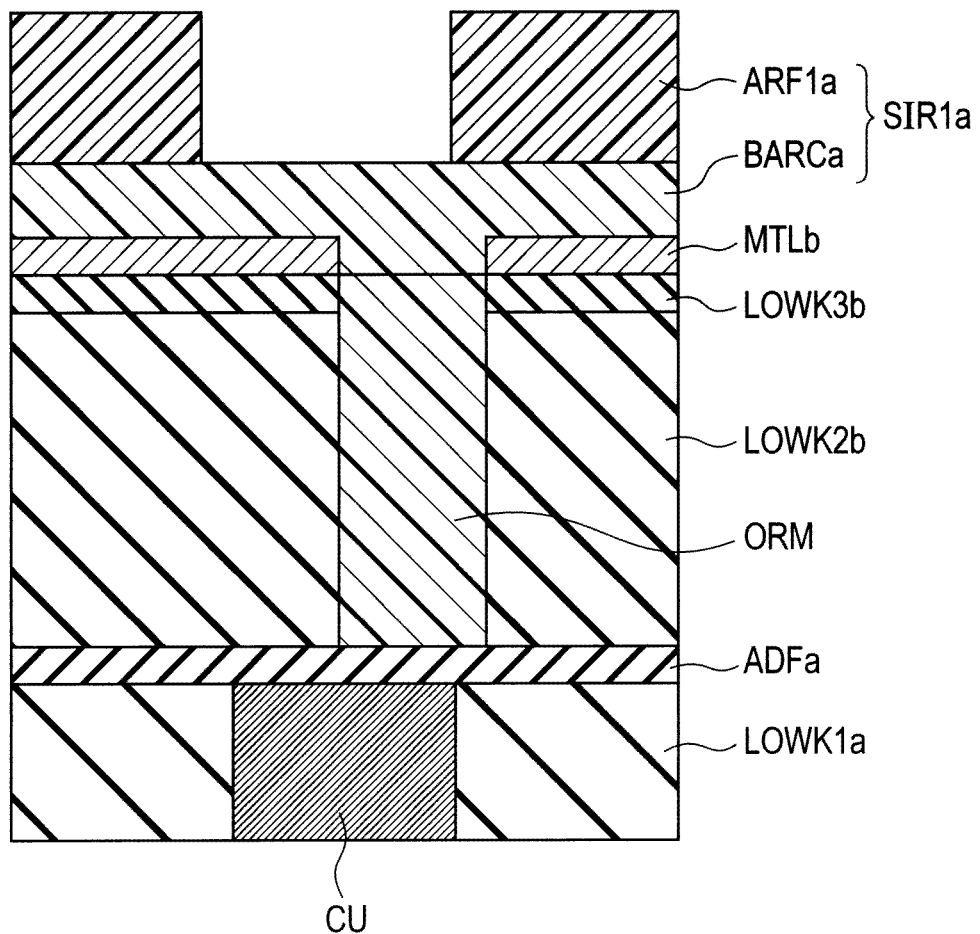
FIG. 46 is a schematic cross-sectional view showing a fourth step in the manufacturing method of a multi-layered wiring structure in the fifth embodiment.

As shown in FIG. 46, a part of only the upper layer resist ARF1a, which is located in the same region as the wiring trench pattern viewed in the planar manner, is patterned by exposure and development as the photoengraving technology.

Figure 47:
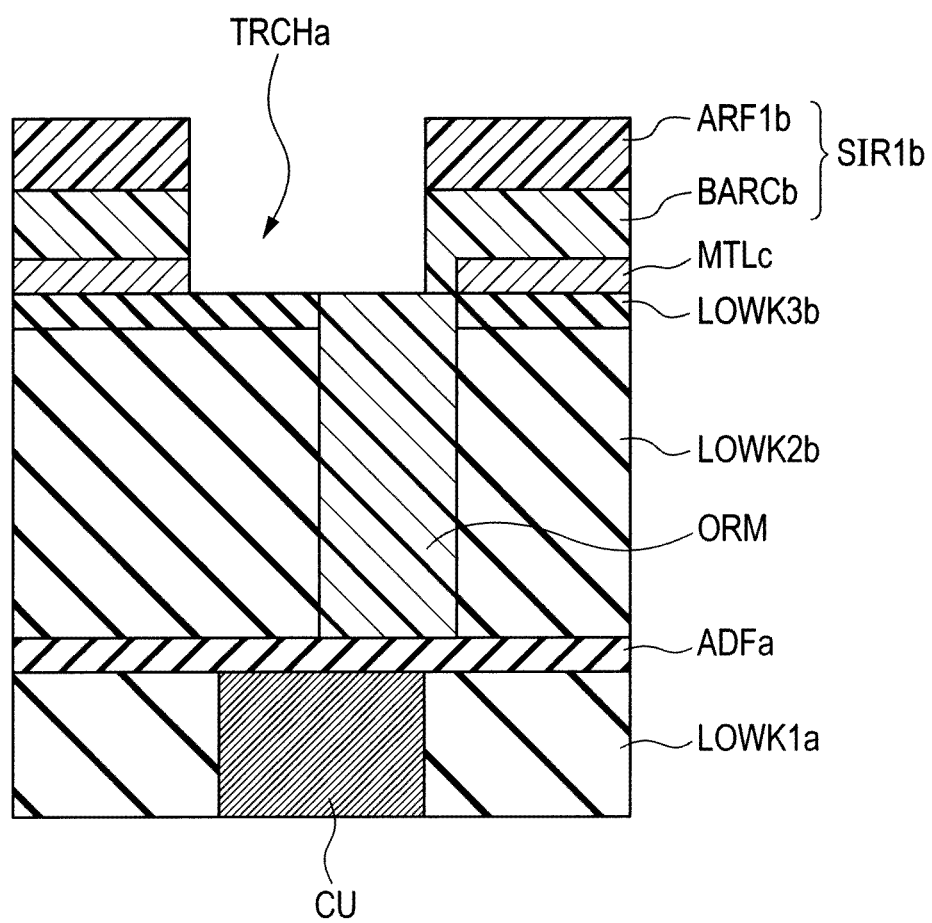
FIG. 47 is a schematic cross-sectional view showing a fifth step in the manufacturing method of a multi-layered wiring structure in the fifth embodiment.

Then, referring to FIG. 47, the reflection preventing film BARCa and the film MTLb for the mask are etched using the upper layer resist ARF1a as a mask to become a reflection preventing film BARCb and a mask layer MTLc, respectively. The upper layer resist ARF1a becomes an upper layer resist ARF1b.

In this way, the wiring trench pattern TRCHa is formed as shown in FIG. 47. The upper layer resist ARF1a becomes an upper layer resist ARF1b, and the reflection preventing film BARCa becomes a reflection preventing film BARCb.

At this time, the single-layer resist SIR1b is etched so as to expose the third low dielectric constant film LOWK3b. The wiring trench pattern TRCHa whose bottom is comprised of the third low dielectric constant film LOWK3b is preferably formed in the film MTLb for the mask.

In the etching process in the step shown in FIG. 47, for example, the reflection preventing film BARCa is preferably formed using as an etchant gas, a halogen-based gas containing chlorine or bromine, for example, $Cl_2$, $BCl_3$, HBr, or the like, like the second gas in the step of the third embodiment shown in FIG. 34. In this case, subsequently, the etching of the film MTLb for the mask directly under the reflection preventing film BARCa is also preferably performed using the above halogen-based gas as the etchant gas.

Alternatively, for example, the reflection preventing film BARCa may be subjected to etching using an etchant gas (a mixed gas of, for example, $CF_4/CHF_3/N_2/Ar$ or the like) containing phlorocarbon gas with a relatively low carbon ratio, for example, $CF_4$, $CHF_3$, or the like. The film MTLb for the mask may be subjected to the etching using the above halogen-based gas as an etchant gas.

In the above step, any other gas, such as oxygen, nitrogen, hydrogen, or rare gas, for example, Ar (argon), He (helium), Xe (xenon), or the like, may also be added to any one of the above etchant gases.

Figure 48:
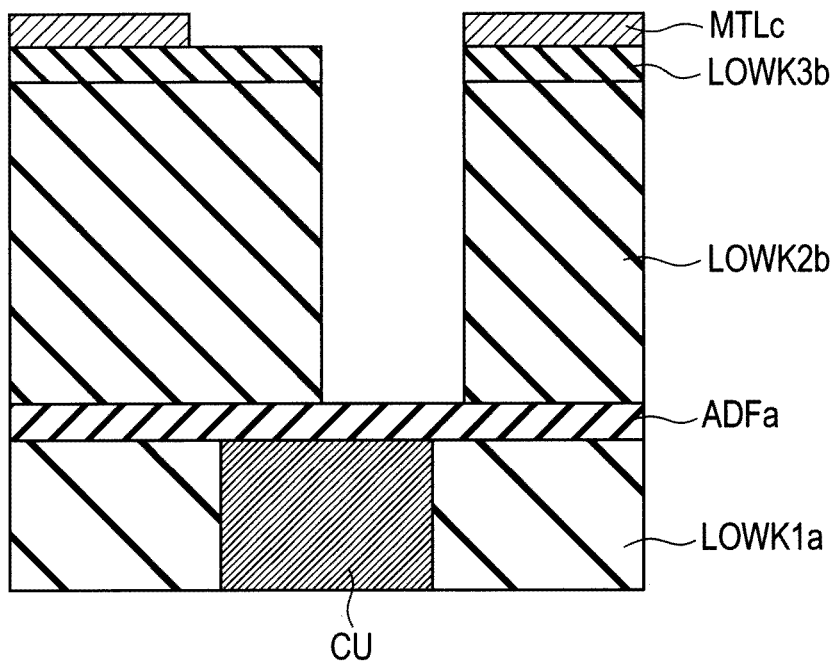
FIG. 48 is a schematic cross-sectional view showing a sixth step in the manufacturing method of a multi-layered wiring structure in the fifth embodiment.
Figure 49:
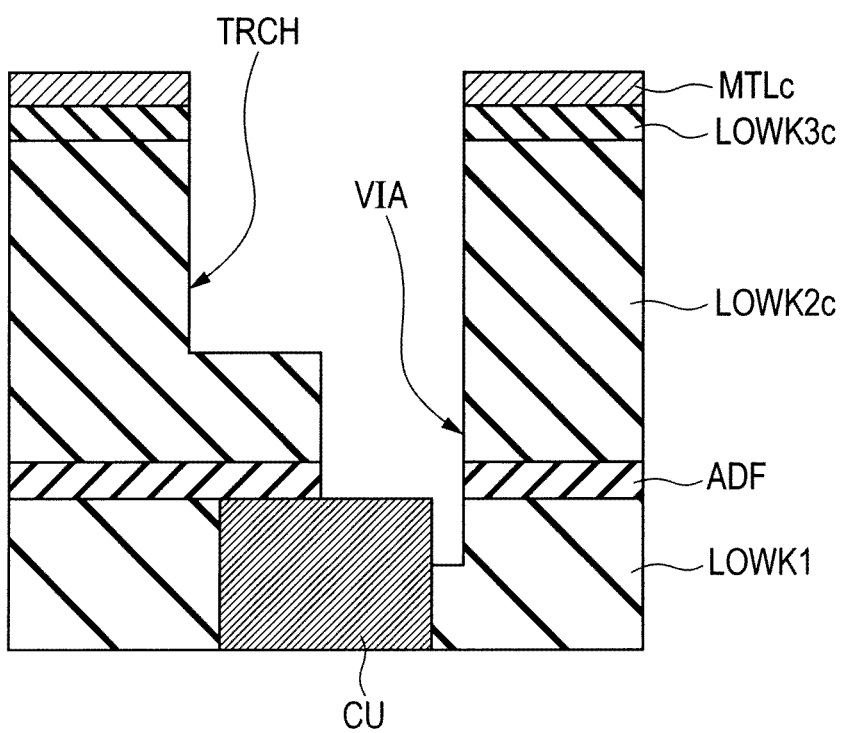
FIG. 49 is a schematic cross-sectional view showing a seventh step in the manufacturing method of a multi-layered wiring structure in the fifth embodiment.

Referring now to FIG. 48, the single-layer resist SIR1b is subjected to ashing. Then, the wiring trench TRCH and the via hole VIA are formed using the mask layer MTLc as a mask with reference to FIG. 49. These processes are the same as those shown in FIGS. 27 and 28.

The following steps of forming the wiring trench and the via hole by patterning using the above mask layer MTLc as the mask, forming the copper wiring CU, and performing CMP are performed by the same processes as those of the third embodiment, especially, shown in FIGS. 28 to 29. Thus, a description thereof will be omitted below.

By the above procedure, the multi-layered wiring structure shown in FIG. 2 is formed. Also, even when the via hole pattern is formed using the single-layer resist SIR1a, the same process is preferably performed using the same etchant gas as that used in forming the above wiring trench pattern TRCHa.

When the wiring trench pattern and the via hole pattern are formed using the single-layer resist SIR1a, the single-layer resist after formation of each pattern is preferably removed by ashing in the step shown in FIG. 48. Alternatively, any methods other than the ashing may be used to remove the single-layer resist SIR1b.

The structure of this embodiment is substantially the same as that of the third embodiment except for the above points, and thus a description thereof is not repeated. Also, in this embodiment, like the second embodiment, the third low dielectric constant film may not be removed in the CMP.

Now, the operation and effects of this embodiment will be described below. This embodiment has the following effects in addition to stabilization of electrical characteristics, including suppression of variations in depth of the wiring trench, and suppression of damages on the inner surface of the wiring trench by ashing, which are the effects of the first embodiment.

The above single-layer resist SIR1a does not contain the intermediate layer resist ML. This can reduce the possibility that after removing the single-layer resists SIR1a and SIR1b by etching, the residue of the intermediate layer resist ML is generated to induce the failure in shape of the formed pattern.

When the ashing process is used to remove the single-layer resist SIR1b, for example, the third low dielectric constant film LOWK3b is exposed at the bottom of the wiring trench pattern TRCHa shown in FIG. 48. Thus, the damage on the second low dielectric constant film LOWK2b can be surely suppressed.

When the ashing process is not used to remove the single-layer resist SIR1b, the bottom or side wall of the wiring trench pattern TRCHa is not damaged due to the ashing, which can eliminate the inconveniences, including the damages due to the ashing.

The fifth embodiment of the invention differs from the third embodiment only in the above-mentioned points. That is, all of the structure, conditions, procedure, effects, and the like not mentioned above in the fifth embodiment are in conformance to those in the third embodiment.

(Sixth Embodiment)

This embodiment differs from the fifth embodiment in order of forming the pattern. Now, a manufacturing method of this embodiment will be described below.

Like this embodiment, when the wiring trench pattern TRCHa is formed using the single-layer resist, first, the via hole pattern VIAa may be formed using the second resist mask (multi-layered resist LAR2) after forming the wiring trench pattern TRCHa using the first resist mask (single-layer resist SIR1a) in the same way as the fourth embodiment.

Figure 50:
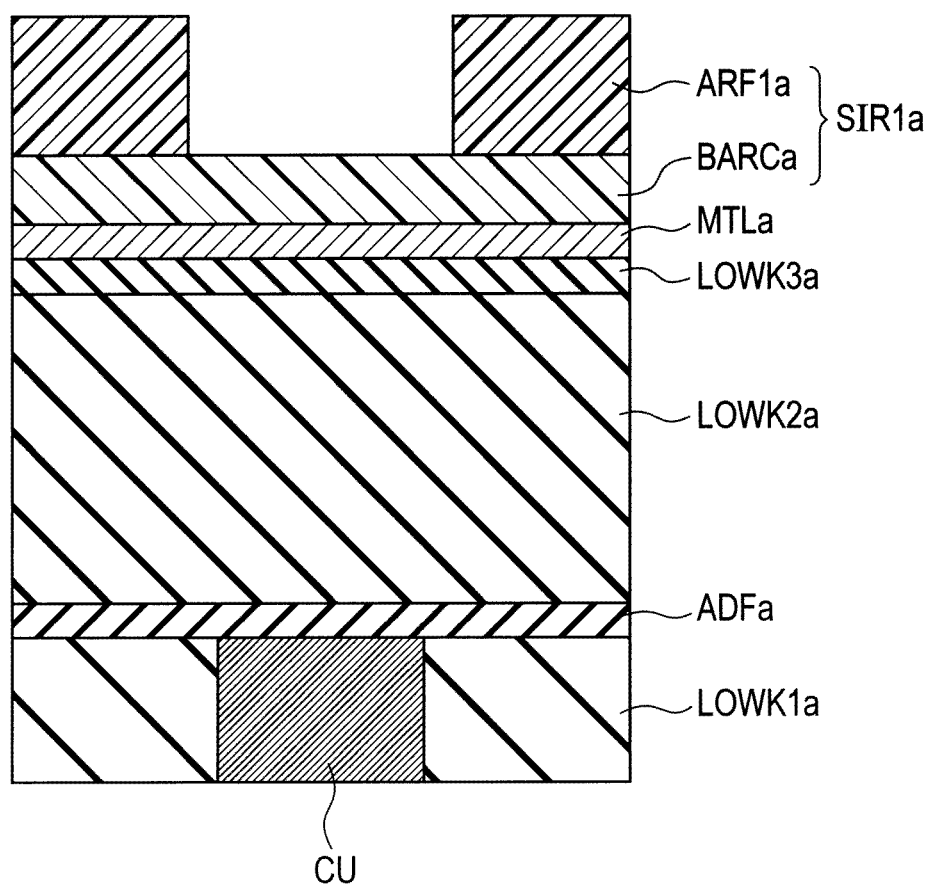
FIG. 50 is a schematic cross-sectional view showing a first step in a manufacturing method of a multi-layered wiring structure in the sixth embodiment.

Specifically, referring to FIG. 50, while the same kind of the single-layer resist SIR1a as that of the fifth embodiment is formed, a part of only the upper layer resist ARF1a, which is located in the same region as the wiring trench pattern viewed in the planar manner, is patterned by exposure and development as the photoengraving technology in the same way as that of FIG. 36.

Figure 51:
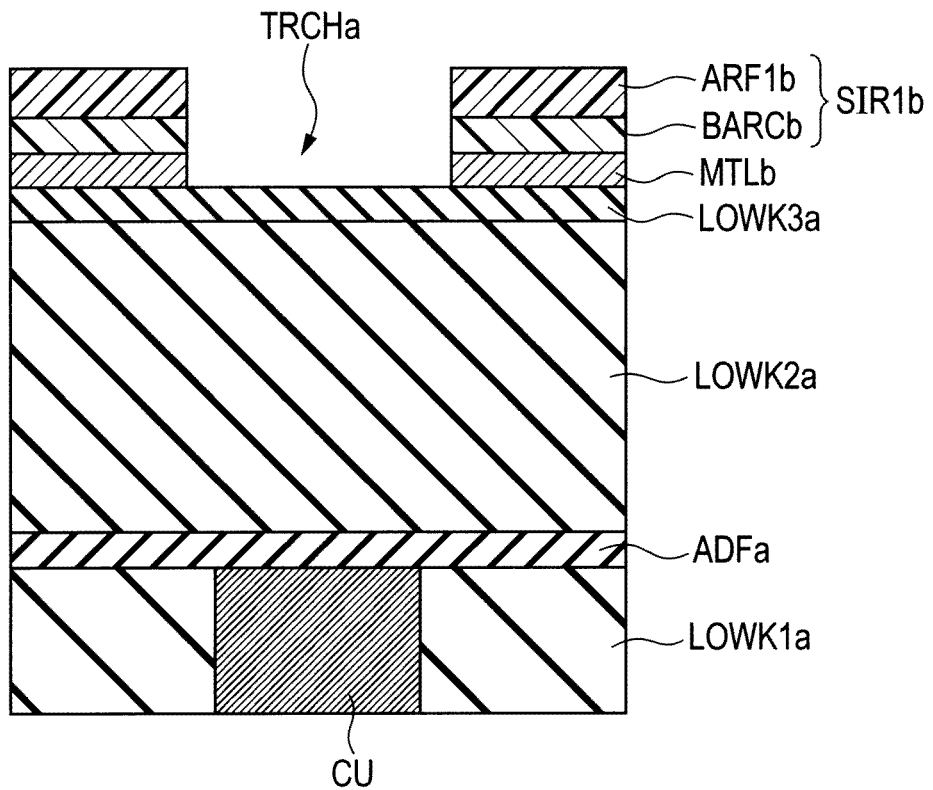
FIG. 51 is a schematic cross-sectional view showing a second step in the manufacturing method of a multi-layered wiring structure in the sixth embodiment.

Then, referring to FIG. 51, the reflection preventing film BARCa and the film MTLa for the mask are etched using the upper layer resist ARF1a as a mask to become a reflection preventing film BARCb and a mask layer MTLb, respectively. In this way, the wiring trench pattern TRCHa shown in FIG. 51 is formed. The upper layer resist ARF1a becomes an upper layer resist ARF1b, and the reflection preventing film BARCa becomes a reflection preventing film BARCb.

Figure 52:
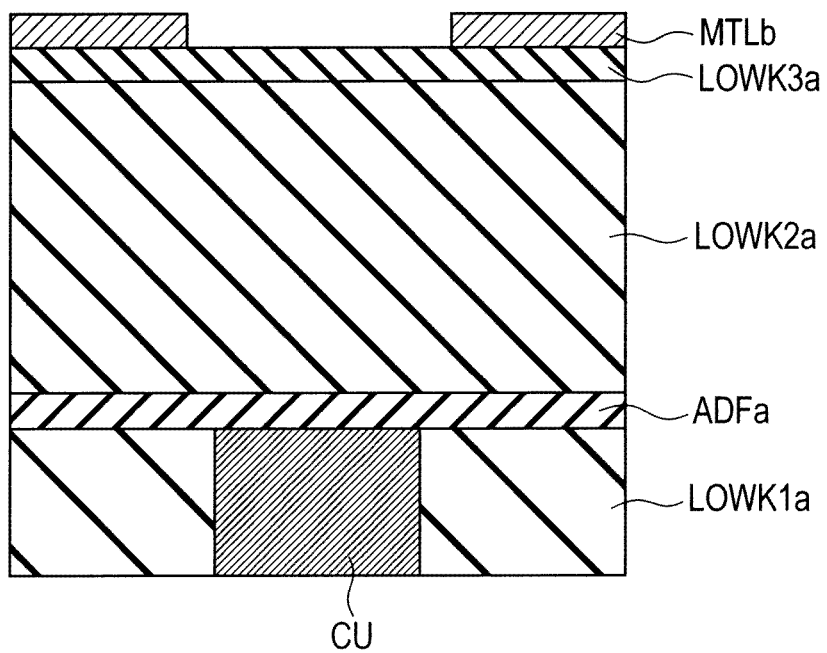
FIG. 52 is a schematic cross-sectional view showing a third step in the manufacturing method of a multi-layered wiring structure in the sixth embodiment.

Then, as shown in FIG. 52, the single-layer resist SIR1b is removed by asking. Thereafter, as shown in FIG. 53, a multi-layered resist LAR2 (second resist mask) is formed so as to form the via hole pattern.

Figure 54:
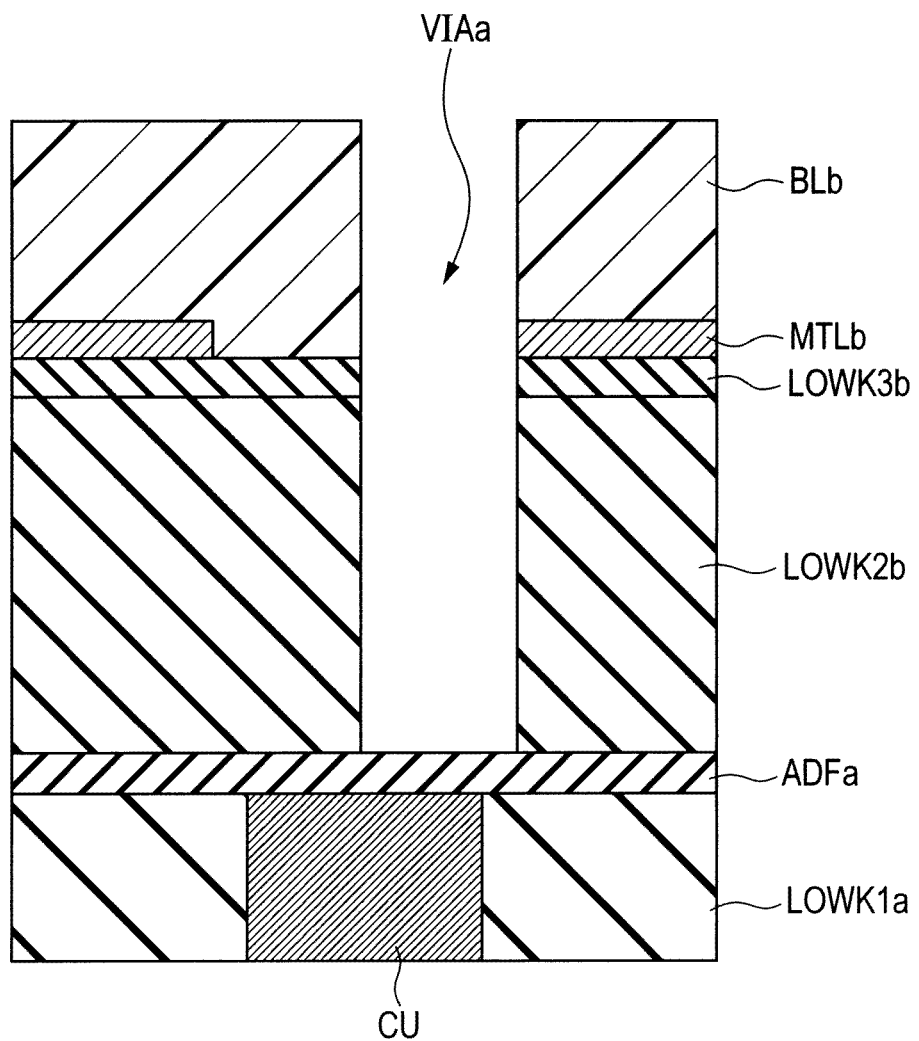
FIG. 54 is a schematic cross-sectional view showing a fifth step in the manufacturing method of a multi-layered wiring structure in the sixth embodiment.
Figure 55:
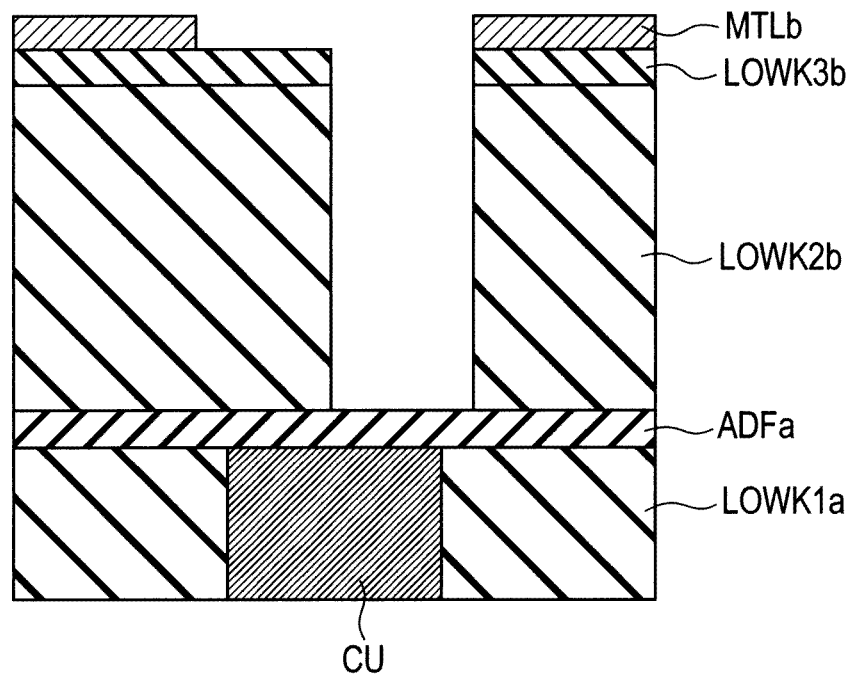
FIG. 55 is a schematic cross-sectional view showing a sixth step in the manufacturing method of a multi-layered wiring structure in the sixth embodiment.
Figure 56:
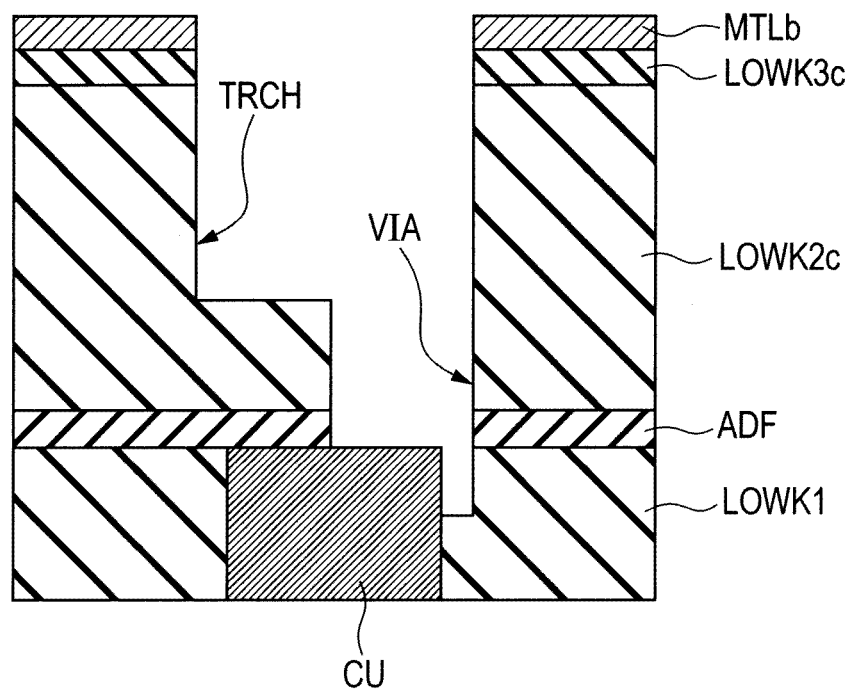
FIG. 56 is a schematic cross-sectional view showing a seventh step in the manufacturing method of a multi-layered wiring structure in the sixth embodiment.

As shown in FIGS. 54 to 56, the same processes as those shown in FIGS. 40 to 42 are performed to form the multi-layered structure shown in FIG. 2. Thus, a description and an illustration thereof will be omitted below.

Figure 53:
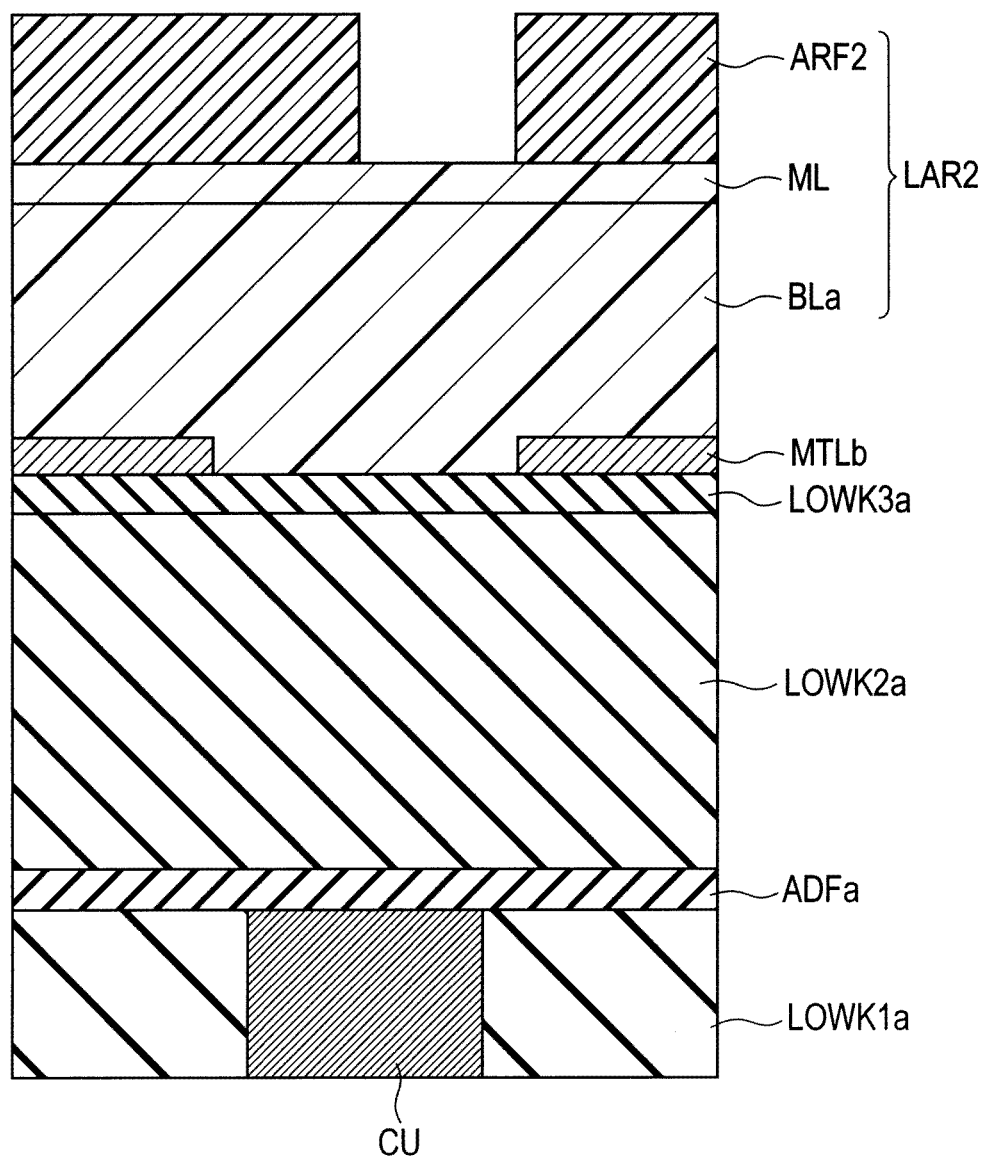
FIG. 53 is a schematic cross-sectional view showing a fourth step in the manufacturing method of a multi-layered wiring structure in the sixth embodiment.

In forming the via hole pattern, the single-layer resist SIR1a may be used instead of the multi-layered resist LAR2 shown in FIG. 53. In this case, the same process is preferably performed using the same etchant gas as that in forming the above wiring trench pattern TRCHa.

When forming the wiring trench pattern or via hole pattern using the single-layer resist SIR1a, the single-layer resist is preferably removed by ashing in the step shown in FIG. 52 after forming the respective patterns. Any methods other than the ashing may be used to remove the single-layer resist SIR1b.

The structure of this embodiment is substantially the same as that of the third embodiment except for the above points, and thus a description thereof will not be repeated. Also, in this embodiment, like the second embodiment, the third low dielectric constant film may not be removed by the CMP.

Now, the operation and effects of this embodiment will be described below. This embodiment has the following effects in addition to stabilization of electrical characteristics, including suppression of variations in depth of the wiring trench, and suppression of damages on the inner surface of the wiring trench by ashing, which are the effects of the first embodiment.

In this embodiment, the wiring trench pattern TRCa is formed prior to the via hole pattern VIAa. The wiring trench pattern TRCHa has its bottom comprised of the third low dielectric constant film LOWK3a.

Thereafter, until the via hole pattern VIAa is formed and then the wiring trench pattern TRCHa and the via hole pattern VIAa are etched to form the wiring trench TRCH and the via hole VIA, the second low dielectric constant film LOWK2b is not exposed at the inner wall and bottom of the wiring trench pattern TRCHa. This arrangement can suppress the damage on the bottom or inner wall of the wiring trench pattern TRCHa due to the plasma in ashing using the first resist mask and the second resist mask (lower layer resist BLb).

When the single-layer resist SIR1b is removed without using the ashing process, for example, the third low dielectric constant film LOWK3b cannot be exposed at the bottom of the wiring trench pattern TRCHa shown in FIG. 52. This can surely suppress the damage on the bottom or side wall of the wiring trench pattern TRCHa.

The sixth embodiment of the invention differs from the fifth embodiment only in the above respective points. That is, the structure, conditions, procedure, effects, and the like not mentioned above in the sixth embodiment are in conformance to those in the first embodiment.

The preferred embodiments disclosed herein are illustrative from all viewpoints and not limitative. The scope of the invention is represented by not the above description but the accompanying claims, and is intended to include all modifications within the spirit and scope equivalent to the accompanying claims.

The present invention provides an excellent technique with high reliability for forming a fine multi-layered wiring structure.

What is claimed is:

1. A manufacturing method of a semiconductor device, comprising the steps of:
   forming a diffusion preventing film over a semiconductor substrate so as to cover a first low dielectric constant film with a copper wiring formed therein;
   laminating a second low dielectric constant film, a third low dielectric constant film, and a film for serving as a mask layer over the diffusion preventing film in that order;
   forming the mask layer by etching the film for serving as the mask layer using a first resist mask formed over the film for serving as the mask layer so as to expose the third low dielectric constant film, and by forming a wiring trench pattern whose bottom is comprised of a surface of the third low dielectric constant film in the film for serving as the mask layer;
   removing the first resist mask by asking;
   forming a wiring trench in the second low dielectric constant film and the third low dielectric constant film using the wiring trench pattern of the mask layer such that a bottom of the wiring trench is comprised of the second low dielectric constant film;
   charging a copper metal into the wiring trench and a via hole formed to expose a part of the copper wiring in a position where the copper metal is superimposed over the wiring trench as viewed in a planar manner; and
   removing at least a layer from a top surface of the copper metal to the third low dielectric constant film by a CMP method,
   wherein each of the first, second, and third low dielectric constant films is an insulating film having a dielectric constant lower than that of a FSG, and
   wherein the second low dielectric constant film is a film having the dielectric constant lower than that of the third low dielectric constant film.

2. The manufacturing method of a semiconductor device according to claim 1, wherein the first resist mask is a multi-layered resist including a lower layer resist, an intermediate layer resist, and an upper layer resist which are laminated in that order,
   wherein the step of forming the mask layer comprises the steps of:

forming the multi-layered resist over the film for serving as the mask layer, the multi-layered resist including the lower layer resist, the intermediate layer resist, and the upper layer resist which are laminated in that order;

patterning the upper layer resist in a shape of the wiring trench pattern as viewed in a planar manner;

patterning the intermediate layer resist using the upper layer resist patterned in the shape of the wiring trench pattern as a mask;

patterning the lower layer resist using the intermediate layer resist patterned in the shape of the wiring trench pattern as a mask, while removing the upper layer resist to expose the intermediate layer resist at an uppermost surface; and patterning the film for serving as the mask layer using the lower layer resist patterned in the shape of the wiring trench pattern as a mask, while removing the intermediate layer resist to expose the third low dielectric constant film, wherein the step of exposing the third low dielectric constant film comprises a first step of removing the intermediate layer resist using a first gas to expose the lower layer resist at an uppermost surface, and a second step of removing a part of the film for serving as the mask layer using a second gas different from the first gas to expose the third low dielectric constant film.

3. A manufacturing method of a semiconductor device, comprising the steps of:

forming a diffusion preventing film over a semiconductor substrate so as to cover a first low dielectric constant film with a copper wiring formed therein;

laminating a second low dielectric constant film, a third low dielectric constant film, and a film for serving as a mask layer over the diffusion preventing film in that order;

forming the mask layer by etching the film for serving as the mask layer using a first resist mask formed over the film for serving as the mask layer so as to expose the third low dielectric constant film, and by forming a wiring trench pattern whose bottom is comprised of a surface of the third low dielectric constant film in the film for serving as the mask layer;

removing the first resist mask by asking;

forming a wiring trench in the second low dielectric constant film and the third low dielectric constant film using the wiring trench pattern of the mask layer such that a bottom of the wiring trench is comprised of the second low dielectric constant film; and charging a copper metal into the wiring trench and a via hole formed to expose a part of the copper wiring in a position where the copper metal is superimposed over the wiring trench as viewed in a planar manner, wherein the first resist mask is a multi-layered resist including a lower layer resist, an intermediate layer resist, and an upper layer resist which are laminated in that order, wherein the step of forming the mask layer comprises the steps of:

forming the multi-layered resist over the film for serving as the mask layer, the multi-layered resist including the lower layer resist, the intermediate layer resist, and the upper layer resist which are laminated in that order;

patterning the upper layer resist in a shape of the wiring trench pattern as viewed in a planar manner;

patterning the intermediate layer resist using the upper layer resist patterned in the shape of the wiring trench pattern as a mask;

patterning the lower layer resist using the intermediate layer resist patterned in the shape of the wiring trench pattern as a mask, while removing the upper layer resist to expose the intermediate layer resist at an uppermost surface; and patterning the film for serving as the mask layer using the lower layer resist patterned in the shape of the wiring trench pattern as a mask, while removing the intermediate layer resist to expose the third low dielectric constant film, wherein the step of exposing the third low dielectric constant film comprises a first step of removing the intermediate layer resist using a first gas to expose the lower layer resist at an uppermost surface, and a second step of removing a part of the film for serving as the mask layer using a second gas different from the first gas to expose the third low dielectric constant film, wherein each of the first, second, and third low dielectric constant films is an insulating film having a dielectric constant lower than that of a FSG, and wherein the second low dielectric constant film is a film having the dielectric constant lower than that of the third low dielectric constant film.

4. The manufacturing method of a semiconductor device according to claim 2, wherein the mask layer is comprised of an insulating layer, wherein the upper layer resist is a first organic film having photosensitivity, wherein the lower layer resist is a second organic film having lower photosensitivity than that of the first organic film, wherein the intermediate layer resist contains one kind selected from the group consisting of polysiloxane and polysilazane, wherein the first gas and the second gas include phlorocarbon gas, and wherein the phlorocarbon gas included in the second gas has a carbon ratio higher than that of the phlorocarbon gas included in the first gas.

5. The manufacturing method of a semiconductor device according to claim 4, wherein the insulating layer is a silicon oxide film, wherein an etching selectivity of the mask layer with respect to the third low dielectric constant film in use of the second gas in the second step is higher than that of the mask layer with respect to the third low dielectric constant film in use of the first gas in the first step.

6. The manufacturing method of a semiconductor device according to claim 2, wherein the mask layer is comprised of a metal film, wherein the upper layer resist is a first organic film having photosensitivity, wherein the lower layer resist is a second organic film having lower photosensitivity than that of the first organic film, wherein the intermediate layer resist contains one kind selected from the group consisting of polysiloxane and polysilazane, wherein the first gas includes phlorocarbon gas, and wherein the second gas includes a halogen-based gas containing chlorine or bromine.

7. The manufacturing method of a semiconductor device according to claim 1, further comprising the steps of:

after the laminating step and before the forming step of the mask layer, forming a via hole pattern in a position where the via hole pattern is superimposed over the copper wiring as viewed in a planar manner, the via hole pattern penetrating to reach the diffusion preventing film from the film for serving as the mask layer;

removing a second resist mask used for forming the via hole pattern by ashing; and charging an organic material into the via hole pattern, wherein in the removing step of the first resist mask, the organic material is removed, and wherein in the forming step of the wiring trench, a part of the copper wiring is exposed at a bottom of the via hole pattern by removing parts of the first low dielectric constant film and the diffusion preventing film positioned at the bottom of the via hole pattern in forming the wiring trench having a bottom comprised of the second low dielectric constant film.

8. The manufacturing method of a semiconductor device according to claim 1, further comprising the steps of after the removing step of the first resist mask, and before the forming step of the wiring trench, forming a via hole pattern in a position where the via hole pattern is superimposed over the copper wiring as viewed in a planar manner, the via hole pattern penetrating to reach the diffusion preventing film from the third low dielectric constant film and;

removing a second resist mask used for forming the via hole pattern by ashing, wherein in the removing step of the second resist mask, the second resist mask is removed such that the third low dielectric constant film is exposed in a region other than the via hole pattern of the wiring trench pattern as viewed in a planar manner, and wherein in the forming step of the wiring trench, a part of the copper wiring is exposed at a bottom of the via hole pattern by removing parts of the first low dielectric constant film and the diffusion preventing film positioned at the bottom of the via hole pattern in forming the wiring trench having a bottom comprised of the second low dielectric constant film.

9. A manufacturing method of a semiconductor device, comprising the steps of:

forming a diffusion preventing film over a semiconductor substrate so as to cover a first low dielectric constant film with a copper wiring formed therein;

laminating a second low dielectric constant film, a third low dielectric constant film, and a metal film for serving as a mask layer over the diffusion preventing film in that order;

forming the mask layer by etching the metal film for serving as the mask layer using a first resist mask formed over the metal film for serving as the mask layer so as to expose the third low dielectric constant film, and by forming a wiring trench pattern whose bottom is comprised of a surface of the third low dielectric constant film in the metal film for serving as the mask layer;

removing the first resist mask by the asking;

forming a wiring trench in the second low dielectric constant film and the third low dielectric constant film using the wiring trench pattern of the mask layer such that a bottom of the trench is comprised of the second low dielectric constant film; and charging a copper metal into the wiring trench and a via hole formed to expose a part of the copper wiring in a position where the copper metal is superimposed over the wiring trench as viewed in a planar manner, wherein the first resist mask includes a resist layer comprised of resist material which has photosensitivity and is subjected to exposure and development processes, wherein each of the first, second, and third low dielectric constant films is an insulating film having a dielectric constant lower than that of FSG, and wherein the second low dielectric constant film is a film having the dielectric constant lower than that of the third low dielectric constant film.

10. The manufacturing method of a semiconductor device according to claim 9, further comprising the step of forming a via hole pattern in a position where the via hole pattern is superimposed over the copper wiring as viewed in a planar manner, wherein a second resist mask used in the step of forming the via hole pattern is a multi-layered resist including a lower layer resist, an intermediate layer resist, and an upper layer resist which are laminated in that order, wherein the step of forming the via hole pattern comprises the steps of:

forming the multi-layered resist over a metal film for serving as the mask layer, the multi-layered resist including the lower layer resist, the intermediate layer resist, and the upper layer resist which are laminated in that order;

patterning the upper layer resist in a shape of the via hole as viewed in a planar manner;

patterning the intermediate layer resist using the upper layer resist patterned in the shape of the wiring trench pattern as a mask;

patterning the lower layer resist using the intermediate layer resist patterned in the shape of the wiring trench pattern as a mask, while removing the upper layer resist to expose the intermediate layer resist at an uppermost surface; and forming the via hole pattern through the second and third low dielectric constant films using the lower layer resist patterned in the shape of the via hole as a mask so as to cause the via hole pattern to reach the diffusion preventing film.

11. The manufacturing method of a semiconductor device according to claim 10, wherein the step of forming the via hole pattern is performed after the laminating step and before the forming step of the mask layer, wherein the step of forming the via hole pattern through the second and third low dielectric constant films comprises the steps of:

removing the second resist mask by asking after the step of causing the via hole pattern to penetrate the low dielectric constant films so as to reach the diffusion preventing film from the metal film for serving as the mask layer; and charging an organic material into the via hole pattern, wherein in the step of removing the first resist mask, the organic material is removed, and wherein in the step of forming the wiring trench, a part of the copper wiring is exposed at a bottom of the via hole pattern by removing parts of the first low dielectric constant film and the diffusion preventing film positioned at the bottom of the via hole pattern in forming the wiring trench having a bottom comprised of the second low dielectric constant film.

12. The manufacturing method of a semiconductor device according to claim 10, wherein the step of forming the via hole pattern is performed after the removing step of the first resist mask and before the forming step of the wiring trench, wherein the step of forming the via hole pattern through the second and third low dielectric constant film comprises the steps of:

causing the via hole pattern to penetrate the second and third dielectric constant films so as to reach the diffusion preventing film from the third low dielectric constant film; and removing the second resist mask by asking, wherein in the step of removing the second resist mask, the second resist mask is removed such that the third low dielectric constant film is exposed in a region other than the via hole pattern of the wiring trench pattern as viewed in a planar manner, and wherein in the step of forming the wiring trench, a part of the copper wiring is exposed at a bottom of the via hole pattern by removing parts of the first low dielectric constant film and the diffusion preventing film positioned at the bottom of the via hole pattern in forming the wiring trench having a bottom comprised of the second low dielectric constant film.

13. A manufacturing method of a semiconductor device, comprising the steps of:

forming a diffusion preventing film over a semiconductor substrate so as to cover a first low dielectric constant film with a copper wiring formed therein;

laminating a second low dielectric constant film, a third low dielectric constant film, and a metal film for serving as a mask layer over the diffusion preventing film in that order;

forming the mask layer by etching the metal film for serving as the mask layer using a first resist mask formed over the metal film for serving as the mask layer so as to expose the third low dielectric constant film, and by forming a wiring trench pattern whose bottom is comprised of a surface of the third low dielectric constant film, in the metal film for serving as the mask layer;

forming a wiring trench in the second low dielectric constant film and the third low dielectric constant film using the wiring trench pattern of the mask layer such that a bottom of the wiring trench is comprised of the second low dielectric constant film; and charging a copper metal into the wiring trench and a via hole formed to expose a part of the copper wiring in a position where the copper metal is superimposed over the wiring trench as viewed in a planar manner, wherein the first resist mask includes a resist layer comprised of resist material which has photosensitivity and is subjected to exposure and development processes, the manufacturing method further comprising the step of forming a via hole pattern in a position where the via hole pattern is superimposed over the copper wiring as viewed in a planar manner, wherein a second resist mask used in the step of forming the via hole pattern is a multi-layered resist including a lower layer resist, an intermediate layer resist, and an upper layer resist which are laminated in that order, wherein the step of forming the via hole pattern comprises the steps of:

forming the multi-layered resist over the metal film for serving as the mask layer, the multi-layered resist including the lower layer resist, the intermediate layer resist, and the upper layer resist which are laminated in that order;

patterning the upper layer resist in the shape of the via hole as viewed in a planar manner;

patterning the intermediate layer resist using the upper layer resist patterned in the shape of the via hole as a mask;

patterning the lower layer resist using the intermediate layer resist patterned in the shape of the via hole as a mask, while removing the upper layer resist to expose the intermediate layer resist at an uppermost surface;

forming the via hole pattern through the second and third low dielectric constant films using the lower layer resist patterned in the shape of the via hole as a mask so as to cause the via hole pattern to reach the diffusion preventing film, wherein each of the first, second, and third low dielectric constant films is an insulating film having a dielectric constant lower than that of FSG, and wherein the second low dielectric constant film is a film having the dielectric constant lower than that of the third low dielectric constant film.

14. The manufacturing method of a semiconductor device according to claim 13, wherein the forming step of the via hole pattern is performed after the laminating step and before the forming step of the mask layer, wherein the forming step of the via hole pattern through the second and third low dielectric constant films comprises the steps of:

causing the via hole pattern to penetrate the second and third low dielectric constant films so as to reach the diffusion preventing film from the metal film for serving as the mask layer, and charging an organic material into the via hole pattern, wherein in the step of forming the wiring trench, a part of the copper wiring is exposed at the bottom of the via hole pattern by removing parts of the first low dielectric constant film and the diffusion preventing film positioned at a bottom of the via hole pattern in forming the wiring trench having a bottom comprised of the second low dielectric constant film.

15. The manufacturing method of a semiconductor device according to claim 13, wherein the forming step of the via hole pattern is performed after the forming step of the mask layer and before the forming step of the wiring trench, wherein the forming step of the via hole pattern through the second and third low dielectric constant films comprises the step of forming the via hole which penetrates the low dielectric constant films so as to reach the diffusion preventing film from the third low dielectric constant film, and wherein in the step of forming the wiring trench, a part of the copper wiring is exposed at a bottom of the via hole pattern by removing parts of the first low dielectric constant film and the diffusion preventing film positioned at the bottom of the via hole pattern in forming the wiring trench having a bottom comprised of the second low dielectric constant film.

16. The manufacturing method of a semiconductor device according to claim 9, wherein the first resist mask has a laminated structure of the resist layer and a reflection preventing film.

17. The manufacturing method of a semiconductor device according to claim 1, wherein the diffusion preventing film contains at least one kind of element selected from the group consisting of SiN, SiCN, SiC, and SiCO, and wherein a barrier layer is formed over an inner surface of the wiring trench and an inner surface of the via hole.

18. The manufacturing method of a semiconductor device according to claim 1, wherein each of the first, second, and third low dielectric constant films is comprised of SiOC.

* * * * *